US010305490B2

(12) United States Patent
Fukuzawa et al.

(10) Patent No.: US 10,305,490 B2
(45) Date of Patent: *May 28, 2019

(54) CIRCUIT DEVICE, OSCILLATOR, ELECTRONIC APPARATUS, AND MOVING OBJECT

(71) Applicant: Seiko Epson Corporation, Tokyo (JP)

(72) Inventors: Akihiro Fukuzawa, Hino (JP); Masayuki Kamiyama, Chino (JP)

(73) Assignee: Seiko Epson Corporation (JP)

( * ) Notice: Subject to any disclaimer, the term of this patent is extended or adjusted under 35 U.S.C. 154(b) by 278 days.

This patent is subject to a terminal disclaimer.

(21) Appl. No.: 15/334,712

(22) Filed: Oct. 26, 2016

(65) Prior Publication Data

US 2017/0117903 A1   Apr. 27, 2017

(30) Foreign Application Priority Data

Oct. 27, 2015 (JP) ................... 2015-211250
Oct. 27, 2015 (JP) ................... 2015-211251
May 18, 2016 (JP) ................... 2016-099722
May 18, 2016 (JP) ................... 2016-099723

(51) Int. Cl.

| G01N 27/00 | (2006.01) |
|---|---|
| G08B 19/00 | (2006.01) |
| G08B 21/00 | (2006.01) |
| G01J 5/00 | (2006.01) |
| G01K 7/00 | (2006.01) |
| G05D 23/20 | (2006.01) |
| G08B 13/18 | (2006.01) |
| G08B 27/00 | (2006.01) |

(Continued)

(52) U.S. Cl.
CPC ................ H03L 1/04 (2013.01); H03B 5/32 (2013.01); H03L 7/00 (2013.01); *H03B 2200/0018* (2013.01)

(58) Field of Classification Search
CPC .... H03L 1/04; H03L 7/00; H03B 5/32; H03B 2200/0018
USPC ....................................... 331/66, 69, 70, 176
See application file for complete search history.

(56) References Cited

U.S. PATENT DOCUMENTS

| 2002/0149503 A1 | 10/2002 | Lautzenhiser |
| 2007/0268167 A1 | 11/2007 | Ide |

(Continued)

FOREIGN PATENT DOCUMENTS

| JP | 64-082809 A | 3/1989 |
| JP | 06-326598 A | 11/1994 |

(Continued)

*Primary Examiner* — Richard Tan
(74) *Attorney, Agent, or Firm* — Harness, Dickey & Pierce, P.L.C.

(57) ABSTRACT

A circuit device includes an A/D conversion section adapted to perform an A/D conversion of a temperature detection voltage from a temperature sensor to output temperature detection data, a processing section adapted to perform a temperature compensation process of an oscillation frequency based on the temperature detection data to output frequency control data of the oscillation frequency, and an oscillation signal generation circuit adapted to generate an oscillation signal using the frequency control data and a resonator. The processing section may change the frequency control data in increments of k×LSB (k≥1) based on a change in temperature.

20 Claims, 27 Drawing Sheets

(51) Int. Cl.
  *H03L 1/04* (2006.01)
  *H03L 7/00* (2006.01)
  *H03B 5/32* (2006.01)

(56) References Cited

U.S. PATENT DOCUMENTS

2014/0292423 A1* 10/2014 Isohata .................. H03L 1/025
                                                        331/70
2017/0115709 A1*  4/2017 Fukuzawa ............... H03M 1/06

FOREIGN PATENT DOCUMENTS

| JP | 2003-152449 A | 5/2003 |
| JP | 2012-199631 A | 10/2012 |

* cited by examiner

CIRCUIT DEVICE, OSCILLATOR, ELECTRONIC APPARATUS, AND MOVING OBJECT

BACKGROUND

1. Technical Field

The present disclosure relates to a circuit device, an oscillator, an electronic apparatus, a moving object, and so on.

2. Related Art

In the past, there has been known a temperature compensated oscillator called a temperature compensated crystal oscillator (TCXO). The TCXO can be used as a reference signal source or the like in, for example, a portable communication terminal, GPS-related equipment, wearable equipment, or in-car equipment.

The TCXO can include an ATCXO standing for an analog-type temperature compensated oscillator, and a DTCXO standing for a digital-type temperature compensated oscillator. As the related art of the ATCXO, there is known a technology disclosed in JP-A-2012-199631. As the related art of the DTCXO, there is known a technology disclosed in JP-A-64-82809.

The digital-type oscillator such as a DTCXO has an advantageous aspect in the reduction of power consumption compared to the analog-type oscillator such as an ATCXO. For example, in the ATCXO, a lot of consumption current flows in an analog current of the circuit device. In particular in the ATCXO, the power consumption dramatically increases if it is attempted to increase the order of the approximation function in the temperature compensation circuit (an approximation function generation circuit) as an analog circuit in order to improve the frequency accuracy, or to decrease the noise by increasing the current flowing through the transistors of the analog circuit. Therefore, there is a problem that it is difficult to realize both the improvement in frequency accuracy and the reduction of power consumption at the same time.

On the other hand, in the digital-type oscillator such as a DTCXO, it has been revealed that if a frequency drift of an oscillation frequency due to a temperature change exceeds, for example, an allowable frequency drift range, a variety of failures occur in a device using the oscillation signal of the oscillator.

Further, it has also been revealed that due to the variation of the oscillation frequency, there occurs a noise (spurious) with an intention corresponding to the variation to degrade the C/N characteristic (a carrier-to-noise ratio, a CN ratio) of the circuit device. Due to the degradation of the C/N characteristic, the accuracy of the data obtained based on the signal from the oscillator such as a DTCXO degrades.

SUMMARY

An advantage of some aspects of the present disclosure is to provide a circuit device, an oscillator, an electronic apparatus, a moving object, and so on capable of preventing the failures due to the frequency drift and so on of the oscillation frequency from occurring.

An aspect of the present disclosure relates to a circuit device including an A/D conversion section (i.e., A/D converter) adapted to perform an A/D (i.e., analog-to-digital) conversion of a temperature detection voltage from a temperature sensor to output temperature detection data, a processing section (i.e., processing circuit) adapted to perform a temperature compensation process of an oscillation frequency based on the temperature detection data to output frequency control data of the oscillation frequency, and an oscillation signal generation circuit adapted to generate an oscillation signal with the oscillation frequency set by the frequency control data using the frequency control data from the processing section and a resonator. The processing section outputs the frequency control data, which changes from first data corresponding to a first temperature to second data corresponding to a second temperature in increments of k×LSB (k≥1), in a case in which temperature has changed from the first temperature to the second temperature. In a case in which an output frequency of the frequency control data changing by k×LSB of the processing section is denoted by fs, and a variation of the oscillation frequency due to the change by k×LSB of the frequency control data is denoted by $\Delta f$, $\Delta f/fs<1/10^6$ is true.

In the aspect of the present disclosure, the temperature compensation process of the oscillation frequency is performed based on the temperature detection data, and the oscillation signal is generated using the frequency control data obtained and the resonator. Further, in the aspect of the present disclosure, in the case in which the temperature has changed from the first temperature to the second temperature, the frequency control data is changed from the first data to the second data in increments of k×LSB (i.e., increases or decreases in increments of k×LSB). According to this configuration, it is possible to prevent a situation in which the frequency control data changes significantly to cause the significant frequency drift in the oscillation frequency in the case in which the temperature has changed from the first temperature to the second temperature. Therefore, it becomes possible to provide the circuit device capable of suppressing occurrence of a failure caused by the frequency drift of the oscillation frequency. Further, in this aspect, the output frequency fs of the frequency control data and the variation $\Delta f$ of the oscillation frequency due to the change by k×LSB of the frequency control data satisfy $\Delta f/fs<1/10^6$. Thus, it also becomes possible to suppress the deterioration of the C/N characteristic due to the spurious caused by the variation of the frequency control data.

In the aspect of the present disclosure, in a case of fs≥1 kHz, $\Delta f/fs<1/10^6$ may be true, and in a case of fs<1 kHz, $\Delta f<1$ mHz may be true.

With this configuration, it becomes possible to use an appropriate condition corresponding to fs for suppressing the deterioration of the C/N characteristic.

Another aspect of the present disclosure relates to a circuit device including an A/D conversion section adapted to perform an A/D conversion of a temperature detection voltage from a temperature sensor to output temperature detection data, a processing section adapted to perform a temperature compensation process of an oscillation frequency based on the temperature detection data to output frequency control data of the oscillation frequency, and an oscillation signal generation circuit adapted to generate an oscillation signal with the oscillation frequency set by the frequency control data using the frequency control data from the processing section and a resonator. The processing section outputs the frequency control data, which changes from first data corresponding to a first temperature to second data corresponding to a second temperature in increments of k×LSB (k≥1), in a case in which temperature has changed from the first temperature to the second temperature. In a case in which an output frequency of the frequency control data changing by k×LSB of the processing section is denoted by fs, and a variation of the oscillation frequency due to the change by k×LSB of the frequency control data is denoted by Δf, Δf<1 mHz is true in a case of fs<1 kHz.

According to the aspect of the present disclosure, occurrence of the failure caused by the frequency drift of the oscillation frequency can be suppressed. Further, by fulfilling the requirement of Δf<1 mHz in a case of fs<1 kHz, it also becomes possible to suppress the deterioration of the C/N characteristic due to the spurious caused by the variation of the frequency control data.

Another aspect of the present disclosure relates to a circuit device including an A/D conversion section adapted to perform an A/D conversion of a temperature detection voltage from a temperature sensor to output temperature detection data, a processing section adapted to perform a temperature compensation process of an oscillation frequency based on the temperature detection data to output frequency control data of the oscillation frequency, and an oscillation signal generation circuit adapted to generate an oscillation signal with the oscillation frequency set by the frequency control data using the frequency control data from the processing section and a resonator. In a case in which a frequency variable range of the oscillation frequency by the oscillation signal generation circuit is denoted by FR, an allowable frequency drift of the oscillation frequency in a predetermined period is denoted by FD, a full-scale value of the frequency control data is denoted by DFS, and a variation of the frequency control data in the frequency control data of the processing section is denoted by DV, DV<(FD/FR)×DFS is true.

According to the aspect of the present disclosure, the temperature compensation process of the oscillation frequency is performed based on the temperature detection data, and the oscillation signal is generated using the frequency control data obtained and the resonator. Here, it is assumed that the frequency variable range of the oscillation frequency is denoted by FR, the allowable frequency drift of the oscillation frequency is denoted by FD, and the full-scale value of the frequency control data is denoted by DFS, and the variation in the output interval of the frequency control data is denoted by DV. Then, according to the aspect of the present disclosure, the frequency control data changes with the variation DV satisfying DV<(FD/FR)×DFS. By the frequency control data changing with such a variation DV described above, it becomes possible to make the frequency drift of the oscillation frequency in the predetermined period fall within, for example, the allowable frequency drift. Therefore, it becomes possible to provide the circuit device capable of suppressing occurrence of a failure caused by the frequency drift of the oscillation frequency.

In the aspect of the present disclosure, in a case in which an output frequency of the frequency control data of the processing section is denoted by fs, and a variation of the oscillation frequency due to the change with a variation DV of the frequency control data is denoted by Δf, Δf/fs<1/10$^6$ may be true.

In the aspect of the present disclosure with this configuration, the output frequency fs of the frequency control data and the variation Δf of the oscillation frequency due to the change of the frequency control data with the variation DV satisfy Δf/fs<1/10$^6$. Thus, it becomes possible to suppress the deterioration of the C/N characteristic due to the spurious caused by the variation of the frequency control data.

In the aspect of the present disclosure, in a case of fs≥1 kHz, Δf/fs<1/10$^6$ is true, and in a case of fs<1 kHz, Δf<1 mHz may be true.

Thus, it becomes possible to use an appropriate condition corresponding to fs for suppressing the deterioration of the C/N characteristic.

In the aspect of the present disclosure, in a case in which an output frequency of the frequency control data of the processing section is denoted by fs, and a variation of the oscillation frequency due to the change with a variation DV of the frequency control data is denoted by Δf, Δf<1 mHz may be true in a case of fs<1 kHz.

In the aspect of the present disclosure with this configuration, the output frequency fs of the frequency control data and the variation Δf of the oscillation frequency due to the change of the frequency control data with the variation DV satisfy Δf<1 mHz. Thus, it becomes also possible to suppress the deterioration of the C/N characteristic due to the spurious caused by the variation of the frequency control data.

In the aspect of the present disclosure, the resonator may be a quartz crystal resonator.

Thus, it becomes possible to use a quartz crystal resonator as the resonator.

In the aspect of the present disclosure, the quartz crystal resonator may be one of an AT-cut resonator, an SC-cut resonator, and a surface acoustic wave (SAW) resonator.

Thus, it becomes possible to use at least one of the plurality of resonators different in characteristic from each other as the quartz crystal resonator.

In the aspect of the present disclosure, the oscillation signal generation circuit may include a D/A conversion section (i.e., a D/A converter unit) adapted to perform a D/A (digital-to-analog) conversion of the frequency control data from the processing section, and an oscillation circuit adapted to generate the oscillation signal using an output voltage of the D/A conversion section and the resonator. The output frequency fs of the frequency control data may be a sampling frequency of the D/A conversion section, and the variation Δf of the oscillation frequency may be a variation of the oscillation frequency in the single D/A conversion.

Thus, in the case in which the oscillation signal generation circuit includes the D/A conversion section and the oscillation circuit, it becomes possible to set the sampling frequency of the D/A conversion section to fs, and the variation of the oscillation frequency in the single D/A conversion to Δf.

In the aspect of the present disclosure, the D/A conversion section may include a D/A converter adapted to perform the D/A conversion of the frequency control data, and a filter circuit adapted to smooth the output voltage of the D/A converter.

Thus, by smoothing the output of the D/A converter with the filter circuit, it becomes possible to suppress the practical variation of the oscillation frequency.

In the aspect of the present disclosure, in a case in which a frequency control voltage as an output voltage of the D/A conversion section corresponding to the first temperature is defined as a first control voltage, and the frequency control voltage corresponding to the second temperature is defined as a second control voltage, the output voltage changing with a voltage width smaller than an absolute value of a difference voltage between the first control voltage and the second control voltage may be output from the D/A conversion section to the oscillation circuit in a case in which the temperature has changed from the first temperature to the second temperature.

Thus, it is possible to prevent the situation in which the frequency control voltage as the output voltage of the D/A conversion section changes significantly to cause the significant frequency drift and so on in the oscillation frequency in the case in which the temperature has changed from the first temperature to the second temperature.

In the aspect of the present disclosure, in a case of defining a minimum resolution value in the D/A conversion as LSB, the D/A conversion section may output the output voltage changing with a step width of a voltage corresponding to k×LSB (k≥1).

Thus, since the variation of the output voltage of the D/A conversion section is limited to the step width of the voltage corresponding to k×LSB, it becomes possible to suppress the occurrence of the failure caused by the occurrence of a significant voltage change in the output voltage.

In the aspect of the present disclosure, k=1 may be set.

Thus, it becomes possible to change the output voltage of the DA conversion section with the step width of the voltage corresponding to 1 LSB.

In the aspect of the present disclosure, in a case in which the temperature detection data of the A/D conversion section in a case in which the temperature is the first temperature is defined as first temperature detection data, and the temperature detection data of the A/D conversion section in a case in which the temperature is the second temperature is defined as second temperature detection data, the first control voltage may be the frequency control voltage corresponding to the first temperature detection data in a temperature compensation characteristic of the temperature compensation process, and the second control voltage may be the frequency control voltage corresponding to the second temperature detection data in a temperature compensation characteristic of the temperature compensation process.

Thus, it results that the A/D conversion section outputs the first temperature detection data in the case in which the temperature is the first temperature, and outputs the second temperature detection data in the case in which the temperature is the second temperature. In this case, in the normal situation, the D/A conversion section outputs the first control voltage as the frequency control voltage corresponding to the first temperature detection data at the first temperature, and outputs the second control voltage as the frequency control voltage corresponding to the second temperature detection data at the second temperature. Therefore, the output voltage of the D/A conversion section significantly changes from the first control voltage to the second control voltage. In this regard, according to the aspect of the present disclosure, the output voltage of the D/A conversion section changed with the voltage width smaller than the absolute value of the different voltage between the first control voltage and the second control voltage. Therefore, it becomes possible to effectively suppress occurrence of a failure caused by the frequency drift and so on of the oscillation frequency.

In the aspect of the present disclosure, the processing section may compare the first data as operation result data of the temperature compensation process performed previous time and the second data as the operation result data of the temperature compensation process performed this time with each other, output addition result data obtained by a process of adding a predetermined value to the first data as the frequency control data while performing the process of adding until the addition result data reaches the second data in a case in which the second data is higher than the first data, and output subtraction result data obtained by a process of subtracting a predetermined value from the first data as the frequency control data while performing the process of subtracting until the subtraction result data reaches the second data in a case in which the second data is lower than the first data.

Thus, it becomes possible to change the frequency control data by k×LSB by performing the process of adding the predetermined value to the first data or performing the process of subtracting the predetermined value from the first data.

In the aspect of the present disclosure, the processing section may include an arithmetic section adapted to perform an arithmetic operation of the temperature compensation process of the oscillation frequency based on the temperature detection data to output the operation result data of the temperature compensation process, and an output section adapted to receive the operation result data from the arithmetic section to output the frequency control data. The output section may output the frequency control data, which changes from the first data to the second data in increments of k×LSB in a case in which the operation result data has changed from the first data corresponding the first temperature to the second data corresponding to the second temperature.

Thus, the temperature compensation process of the oscillation frequency can be realized with the arithmetic processing in the arithmetic section. Further, in the case in which the operation result data from the arithmetic section has changed from the first data to the second data, the output section outputs the frequency control data changing from the first data to the second data in increments of k×LSB (i.e., increase or decrease in increments of k×LSB). By adopting such a configuration as described above, it becomes possible to output the frequency control data, which changes from the first data corresponding to the first temperature to the second data corresponding to the second temperature by k×LSB, from the processing section in the case in which the temperature has changed from the first temperature to the second temperature.

Another aspect of the present disclosure relates to an oscillator including any of the circuit devices described above, and the resonator.

Another aspect of the present disclosure relates to an electronic apparatus including any of the circuit devices described above.

Another aspect of the present disclosure relates to a moving object including any of the circuit devices described above.

BRIEF DESCRIPTION OF THE DRAWINGS

The present disclosure will be described with reference to the accompanying drawings, wherein like numbers reference like elements.

DESCRIPTION OF AN EXEMPLARY EMBODIMENT

Hereinafter, a preferred embodiment of the present disclosure will be described in detail. It should be noted that the present embodiment described hereinafter does not unreasonably limit the content of the present disclosure as set forth in the appended claims, and all of the constituents explained in the present embodiment are not necessarily essential as means of the present disclosure for solving the problems.

1. FREQUENCY DRIFT

In a TCXO, as a temperature compensation oscillator, there is a demand for an improvement in frequency accuracy and reduction of power consumption. In wearable equipment such as a watch incorporating a GPS or a measurement instrument of biological information such as a pulse wave, it is required to elongate continuous operating time with a battery. Therefore, it is required for the TCXO acting as a reference signal source to be lower in power consumption while keeping the frequency accuracy.

Further, there have been proposed a variety of communication methods for communicating between a communication terminal and a base station. For example, in the TDD (time division duplex) system, each device transmits data in a time slot assigned to the device. Further, by setting guard time between the time slots (e.g., an uplink slot and a downlink slot), the time slots are prevented from overlapping each other. In the next-generation communication system, it has been proposed to perform the data communication with the TDD system using, for example, a single frequency band (e.g., 50 GHz).

However, in the case of adopting such a TDD system as described above, it is necessary to perform time synchronization in each device, and timing of accurate absolute time is required. Although it is also possible to adopt a method of, for example, providing each device with an atomic clock (an atomic oscillator) as a reference signal source in order to realize such a demand, there arises a problem that an increase in cost of the device is incurred or the device grows in size.

Further, as the TCXO, there can be cited an ATCXO standing for an analog-type temperature compensated oscillator, and a DTCXO standing for a digital-type temperature compensated oscillator.

Figure 1:
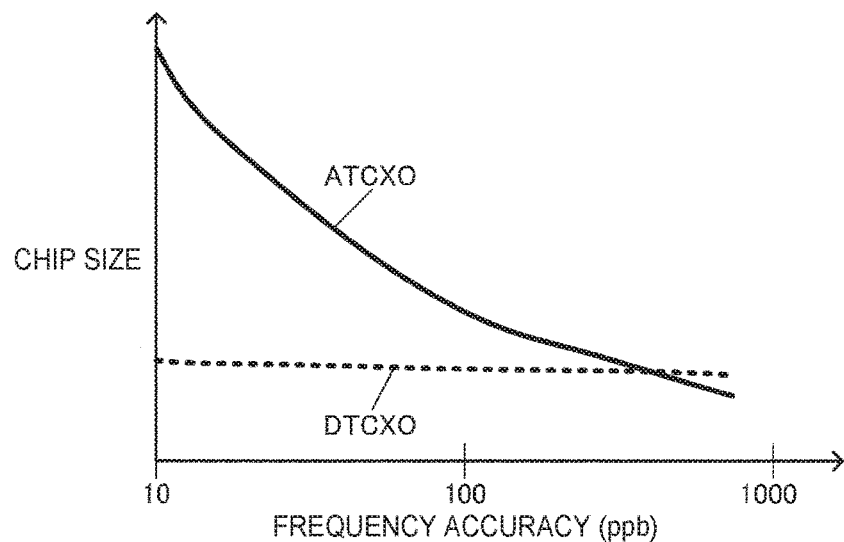
FIG. 1 is a diagram showing a relationship between frequency accuracy and a chip size.

Further, in the case of using the ATCXO as the reference source, if it is attempted to increase the frequency accuracy, the chip size of the circuit device grows as shown in FIG. 1, and it becomes difficult to realize the reduction of cost and reduction of power consumption.

On the other hand, in the DTCXO, there is an advantage that the increase in frequency accuracy can be realized without significantly increasing the chip size of the circuit device as shown in FIG. 1.

However, in the digital-type oscillator such as a DTCXO, there is a problem that a communication error can occur in the communication device incorporating the oscillator due to the frequency drift of the oscillation frequency. For example, in the digital-type oscillator, an A/D conversion is performed on a temperature detection voltage from a temperature sensor section to generate temperature detection data, then a temperature compensation process of frequency control data is performed based on the temperature detection data, and then the oscillation signal is generated based on the frequency control data. In this case, it has been revealed that if the value of the frequency control data changes significantly due to a change in temperature, there arises a problem of frequency hopping due to the change in the value of the frequency control data. If such frequency hopping occurs, there arises such a problem that the GPS is unlocked if taking a GPS-related communication device as an example.

Therefore, in the digital-type oscillator such as a DTCXO, although a variety of circuit systems have been proposed, the digital-type oscillator is hardly adopted as the reference signal source for an actual product in which such a communication error causes a problem, but the analog-type oscillator such as an ATCXO is adopted in the present circumstances.

Figure 2:
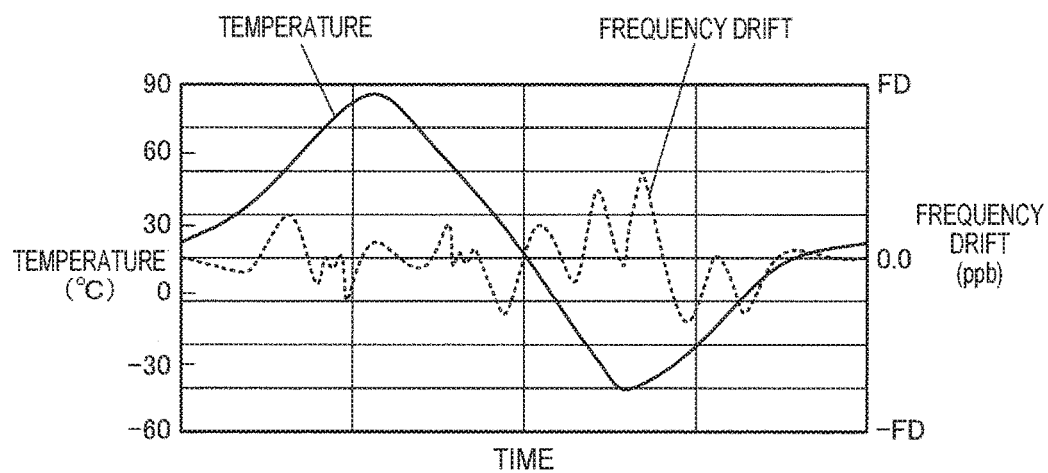
FIG. 2 is a diagram showing the frequency drift of an ATCXO.

For example, FIG. 2 is a diagram showing the frequency drift of the ATCXO. In the ATCXO, also in the case in which the temperature has changed due to elapse of time, the frequency drift falls within a range (±FD) of allowable frequency drift (an allowable frequency error) as shown in FIG. 2. In FIG. 2, the frequency drift (the frequency error) is expressed as a proportion (frequency accuracy; ppb) to a nominal oscillation frequency (e.g., around 16 MHz). In order to, for example, prevent a communication error from occurring, it is necessary to make the frequency drift fall within the range (±FD) of the allowable frequency drift in a predetermined period TP (e.g., 20 msec). Here, FD is in the range of, for example, several ppb.

Figure 3:
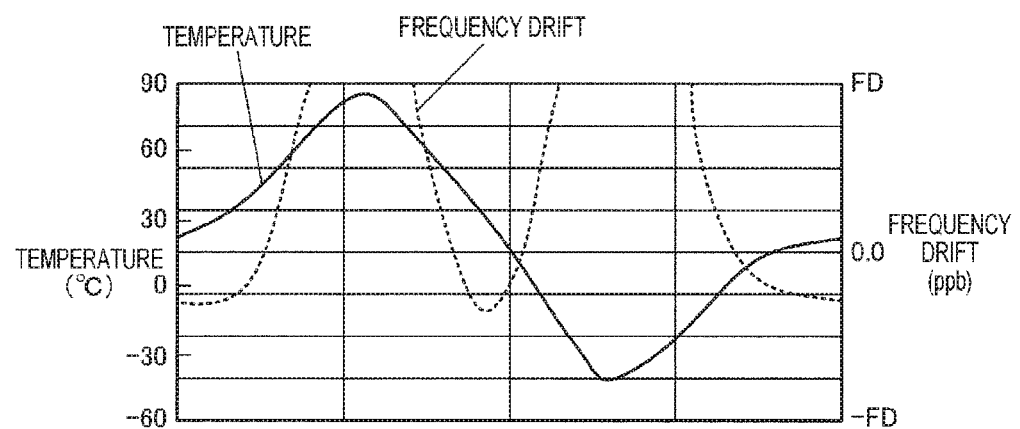
FIG. 3 is a diagram showing the frequency drift of a DTCXO of related art.

In contrast, FIG. 3 is a diagram showing the frequency drift in the case of using a related-art DTCXO. As shown in FIG. 3, in the related-art DTCXO, the frequency drift fails to fall within the range of the allowable frequency drift, and there occurs the frequency hopping in which the frequency drift exceeds the range. Therefore, the communication error (e.g., unlocking of the GPS) due to the frequency hopping occurs to pose an impediment to adoption of the DTCXO as the reference signal source of an actual product.

Further, it has been known that a phase noise corresponding to the characteristic of the resonator occurs in the oscillator. The curve D1 shown in FIG. 16 described later is an example of a general C/N characteristic of the quartz crystal resonator, wherein the strength (the vertical axis; dBc/Hz) of the phase noise is inversely proportional to the cube of the mistuned frequency f in an area in which the mistuned frequency (the horizontal axis; Hz) with respect to the oscillation frequency is low, and is inversely proportional to the square of the mistuned frequency f in a range of about 1 kHz through 10 kHz. In the frequency range of equal to or lower than 10 kHz, the influence of a so-called 1/f noise is significant. In contrast, at the frequencies higher than 10 kHz, the influence of a thermal noise is significant, and a flat characteristic independent of the mistuned frequency f is obtained. In other words, due to the characteristic of the resonator, it is inevitable that a signal with a frequency different from the desired oscillation frequency is generated, and the oscillator (and the circuit device including the oscillator) such as a DTCXO is designed so that no problem occurs even if the phase noise causing such a C/N characteristic as represented by D1 occurs.

Figure 16:
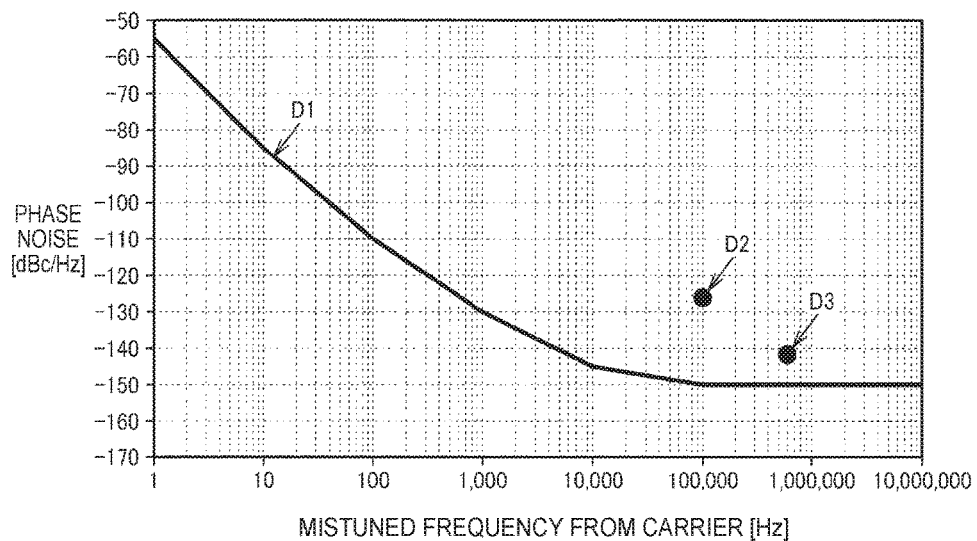
FIG. 16 is an explanatory diagram of a relationship between the C/N characteristic of the resonator and the spurious degrading the C/N characteristic.

However, in the DTCXO, there occurs the spurious having a strength corresponding to the output frequency fs of data (frequency control data DDS) for controlling the oscillation frequency and a variation $\Delta f$ of the oscillation frequency. Although the details will be described later using Formula (10), in the spurious thus generated, the mistuned frequency with respect to the fundamental wave (the oscillation frequency) is fs, and the strength is a value corresponding to $(\Delta f/fs)^2$. Further, depending on the values of fs and $\Delta f$, there is a possibility that there occurs the spurious higher in strength compared to the phase noise inherent in the oscillator represented by D1. The circle D2 shown in FIG. 16 represents an example of the spurious in the case of $\Delta f=0.1$ Hz and fs=100 kHz, and the circle D3 represents an example of the spurious in the case of $\Delta f=0.1$ Hz and fs=600 kHz. The spurious in either of D2 and D3 is higher in strength compared to the phase noise (D1) inherent in the oscillator.

Due to the generation of the spurious represented by the point D2 or D3, the signal strength at the frequency different from the desired oscillation frequency increases in comparison, and the C/N characteristic of the oscillator 400 deteriorates. The deterioration of the C/N characteristic leads to the deterioration of the accuracy of the data obtained using the oscillation signal. For example, in the example of the GPS described above, it leads to the deterioration of the accuracy of the GPS reception signal, and specifically, the accuracy of the position information obtained from the GPS reception signal deteriorates. As described above, the generation of the spurious corresponding to the frequency fluctuation also poses an impediment to adoption of the DTCXO as the reference signal source of an actual product. It should be noted that the spurious represented by the circle D2 or D3 deteriorates the C/N characteristic unless the strength of the spurious is reduced. Therefore, if there is performed a noise reduction process for decreasing the strength of the spurious such as smoothing by a filter circuit, it is not precluded to adopt the values of $\Delta f$, fs corresponding to the circles D2 and D3 in the method according to the present embodiment. The details will be described later.

2. CONFIGURATION

Figure 4:
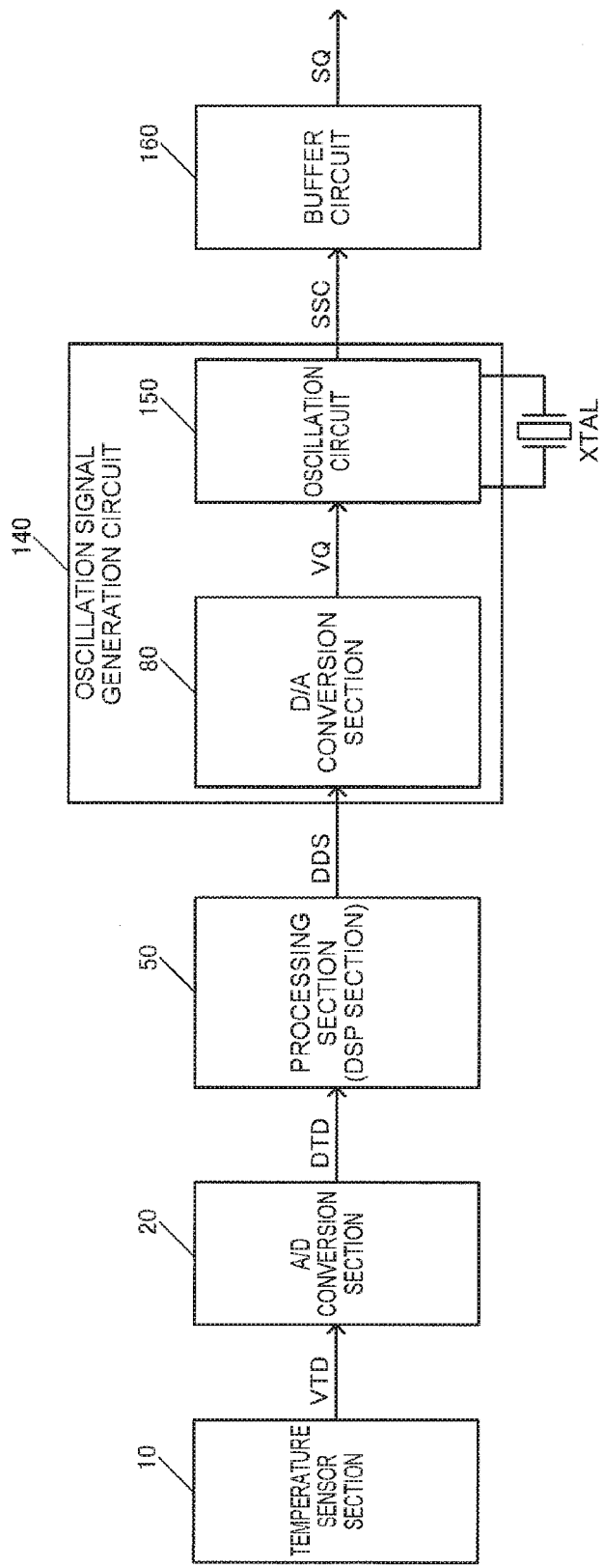
FIG. 4 is a diagram showing a basic configuration example of a circuit device according to an embodiment of the present disclosure.

FIG. 4 shows a fundamental configuration example of the circuit device according to the present embodiment. The circuit device is a circuit device (a semiconductor chip) for realizing the digital-type oscillator such as a DTCXO or an OCXO. By, for example, housing the circuit device and a resonator XTAL in a package, the digital-type oscillator is realized.

The circuit device shown in FIG. 4 includes an A/D conversion section 20 (i.e., A/D converter), a processing section 50 (i.e., processing unit/processor), and an oscillation signal generation circuit 140. Further, the circuit device can include a temperature sensor section 10 and a buffer circuit 160. It should be noted that the configuration of the circuit device is not limited to the configuration shown in FIG. 4, but a variety of practical modifications such as elimination of some of the constituents (e.g., the temperature sensor section, the buffer circuit, the A/D conversion section) or addition of other constituents are possible.

The resonator XTAL is a piezoelectric resonator such as a quartz crystal resonator. The resonator XTAL can also be an oven-type resonator (OCXO) disposed in an oven. The resonator XTAL can also be an electromechanical resonator or an electrical resonance circuit. As the resonator XTAL, there can be adopted a piezoelectric resonator, a surface acoustic wave (SAW) resonator, a MEMS (micro electromechanical systems) resonator, and so on. The substrate material of the resonator XTAL can be a piezoelectric material such as a piezoelectric single crystal such as a quartz crystal, lithium tantalate, or lithium niobate, or can be piezoelectric ceramics such as lead zirconate titanate, a silicon semiconductor material, or the like. An excitation device of the resonator XTAL can be a device using a piezoelectric effect, or electrostatic drive using a coulomb force.

The temperature sensor section 10 outputs a temperature detection voltage VTD. Specifically, a temperature-dependent voltage varying in accordance with the temperature of the environment (the circuit device) is output as the temperature detection voltage VTD. A specific configuration example of the temperature sensor section 10 will be described later.

The A/D conversion section 20 performs the A/D conversion of the temperature detection voltage VTD from the temperature sensor section 10 to output temperature detection data DTD. For example, the digital temperature detection data DTD (A/D result data) corresponds to the A/D conversion result of the temperature detection voltage VTD and is generated by the A/D conversion section. The A/D conversion method utilized by the A/D conversion section 20 can be, for example, a successive approximation method, a method similar to the successive approximation method, and so on. It should be noted that the A/D conversion method is not limited to such methods, but a variety of methods (e.g., a counting type, a parallel comparison type, or a serial-parallel type) can be adopted.

The processing section 50 (i.e., a digital signal processing (DSP) section) performs a variety of types of signal processing. For example, the processing section 50 can operate as a temperature compensation section and performs a temperature compensation process of the oscillation frequency (the frequency of the oscillation signal) based on the temperature detection data DTD. Then, the processing section 50 outputs the frequency control data DDS of the oscillation frequency. Specifically, the processing section 50 performs the temperature compensation process for making the oscillation frequency constant even in the case in which the temperature change occurs based on the temperature detection data DTD (temperature-dependent data) varying in accordance with the temperature, coefficient data (data of the coefficients of an approximation function) for the temperature compensation processing, and so on. The processing section 50 can be realized by an ASIC circuit such as a gate array, or can be realized by a processor and a program running on the processor.

The oscillation signal generation circuit 140 generates an oscillation signal SSC. For example, the oscillation signal generation circuit 140 generates the oscillation signal SSC with the oscillation frequency set by the frequency control data DDS using the frequency control data DDS from the processing section 50 and the resonator XTAL. As an example, the oscillation signal generation circuit 140 oscillates the resonator XTAL at the oscillation frequency set by the frequency control data DDS to generate the oscillation signal SSC.

It should be noted that the oscillation signal generation circuit 140 can also be a circuit for generating the oscillation signal SSC using a direct digital synthesizer system. It is also possible to digitally generate the oscillation signal SSC with the oscillation frequency set by the frequency control data DDS using, for example, the oscillation signal of the resonator XTAL (an oscillation source of a fixed oscillation frequency) as a reference signal.

The oscillation signal generation circuit 140 can include a D/A conversion section (i.e., D/A converter unit/D/A converter) 80 and an oscillation circuit 150. It should be noted that the oscillation signal generation circuit 140 is not limited to such a configuration, but a variety of modified implementations such as elimination of some of the constituents or addition of other constituents can be adopted.

The D/A conversion section 80 performs D/A conversion of the frequency control data DDS (output data of the processing section) from the processing section 50. The frequency control data DDS input to the D/A conversion section 80 is the frequency control data (i.e., a frequency control code) on which the temperature compensation process has been performed by the processing section 50. The D/A conversion method of the D/A conversion section 80 can be, for example, a resistance string type (a resistance division type). It should be noted that the D/A conversion method is not limited to the above, but a variety of methods such as a resistance ladder type (e.g., R-2R ladder type), a capacitance array type, and a pulse-width modulation type may also be used. Further, the D/A conversion section 80 can include a control circuit thereof, a modulation circuit, a filter circuit, and so on besides the D/A converter.

The oscillation circuit 150 generates the oscillation signal SSC using an output voltage VQ of the D/A conversion section 80 and the resonator XTAL. The oscillation circuit 150 is connected to the resonator XTAL via first and second resonator terminals (resonator pads). For example, the oscillation circuit 150 oscillates the resonator XTAL (e.g., a piezoelectric resonator, or a resonator) to thereby generate the oscillation signal SSC. Specifically, the oscillation circuit 150 oscillates the resonator XTAL with the oscillation frequency obtained by using the output voltage VQ of the D/A conversion section 80 as the frequency control voltage (the oscillation control voltage). For example, in the case in which the oscillation circuit 150 is a circuit (VCO) of controlling the oscillation of the resonator XTAL by voltage control, the oscillator circuit 150 can include a variable-capacitance capacitor (e.g., a varicap) having the capacitance value varying in accordance with the frequency control voltage.

It should be noted that as described above, the oscillation circuit 150 can be realized by the direct digital synthesizer system, and in this case, the oscillation frequency of the resonator XTAL becomes the reference frequency, which is different from the oscillation frequency of the oscillation signal SSC.

The buffer circuit 160 performs buffering of the oscillation signal SSC generated by the oscillation signal generation circuit 140 (the oscillation circuit 150), and then outputs a signal SQ obtained by the buffering. In other words, the buffer circuit 160 performs buffering for making it possible to sufficiently drive the external load. The signal SQ is, for example, a clipped sine wave signal. It should be noted that the signal SQ can also be a rectangular wave signal. Alternatively, the buffer circuit 160 can also be a circuit capable of outputting both of the clipped sine wave signal and the rectangular wave signal as the signal SQ.

Figure 5:
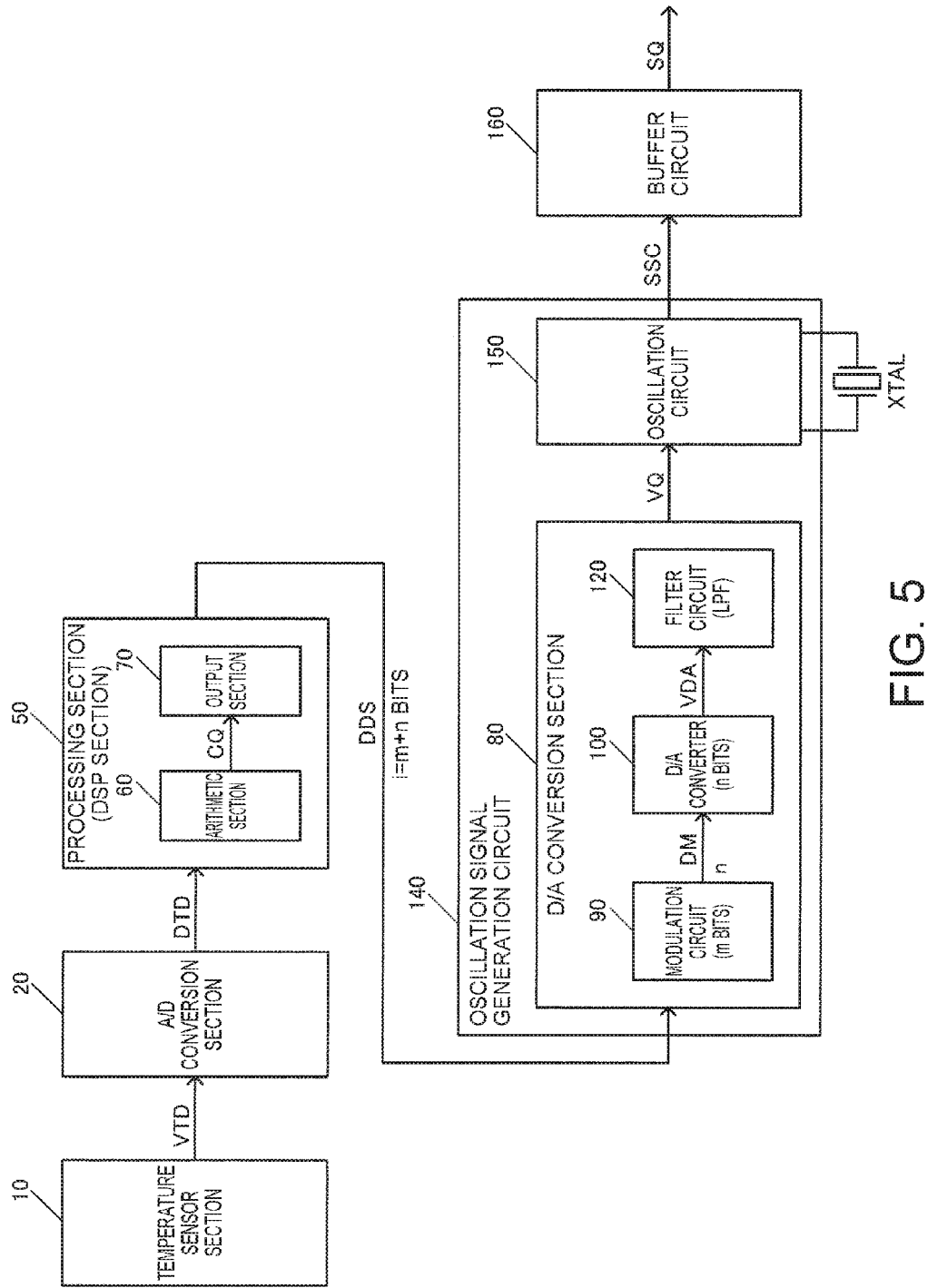
FIG. 5 is a diagram showing a detailed configuration example of the circuit device according to the embodiment.

FIG. 5 shows a detailed configuration example of the circuit device of the present embodiment. In FIG. 5, the D/A conversion section 80 includes a modulation circuit 90, a D/A converter 100, and a filter circuit 120.

The modulation circuit 90 of the D/A conversion section 80 receives the i=(n+m) bit frequency control data DDS from the processing section 50 (i, n, and m are each an integer equal to or greater than 1). As an example, when i=20, n=16, and m=4, then the modulation circuit 90 modulates the n-bit (e.g., 16 bits) data of the frequency control data DDS based on the m-bit (e.g., 4 bits) data of the frequency control data DDS. Specifically, the modulation circuit 90 performs a pulse width modulation (PWM) of the frequency control data DDS. It should be noted that the modulation method of the modulation circuit 90 is not limited to PWM, but can also be a pulse modulation such as a pulse density modulation (PDM), and can also be a modulation method other than the pulse modulation. For example, it is also possible to realize bit extension (extension from the n bits to the i bits) by performing an m-bit dither process (dithering process) on the n-bit data of the frequency control data DDS.

The D/A converter 100 performs the D/A conversion of the n-bit data having been modulated by the modulation circuit 90. For example, the D/A converter 100 performs the D/A conversion of the n-bit bit data (n=16). As the D/A conversion method of the D/A converter 100, there can be adopted, for example, a resistance string type, or a resistance ladder type.

The filter circuit 120 smoothes an output voltage VDA of the D/A converter 100. The filter circuit 120 performs, for example, a low-pass filter treatment to smooth the output voltage VDA. By providing such a filter circuit 120, a pulse width demodulation of the signal having been modulated with the PWM becomes possible. The cutoff frequency of the filter circuit 120 can be set in accordance with the frequency of the PWM of the modulation circuit 90. Specifically, since the signal with the output voltage VDA from the D/A converter 100 includes a ripple of the fundamental frequency of the PWM and the harmonic component, the ripple is attenuated by the filter circuit 120. It should be noted that as the filter circuit 120, it is possible to adopt a passive filter using passive elements such as resistors or capacitors. It should be noted that it is also possible to use an active filter such as an SCF as the filter circuit 120.

As described later, in order to prevent the communication error caused by the frequency hopping explained with reference to FIG. 3 from occurring to achieve an improvement of the frequency accuracy, it is necessary to set the resolution of the D/A conversion section 80 to be as high as possible.

However, it is difficult to realize the D/A conversion with such a resolution as i=20 bits only with the D/A converter 100 of the type of, for example, the resistance string. Further, if the output noise of the D/A conversion section 80 is high, it becomes difficult to realize the improvement in the frequency accuracy due to the noise.

Therefore, in FIG. 5, the D/A conversion section 80 is provided with the modulation circuit 90. Further, the processing section 50 outputs the i-bit (i=m+n) frequency control data DDS having the number of bits larger than n bit (e.g., 16 bits) as the resolution of the D/A converter 100. Since the processing section 50 performs the floating-point operation or the like in order to realize the digital signal processing such as the temperature compensation process, it is easy for the processing section 50 to output such i-bit (i=m+n) frequency control data DDS having the number of bits larger than n bit (e.g., n=16 bits).

Further, the modulation circuit 90 performs the modulation (e.g., PWM) of the n-bit data out of the i (i=m+n) bits based on the m-bit data out of the i (i=m+n) bits, and then outputs n-bit data DM having been modulated to the D/A converter 100. Then, the D/A converter 100 performs the D/A conversion of the data DM, and then the filter circuit 120 performs the smoothing process of the output voltage VDA thus obtained, and thus it becomes possible to realize the D/A conversion with such a high resolution as i (i=m+n; e.g., 20 bits) bits.

According to this configuration, since the resistance string type low in output noise, for example, can be adopted as the D/A converter 100, the output noise of the D/A converter 80 can be reduced, and it becomes easy to prevent the deterioration of the frequency accuracy. For example, although a noise occurs due to the modulation in the modulation circuit 90, the noise can sufficiently be attenuated by the setting of the cutoff frequency of the filter circuit 120, and the deterioration of the frequency accuracy due to the noise can be prevented.

It should be noted that the resolution of the D/A conversion section 80 is not limited to i=20 bits, but can be a resolution higher than 20 bits, or a resolution lower than 20 bits. Further, the number of bits of the modulation by the modulation circuit 90 is not limited to m=4 bits, but can be larger than 4 bits (e.g., m=8 bits), or can be smaller than 4 bits.

Further, in FIG. 5, the configuration in which the processing section 50 for performing the digital signal processing such as the temperature compensation process is disposed in the anterior stage of the D/A conversion section 80 is used effectively. Specifically, the processing section performs the digital signal processing such as the temperature compensation process with high accuracy using, for example, the floating-point operations. Therefore, by treating the lower bits of the mantissa part of the result of the floating-point calculation as effective data to perform the conversion into the binary data, the frequency control data DDS with such a high number of bits as i=m+n=20 bits can easily be output. In FIG. 5, focusing attention on this point, by supplying the i-bit (i=m+n) frequency control data DDS having such a high number of bits to the D/A conversion section 80, and using the m-bit modulation circuit 90 and the n-bit D/A converter 100, the D/A conversion with such a high resolution as i=m+n is successfully realized.

By increasing the resolution of the D/A conversion section 80 to the high resolution as described above, the frequency hopping described above can be prevented from occurring. Thus, it becomes possible to prevent the communication error caused by the frequency hopping from occurring.

Further, besides the problem of such frequency hopping as described above, in the digital-type oscillator such as a DTCXO or an OCXO, extremely high frequency accuracy is required for the oscillation frequency. For example, in the TDD system described above, data is transmitted and received in a time division manner using the same frequency between the uplink and the downlink, and the guard time is set between the time slots assigned to the respective devices. Therefore, in order to realize the appropriate communication, it is necessary to perform the time synchronization in each device, and timing of accurate absolute time is required. For example, in the case in which there occurs a holdover in which the reference signal (a GPS signal or a signal via the Internet) is lost or abnormalized, it is required for the oscillator side to accurately time the absolute time in the state in which the reference signal is absent. Therefore, extremely high oscillation frequency accuracy is required for the oscillator used for such equipment (e.g., the GPS-related equipment or the base station).

If a measure of providing each device with an atomic clock is adopted in order to realize such a requirement, an increase in cost and growth in scale of the device are incurred. Further, even if the oscillator high in frequency accuracy is realized, it is undesirable that the circuit device used for the oscillator grows in scale, or the power consumption increases to an extremely high level.

In this regard, according to the configuration of the circuit device shown in FIG. 5, the D/A conversion section 80 with such an extremely high resolution as i≥20 bits by providing the D/A conversion section 80 with the modulation circuit 90 and the filter circuit 120, and due to such an increase in the resolution, an increase in accuracy of the oscillation frequency can be realized. Further, the increase in chip size and the increase in power consumption of the circuit device caused by providing the modulation circuit 90 and the filter circuit 120 are not very large. Further, since the processing section 50 performs the temperature compensation process using the floating-point operation, it is easy to output the frequency control data DDS with, for example, i≥20 bits to the D/A conversion section 80. Therefore, the configuration of the circuit device shown in FIG. 5 has an advantage that both the increase in accuracy of the oscillation frequency and suppression of the increase in scale and power consumption of the circuit device can be realized at the same time.

It should be noted that the circuit device shown in FIG. 4 and FIG. 5 can also be used as an oscillation IC in a PLL circuit having a phase comparator circuit for comparing the reference signal (the GPS signal or the signal via the Internet) and an input signal based on the oscillation signal with each other. In this case, it is sufficient for the processing section 50 to perform, for example, the temperature compensation process, an aging correction process, and so on to the frequency control data from the phase comparator circuit to generate the oscillation signal with the oscillation signal generation circuit 140.

Further, in the case in which the temperature has changed from a first temperature to a second temperature, the processing section 50 outputs the frequency control data DDS, which changes from first data corresponding to the first temperature (first temperature detection data) to second data corresponding to the second temperature (second temperature detection data) in increments of k×LSB (i.e., increases or decreases in increments of k×LSB, where "LSB" is least significant bit). Here, k≥1 is fulfilled, and k is an integer equal to or greater than 1. For example, in the case of assuming the number of bits (the resolution of the D/A conversion section) of the frequency control data DDS as i, k<$2^i$ is true, and k is an integer sufficiently smaller than $2^i$ (e.g., k=1 through 8). More specifically, k<$2^m$ is fulfilled. In the case of, for example, k=1, the processing section 50 outputs the frequency control data DDS, which changes from the first data to the second data by 1 LSB (by 1 bit). Specifically, the processing section 50 outputs the frequency control data DDS, which changes from the first data toward the second data while being shifted by 1 LSB (1 bit) at a time. It should be noted that the changing step width of the frequency control data DDS is not limited to 1 LSB, but can also be the changing step width equal to or greater than 2×LSB such as 2×LSB, 3×LSB, or 4×LSB.

For example, the processing section 50 includes an arithmetic section 60 and an output section 70. The arithmetic section 60 performs an arithmetic operation of the temperature compensation process of the oscillation frequency based on the temperature detection data DTD. The arithmetic section 60 realizes the temperature compensation process with the digital signal processing using, for example, the floating-point operations. The output section 70 receives operation result data CQ from the arithmetic section 60 to output the frequency control data DDS. Further, in the case in which the operation result data CQ has changed from the first data corresponding the first temperature to the second data corresponding to the second temperature, the output section 70 performs an output process of the frequency control data DDS, which changes from the first data to the second data in k×LSB increments/steps.

As described above, if the frequency control data DDS output from the processing section 50 changes in k×LSB increments, it is possible to prevent the situation in which a large voltage change occurs in the output voltage VQ of the D/A conversion section 80 in the case in which, for example, the temperature changes from the first temperature to the second temperature, and due to the voltage change, the frequency hopping shown in FIG. 3 occurs. Thus, it becomes possible to prevent the communication error from occurring due to the frequency hopping.

More specifically, the processing section 50 compares the first data, which is the operation result data (CQ) of the temperature compensation process in the previous operation (at the previous timing), and the second data, which is the operation result data of the temperature compensation process in the present operation (at the present timing), with each other.

Then, in the case in which the second data is higher than the first data, the processing section 50 by way of the output section 70 performs a process of adding a predetermined value to the first data. The processing section 50 performs, for example, the process of adding k×LSB as the predetermined value. In the case of, for example, k=1, the processing section 50 performs the process of adding 1 LSB as the predetermined value. It should be noted that the predetermined value to be added is not limited to 1 LSB, but can also be equal to or more than 2×LSB. Then, while performing, for example, the addition process until addition result data reaches the second data, the processing section 50 outputs the addition result data as the frequency control data DDS.

On the other hand, in the case in which the second data corresponding to the second temperature is lower than the first data corresponding to the first temperature, the processing section 50 byway of the output section 70 performs a process of subtracting a predetermined value from the first data. The processing section 50 performs, for example, the process of subtracting k×LSB as the predetermined value. In the case of, for example, k=1, the processing section 50 performs the process of subtracting 1 LSB as the predetermined value. It should be noted that the predetermined value to be subtracted is not limited to 1 LSB, but can also be equal to or more than 2×LSB. Then, while performing, for example, the subtraction process until subtraction result data reaches the second data, the processing section 50 outputs the subtraction result data as the frequency control data DDS.

As described above, the frequency control data DDS is outputted while performing the process of adding the predetermined value to the first data, or subtracting the predetermined value from the first data. Accordingly, it becomes possible to output the frequency control data DDS that changes from the first data to the second data in increments of, for example, k×LSB corresponding to the predetermined value in the case in which the operation result data of the temperature compensation process has changed from the first data corresponding to the first temperature to the second data corresponding to the second temperature.

Further, in a first mode (a normal mode), the processing section 50 (the output section 70) performs the output process of the frequency control data DDS changing by k×LSB increments. Thus, the generation of the communication error caused by the frequency hopping can be suppressed.

In contrast, in a second mode (a high-speed mode), the processing section 50 outputs the operation result data of the temperature compensation process as the frequency control data DDS without performing the output process of the frequency control data DDS changing by k×LSB increments. Specifically, the output section 70 receives the operation result data CQ from the arithmetic section 60 to output the frequency control data DDS. According to this operation, it becomes possible to supply the D/A conversion section 80 with the frequency control data DDS changing faster compared to the first mode, and it becomes possible to realize the high-speed mode.

It should be noted that the first mode is set during a normal operation of the circuit device (in a normal operation period). In contrast, the second mode is set during, for example, startup (in a startup period) or inspection (in the test period) of the circuit device. In other words, the circuit device is set to the second mode during the operation other than the normal operation.

For example, during the normal operation of the circuit device, by setting the processing section 50 to the first mode, the processing section 50 outputs the frequency control data DDS changing by k×LSB increments. Thus, it becomes possible to prevent the problem of the frequency hopping to achieve an improvement of accuracy of the oscillation frequency and so on.

In contrast, during the startup or the inspection of the circuit device, by setting the processing section 50 to the second mode, the processing section 50 may not perform the process of changing the frequency control data DDS by k×LSB, and outputs the operation result data CQ from the arithmetic section 60 directly as the frequency control data DDS. Thus, the startup time of the circuit device can be shortened, and it becomes possible to start up the circuit device at high speed. Further, the inspection period (the test period) in, for example, manufacturing the circuit device or the oscillator can be reduced, and it becomes possible to achieve reduction of the manufacturing period.

Further, in the present embodiment, the processing section 50 outputs the frequency control data DDS at an output rate higher than the output rate of the temperature detection data DTD from the A/D conversion section 20. According to this operation, it becomes possible to output the frequency control data DDS changing from the first data to the second data by k×LSB increments. For example, it becomes possible to change the frequency control data DDS by k×LSB in a stepwise manner in the period corresponding to the A/D conversion period.

Figure 6:
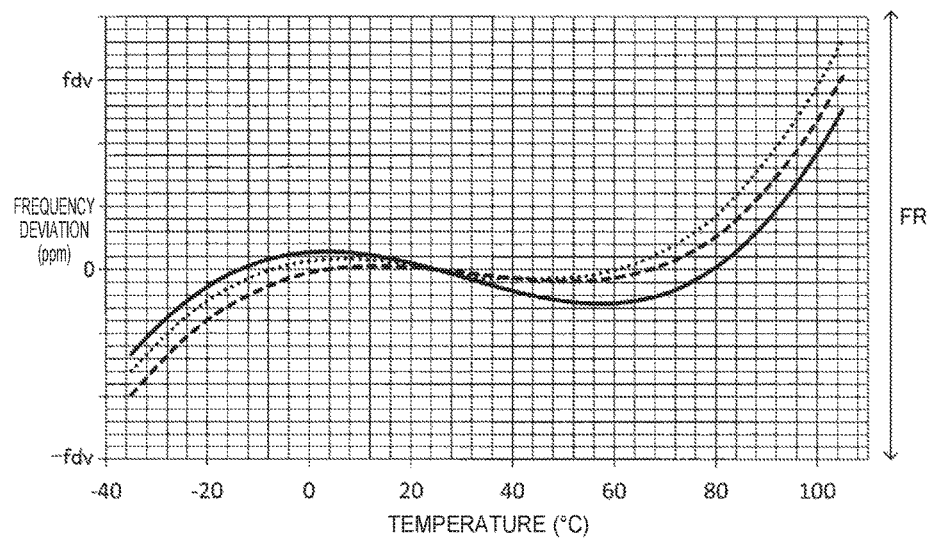
FIG. 6 is a diagram showing an example of the temperature characteristic of a resonator and the variation of the temperature characteristic.

FIG. 6 is a diagram showing an example of the frequency deviation of the oscillation frequency due to the temperature of the resonator XTAL (e.g., an AT resonator). The processing section 50 performs the temperature compensation process for making the oscillation frequency of the resonator XTAL, which has the temperature characteristic shown in FIG. 6, constant and independent of the temperature.

Figure 7:
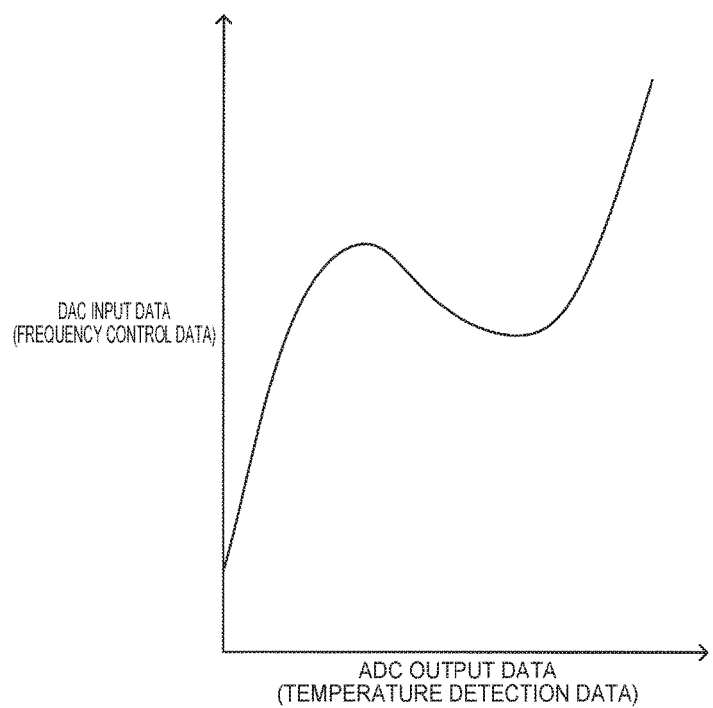
FIG. 7 is an explanatory diagram of a temperature compensation process according to the embodiment.

Specifically, the processing section 50 performs the temperature compensation process for making the output data (the temperature detection data) of the A/D conversion section 20 and the input data (the frequency control data) of the D/A conversion section 80 have the correspondence relationship shown in FIG. 7. The correspondence relationship (the frequency correction graph) shown in FIG. 7 can be obtained by, for example, a method of placing the oscillator incorporated in the circuit device into an oven, and then monitoring the input data (DDS) of the D/A conversion section 80 and the output data (DTD) of the A/D conversion section 20 at each temperature.

Then coefficient data of an approximation function for the temperature compensation for realizing the correspondence relationship shown in FIG. 7 is stored in advance in the memory section (a nonvolatile memory) of the circuit device. Then, the processing section 50 performs the arithmetic process based on the coefficient data readout from the memory section and the temperature detection data DTD from the A/D conversion section 20 to thereby realize the temperature compensation process for making the oscillation frequency of the resonator XTAL independent of the temperature.

It should be noted that the temperature detection voltage VTD of the temperature sensor section 10 has, for example, a negative temperature characteristic as described later. Therefore, it becomes possible to cancel out the temperature dependency of the oscillation frequency of the resonator XTAL shown in FIG. 6 with the temperature compensation characteristic shown in FIG. 7 to achieve the compensation.

3. METHOD OF PRESENT EMBODIMENT

Then, the method according to the present embodiment will be described. Firstly, the communication error of the GPS (global positioning system) caused by the frequency hopping will be described using FIG. 8. Further, the C/N characteristic of the oscillator 400 and the spurious will be described using FIG. 16 through FIG. 19.

3.1 Frequency Hopping

Figure 8:
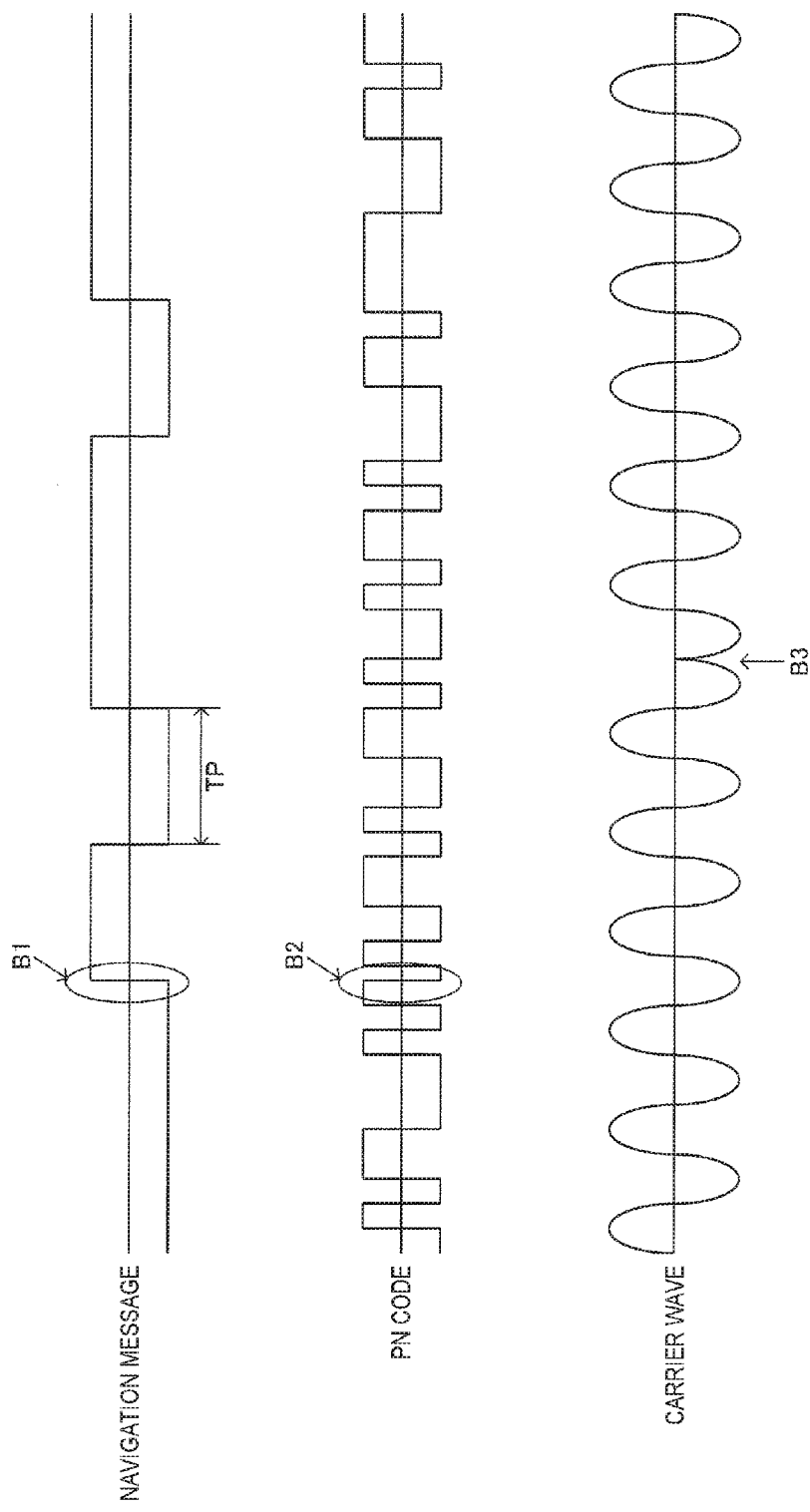
FIG. 8 is an explanatory diagram of a communication error caused by the frequency drift.

The GPS satellite includes information related to the satellite orbit, the time, and so on in a navigation message shown in FIG. 8 to transmit the information as a GPS satellite signal at a data rate of 50 bps. Therefore, the length of 1 bit corresponds to 20 msec (20 cycles of an PN code). One navigation message is formed of one master frame, and one master frame is formed of 25 frames each formed of 1500 bits.

The GPS satellite signal is modulated using the BPSK modulation method in accordance with the bit value of the navigation message as shown in FIG. 8. Specifically, the navigation message is multiplied by the PN code (a pseudo random code) to perform spectrum spreading, and by multiplying the signal obtained by the spectrum spreading by a carrier wave (1575.42 MHz), the BPSK modulation is performed. FIG. 8 shows the PN code corresponding to a B1 part of the navigation message, and shows the carrier wave corresponding to a B2 part of the PN code. At the timing at which the logic level of the PN code changes, the carrier wave makes a phase inversion as indicated by B3. The period corresponding to the wavelength of the carrier wave is about 0.635 ns. The GPS receiver receives the carrier wave of the navigation message modulated with the BPSK modulation method, and then performs a demodulation process of the received signal of the carrier wave to thereby obtain the navigation message.

When performing the demodulation process of such a received signal, if the residual error frequency from the frequency (1575.42 MHz) of the carrier wave fails to fall within 4 Hz/20 msec, a false determination arises in the demodulation process. In other words, the communication error due to the frequency hopping occurs unless the residual error frequency from the frequency of the carrier wave is made to fall within 4 Hz in the TP (=20 msec) as the period (the period of the GPS navigation message) corresponding to 1 bit length of the GPS navigation message.

Further, since the proportion of 4 Hz described above to 1575.42 MHz as the frequency of the carrier wave is in a range of several ppb, the FD as the allowable drift frequency shown in FIG. 2 and FIG. 3 also become in a range of several ppb.

For example, in the receiver of the GPS, the frequency of the carrier wave in the demodulation process is set in accordance with the oscillation signal generated by the circuit device (the oscillator) according to the present embodiment. Therefore, it becomes necessary to make the frequency drift of the oscillation frequency of the oscillation signal fall within ±FD in the predetermined period TP=20 msec. By fulfilling the requirement, the false determination can be prevented from occurring in the demodulation process of the received signal of the GPS satellite signal, and the occurrence of the communication error (reception error) can be avoided.

However, in the digital-type oscillator such as the related-art DTCXO, it has not been performed to make the frequency drift fall within the range of ±FD (in a range of several ppb) in the period TP (20 msec). Therefore, there has been the problem that the communication error due to the false determination of the demodulation process is caused by the frequency hopping shown in FIG. 3.

Therefore, in the present embodiment, by adopting the method described with reference to FIG. 9 through FIG. 13 and so on, the problem of the frequency hopping is solved.

Figure 9:
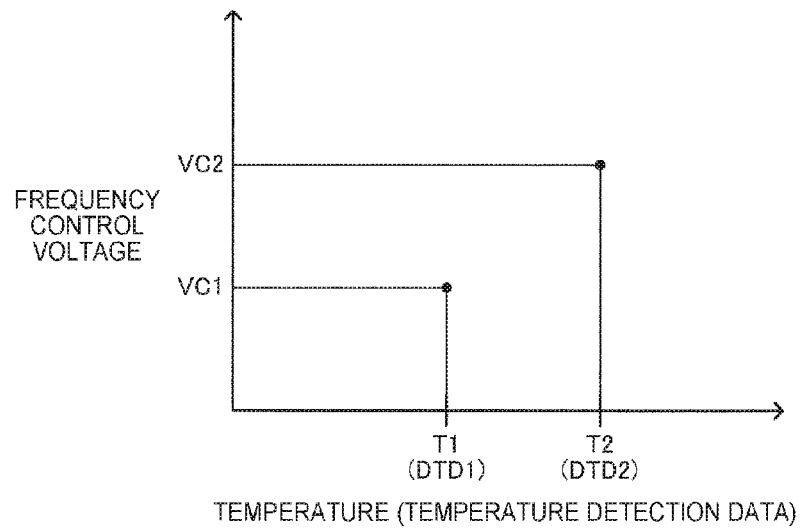
FIG. 9 is an explanatory diagram regarding a change in frequency control voltage in the case in which the temperature changes from a first temperature to a second temperature.

In FIG. 9, the frequency control voltage corresponding to the first temperature T1 is defined as a first control voltage VC1. Further, the frequency control voltage corresponding to the second temperature T2 is defined as a second control voltage VC2. The frequency control voltage (an oscillation control voltage) is the frequency control voltage of the oscillation circuit 150 shown in FIG. 4 and FIG. 5, and corresponds to, for example, the output voltage VQ of the D/A conversion section 80. The first and second temperatures T1, T2 are temperatures detected by the temperature sensor section 10, and each correspond to the temperature detection data DTD from the A/D conversion section 20.

For example, the temperature detection data DTD of the A/D conversion section 20 in the case in which the temperature is the first temperature T1 is defined as first temperature detection data DTD1. The temperature detection data DTD of the A/D conversion section 20 in the case in which the temperature is the second temperature T2 is defined as second temperature detection data DTD2.

In this case, the first control voltage VC1 shown in FIG. 9 becomes the frequency control voltage corresponding to the first temperature detection data DTD1 in the temperature compensation characteristic explained with reference to FIG. 7. Further, the second control voltage VC2 becomes the frequency control voltage corresponding to the second temperature detection data DTD2 in the temperature compensation characteristic described above.

It should be noted that in FIG. 9, there is assumed the case in which the frequency control voltage rises as the temperature rises for the sake of convenience of explanation. Specifically, as is obvious from FIG. 6 and FIG. 7, as the temperature rises, the frequency control voltage rises in a certain temperature range, or the frequency control voltage falls in another temperature range. However, the description will be presented here assuming the former case.

Figure 10:
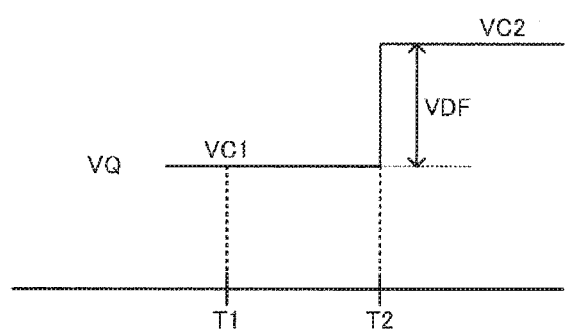
FIG. 10 is an explanatory diagram regarding the change in frequency control voltage in the case in which the temperature changes from the first temperature to the second temperature.

As shown in FIG. 10, in the case in which the temperature has changed from the first temperature T1 to the second temperature T2, the difference voltage between the first control voltage VC1 and the second control voltage VC2 becomes VDF. Therefore, if nothing is devised, in the case in which the temperature has changed from the first temperature T1 to the second temperature T2, the output voltage VQ of the D/A conversion section 80 changes from VC1 to VC2. In other words, it results that the output voltage VQ of the D/A conversion section 80 changes by the step width corresponding to the difference voltage VDF.

Specifically, as described above, the first control voltage VC1 is the frequency control voltage corresponding to the first temperature detection data DTD1 in the temperature compensation characteristic shown in FIG. 7, and the second control voltage VC2 is the frequency control voltage corresponding to the second temperature detection data DTD2. Therefore, in the normal situation, it results that the D/A conversion section 80 outputs the first control voltage VC1 as the frequency control voltage corresponding to the first temperature detection data DTD1 at the first temperature T1, and outputs the second control voltage VC2 as the frequency control voltage corresponding to the second temperature detection data DTD2 at the second temperature T2. Therefore, the output voltage VQ of the D/A conversion section 80 significantly changes from the first control voltage VC1 to the second control voltage VC2 by the step width corresponding to the difference voltage VDF.

Further, if the output voltage VQ of the D/A conversion section 80 significantly changes by the step width corresponding to the difference voltage VDF as described above, the frequency hopping shown in FIG. 3 occurs. Specifically, the oscillation circuit 150 shown in FIG. 4 and FIG. 5 oscillates the resonator XTAL using the output voltage VQ of the D/A conversion section 80 as the frequency control voltage. Therefore, if the output voltage VQ of the D/A conversion section 80 changes by the step width corresponding to the difference voltage VDF, the oscillation frequency of the resonator XTAL also changes by the step width corresponding to the difference voltage VDF. As a result, the frequency hopping shown in FIG. 3 occurs, and the communication error explained with reference to FIG. 8 occurs.

Figure 11:
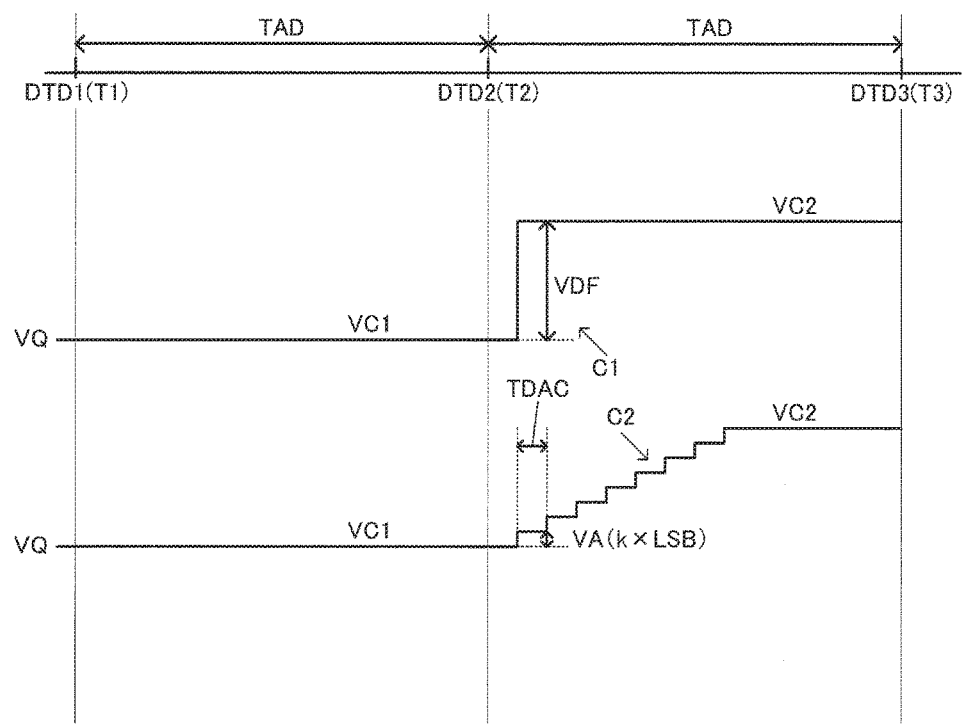
FIG. 11 is an explanatory diagram of a method according to the embodiment.

Therefore, in the present embodiment, as shown in FIG. 11, in the case in which the temperature has changed from the first temperature T1 to the second temperature T2, it is arranged that the output voltage VQ, which changes with a voltage width smaller than an absolute value of the difference voltage VDF between the first control voltage VC1 and the second control voltage VC2, is output from the D/A conversion section 80 to the oscillation circuit 150.

The absolute value of the difference voltage VDF is, for example, |VC1−VC2|. In this case, VC1>VC2 can be assumed, or VC1<VC2 can also be assumed. Further, in the case in which VC1=VC2 (DTD1=DTD2) is fulfilled due to the absence of the temperature change, the variation voltage width of the output voltage VQ deservingly becomes 0 V, and the absolute value of the difference voltage VDF and the variation voltage width of the output voltage VQ coincide with each other. In other words, this case is an exceptional case to the method according to the present embodiment.

For example, in the case in which the method according to the present embodiment is not adopted, the output voltage VQ of the D/A conversion section 80 changes by the step width corresponding to the difference voltage VDF as indicated by C1 in FIG. 11 in the case in which the temperature has changed from T1 to T2.

In contrast, in the method according to the present embodiment, as indicated by C2 in FIG. 11, the output voltage VQ of the D/A conversion section 80 is made to change with the voltage width VA smaller than the absolute value of the difference voltage VDF. The voltage width VA is a voltage variation of the output voltage VQ in, for example, a period TDAC.

As indicated by C2 in FIG. 11, if the output voltage VQ of the D/A conversion section 80 is made to change so as to fulfill VA<VDF, the change in the oscillation frequency of the oscillation circuit 150 also becomes extremely small compared to the case of C1. Therefore, the occurrence of the frequency hopping shown in FIG. 3 is suppressed, and it becomes possible to prevent the communication error explained with reference to FIG. 8 from occurring.

More specifically, in the present embodiment, in the case of denoting the minimum resolution value of the data in the D/A conversion by LSB, the D/A conversion section 80 outputs the output voltage VQ changing by the step width of the voltage corresponding to k×LSB (k≥1). For example, as indicated by C2 in FIG. 11, the output voltage VQ of the D/A conversion section 80 changes in a staircase pattern (in a stepwise manner) by the step width of the voltage corresponding to k×LSB. In other words, the voltage width VA described above is the step width of the voltage corresponding to k×LSB of the D/A conversion section 80, for example. It should be noted that it is sufficient for the voltage width VA to be equal to or smaller than the step width of the voltage corresponding to k×LSB, and it is also possible to arrange that the voltage width VA becomes smaller than the step width of the voltage corresponding to k×LSB using, for example, a method of a modified example described later.

Here, LSB is the minimum resolution value of the data (the frequency control data DDS output by the processing section 50) input to the D/A conversion section 80. Further, the voltage corresponding to LSB is the minimum resolution voltage, which is a voltage corresponding to the minimum resolution value in the D/A conversion. Therefore, the voltage corresponding to k×LSB is equivalent to the voltage k times as high as the minimum resolution voltage.

Further, in the case of assuming the resolution of the D/A conversion section 80 as i, $k<2^i$ is true, and k is an integer sufficiently smaller than $2^i$ (e.g., k=1 through 8). More specifically, in the case of extending the resolution of the D/A conversion section 80 from n bits to i=n+m bits by, for example, providing the modulation circuit 90, $k<2^m$ can be adopted.

In the case in which, for example, k=1 is set, the output voltage VQ of the D/A conversion section 80 changes by the step width of the voltage corresponding to 1 LSB (1 bit). For example, the output voltage VQ of the D/A conversion section 80 changes (increases or decreases) in a staircase pattern (in a stepwise manner) by the step width of the voltage corresponding to 1 LSB.

In other words, the output voltage VQ of the D/A conversion section 80 changes by the step width of the voltage corresponding to 1 LSB (k×LSB, in abroad sense) independently of the input data DDS to the D/A conversion section 80. This can be realized by the processing section 50, or more particularly, the output section 70 that outputs the frequency control data DDS, which changes from the first data corresponding to the first temperature to the second data corresponding to the second temperature by 1 LSB increments (by k×LSB), in the case in which the temperature has changed from the first temperature to the second temperature.

Further, the stepwise change by the step width of the voltage corresponding to k×LSB as indicated by C2 in FIG. 11 is realized by the processing section 50 outputting (the D/A conversion section 80 performing the D/A conversion) the frequency control data DDS at a higher output rate than the output rate of the temperature detection data DTD (DTD1, DTD2) from the A/D conversion section 20.

For example, the A/D conversion section 20 outputs the temperature detection data DTD at intervals of the period TAD as shown in FIG. 11. For example, the A/D conversion section 20 outputs the first temperature detection data DTD1 corresponding to the first temperature T1, and subsequently outputs the second temperature detection data DTD2 corresponding to the second temperature T2 after the period TAD has elapsed. The period TAD corresponds to the A/D conversion interval (a sampling interval of the temperature detection voltage) of the A/D conversion section 20, and 1/TAD corresponds to the output rate of the A/D conversion section 20.

Figure 21:
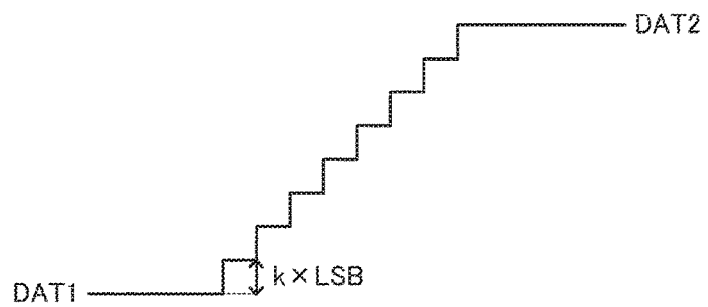
FIG. 21 an explanatory diagram of a method of changing the frequency control data by k×LSB.
Figure 22:
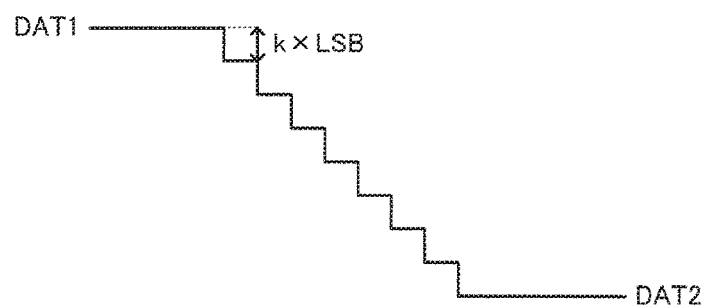
FIG. 22 an explanatory diagram of the method of changing the frequency control data by k×LSB.

Then, when the A/D conversion section 20 outputs the second temperature detection data DTD2, the processing section 50, which has received the second temperature detection data DTD2, performs the digital signal processing such as the temperature compensation process to output the frequency control data DDS corresponding to the second temperature detection data DTD2. On this occasion, the processing section 50 changes the frequency control data DDS by k×LSB in a staircase pattern as shown in FIG. 21 and FIG. 22 described later. Therefore, the output voltage VQ of the D/A conversion section 80, which receives the frequency control data DDS changing by k×LSB increments, and then performs the D/A conversion, also becomes to change by the step width of the voltage corresponding to k×LSB at intervals of the period TDAC as indicated by C2 in FIG. 11.

Here, the period TDAC corresponds to the D/A conversion interval (an output interval of the frequency control data DDS of the processing section 50) of the D/A conversion section 80, and 1/TDAC corresponds to the output rate of the processing section 50 and the D/A conversion section 80.

Further, as shown in FIG. 11, TAD>TDAC is true, and 1/TDAC as the output rate of the processing section 50 and the D/A conversion section 80 is set higher compared to 1/TAD as the output rate of the A/D conversion section 20. Therefore, it becomes possible for the output voltage VQ to change from the control voltage VC1 to the control voltage VC2 in the period TAD even if the variation width of the output voltage VQ in each of the periods TDAC (at the output rate 1/TDAC) is the voltage width as small as the voltage corresponding to VA=k×LSB. In other words, it becomes possible to make the output voltage VQ change from the control voltage VC1 corresponding to the temperature detection data DTD1 to the control voltage VC2 corresponding to the temperature detection data DTD2 in the period TAD as the A/D conversion interval in the case in which the temperature has changed from T1 to T2 to change the temperature detection data from DTD1 to DTD2. Further, since the voltage width VA of the voltage variation in this case is small, it becomes possible to suppress the occurrence of the frequency hopping.

Figure 12:
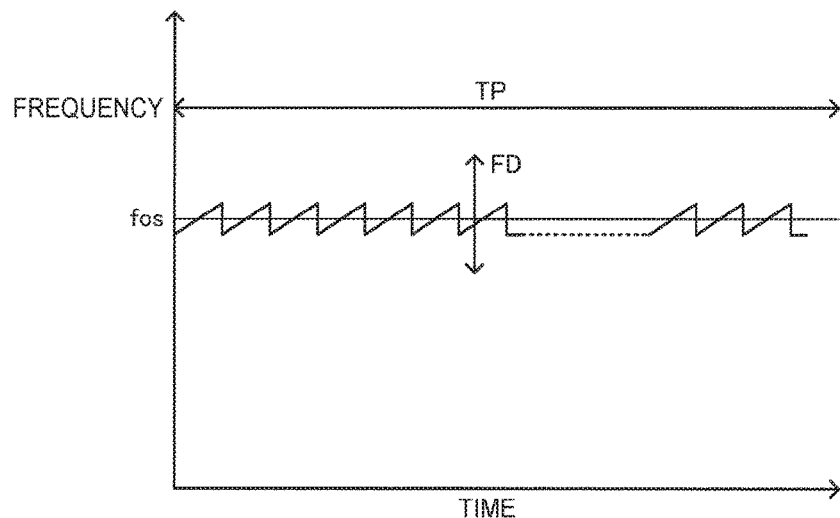
FIG. 12 is an explanatory diagram of the method according to the embodiment.

FIG. 12 is a diagram for explaining the method according to the present embodiment in the frequency domain. For example, the frequency variable range of the oscillation frequency due to the oscillation signal generation circuit 140 (the D/A conversion section 80 and the oscillation circuit 150) is denoted by FR. For example, the oscillation signal generation circuit 140 performs the frequency adjustment shown in FIG. 13 with respect to the temperature change, and the frequency variable range in the frequency adjustment corresponds to FR. Therefore, if the range of the frequency adjustment corresponding to the temperature change falls within the frequency variable range FR, the temperature adjustment by the oscillation signal generation circuit 140 becomes achievable.

Further, the allowable frequency drift of the oscillation frequency in the predetermined period TP is denoted by FD. For example, in order to prevent the communication error explained with reference to FIG. 8 from occurring, it is necessary to make the frequency drift of the oscillation frequency in the predetermined period TP fall within the allowable frequency drift FD. If the frequency drift of the oscillation frequency becomes to fail to fall within the allowable frequency drift FD due to the frequency hopping shown in FIG. 3, the false determination occurs in the demodulation process of the received signal such as the GPS satellite signal to cause the communication error.

Further, the full-scale voltage of the D/A conversion section 80 is denoted by VFS. It is possible for the D/A conversion section 80 to change the output voltage VQ within the range of the full-scale voltage VFS. The full-scale voltage VFS corresponds to the voltage range in the case in which, for example, the frequency control data DDS input to the D/A conversion section 80 changes in the full-range such as 0 through $2^i$.

Further, the voltage width of the voltage variation of the output voltage VQ in the D/A conversion interval (TDAC) of the D/A conversion section 80 explained with reference to FIG. 11 is denoted by VA. In this case, in the method according to the present embodiment, Formula (1) below is true as shown in FIG. 12.

$$VA<(FD/FR) \times VFS \quad (1)$$

Specifically, in the case of assuming the resolution of the D/A conversion section 80 as i bits, Formula (2) below is true.

$$1/2^i<(FD/FR) \quad (2)$$

By adopting the method according to the present embodiment shown in Formulas (1), (2) described above, it becomes possible to make the frequency drift of the oscillation frequency with respect to the normal oscillation frequency fos (e.g., about 16 MHz) in the predetermined period TP (e.g., 20 msec) fall within the allowable frequency drift FD (e.g., in a range of several ppb) as shown in FIG. 12. Thus, it becomes possible to prevent the communication error and so on caused by the frequency hopping explained with reference to FIG. 3 and so on from occurring.

For example, "(FD/FR)×VFS," the right-hand side of Formula (1) described above, is obtained by multiplying the full-scale voltage VFS of the D/A conversion section 80 by (FD/FR), which is the ratio of the allowable frequency drift FD to the frequency variable range FR.

Further, if the voltage width VA of the variation of the output voltage VQ in the D/A conversion interval (TDAC) of the D/A conversion section 80 is set to be smaller than (FD/FR)×VFS, it becomes possible to make the frequency drift to the normal oscillation frequency fos fall within the allowable frequency drift FD in the frequency domain as shown in FIG. 12. In other words, the voltage width VA of the variation of the output voltage VQ of the D/A conversion section 80 can be made smaller as indicated by C2 in FIG. 11, and it becomes possible to suppress the occurrence of the frequency hopping.

Figure 14:
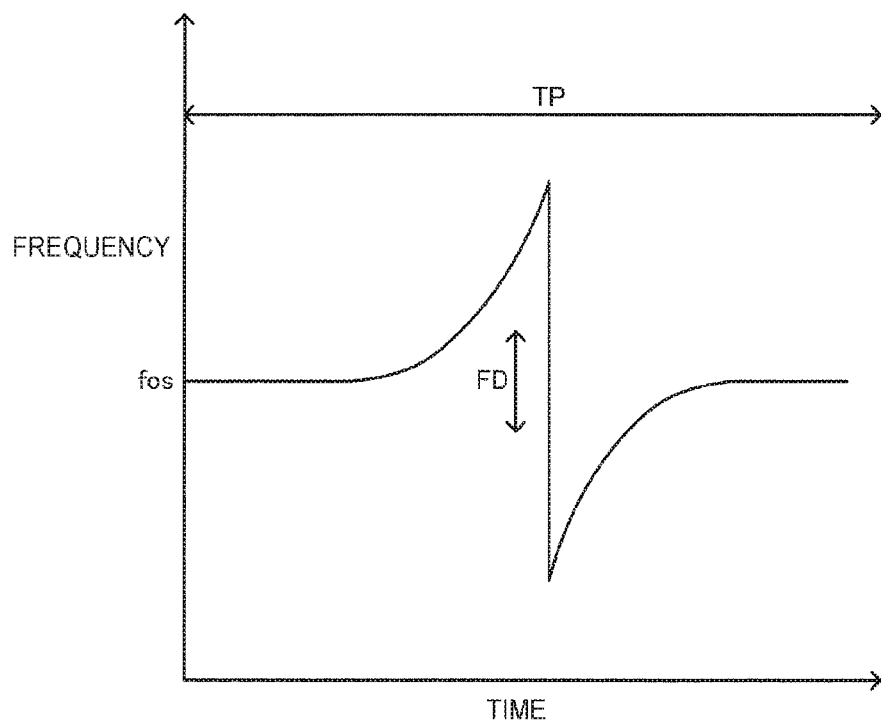
FIG. 14 is an explanatory diagram of frequency hopping.

For example, if Formula (1) described above is not true, there occurs the frequency hopping, in which the frequency drift with respect to the normal oscillation frequency fos becomes to fail to fall within the allowable frequency drift FD, as shown in FIG. 14, and there occur the communication error and so on explained with reference to FIG. 8. In the present embodiment, by changing the output voltage VQ of the D/A conversion section 80 so that Formula (1) described above is true, the occurrence of such frequency hopping is suppressed, and it becomes possible to prevent the communication error and so on.

Figure 13:
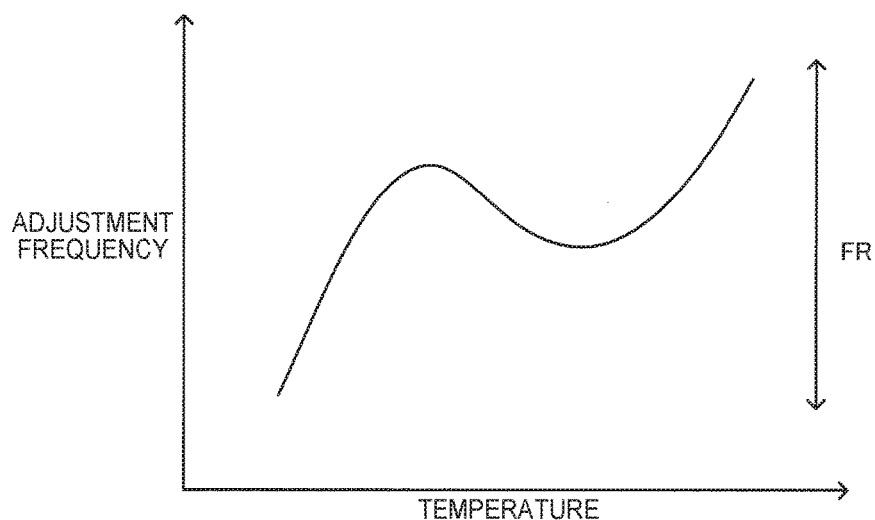
FIG. 13 is an explanatory diagram of the method according to the embodiment.

Specifically, the D/A conversion section 80 changes the output voltage VQ in the range of the full-scale voltage VFS to adjust the oscillation frequency of the oscillation circuit 150 in the frequency variable range FR shown in FIG. 13 to thereby realize the temperature compensation process of the oscillation frequency explained with reference to FIG. 6 and FIG. 7.

However, if the voltage width VA of the variation of the output voltage VQ of the D/A conversion section 80 increases to a level satisfying, for example, VA(FD/FR)× VFS, the frequency drift of the oscillation frequency exceeds the allowable frequency drift FD to cause the frequency hopping shown in FIG. 14.

In contrast, in the present embodiment, since the output voltage VQ of the D/A conversion section 80 is changed by such a small voltage width VA that the relationship of VA<(FD/FR)×VFS is true, it becomes possible to suppress the occurrence of the frequency hopping shown in FIG. 14.

Further, in the case of assuming the resolution of the D/A conversion section 80 as i bits, in the present embodiment, it is arranged that $1/2^i$<(FD/FR) is true as expressed by Formula (2) described above.

For example, by multiplying both sides of Formula (2) described above by the full-scale voltage VFS of the D/A conversion section 80, Formula (3) below is obtained.

$$VFS \times 1/2^i<(FD/FR) \times VFS \quad (3)$$

"VFS×$1/2^i$," the left-hand side of Formula (3) described above, corresponds to the minimum resolution voltage of 1 LSB of the D/A conversion section 80. Formulas (2), (3) described above mean that "VFS×$1/2^i$" corresponding to the voltage of 1 LSB is made smaller than "(FD/FR)×VFS." As described above, if VFS×$1/2^i$<(FD/FR)×VFS is satisfied, in the case of changing the output voltage VQ of the D/A conversion section 80 by the step width of the voltage corresponding to 1 LSB as indicated by C2 in FIG. 11, the frequency drift of the oscillation frequency is prevented from exceeding the allowable frequency drift FD, and it becomes possible to suppress the occurrence of the frequency hopping.

In other words, the number of bits i as the resolution of the D/A conversion section 80 is set so that Formulas (2), (3) described above is true.

In this case, in order to ensure a sufficient margin taking a variety of variations such as a production tolerance into consideration, it is desirable to set the resolution of the D/A conversion section 80 so that "$1/2^i$" becomes sufficiently smaller than "(FD/FR)." Specifically, the resolution of the D/A conversion section 80 is set so that i is equal to or greater than, for example, 20 bits.

By adopting such a configuration, even in the case in which the allowable frequency drift in, for example, the predetermined period TP is in a range of several ppb as explained with reference to FIG. 8, Formulas (2), (3) described above become satisfied with enough margin. Therefore, it becomes possible to effectively suppress the occurrence of the communication error and so on caused by the frequency hopping.

Figure 15:
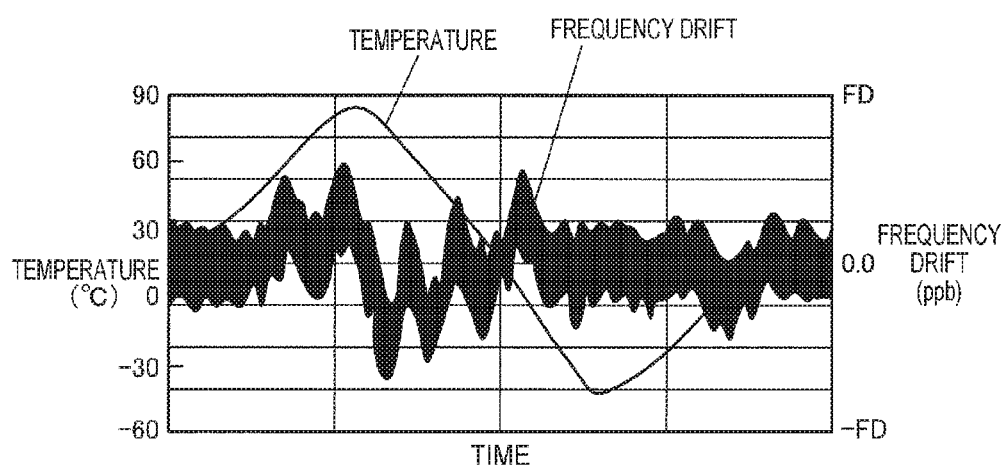
FIG. 15 is an explanatory diagram of an improvement of the frequency drift in the case of adopting the method of the embodiment.

For example, FIG. 15 is a diagram for explaining an improvement of the frequency drift in the case of adopting the method according to the present embodiment explained with reference to FIG. 11 through FIG. 13. As is obvious from the comparison between FIGS. 2 and 3 and FIG. 15, according to the method of the present embodiment, even in the case of using the circuit configuration such as the DTCXO, it is possible to make the frequency drift fall within substantially the same range as in the case of the ATCXO shown in FIG. 2.

Specifically, in the circuit device such as the related-art DTCXO, the frequency drift shown in FIG. 3 occurs to cause the communication error and so on.

In contrast, if the method according to the present embodiment is adopted, it is possible to make the frequency drift comparable with that of the ATCXO shown in FIG. 2 as shown in FIG. 15. Therefore, by adopting the circuit configuration such as the DTCXO, there is exerted a characteristic advantage that it is possible to suppress the frequency hopping to prevent the communication error and so on from occurring while achieving reduction of the chip size of the circuit device and an improvement of the frequency accuracy.

3.2 Spurious and C/N Characteristic of Oscillator

The spurious occurs due to the fluctuation (a bit change in the D/A conversion section 80 in a narrow sense) of the frequency control data DDS. Firstly, the characteristic of the spurious will be described. A main signal amplitude voltage of the oscillator 400 is denoted by Vo, and a main signal frequency (the oscillation frequency) of the oscillator 400 is denoted by f0. The phase noise (spurious) in the case in which the minimum bit changes little at a time in the D/A conversion section 80 to cause the phase fluctuation with respect to Vo and f0 fulfills Formulas (4) through (10) below.

Each of the formulas will specifically be described. In the case of denoting the frequency of the phase fluctuation by fs, fs corresponds to the output frequency of the frequency control data DDS. As shown in FIG. 4, in the case in which the oscillation signal generation circuit 140 includes the D/A conversion section 80 and the oscillation circuit 150, fs as the output frequency of the frequency control data DDS is the sampling frequency (1/TDAC) of the D/A conversion section 80, and Δf as the variation of the oscillation frequency is the variation of the oscillation frequency in single D/A conversion.

Since the minimum frequency resolution value becomes Δf, in the case of denoting the amplitude of the phase fluctuation by ϕs, it results that ϕs fluctuates with the frequency variation of 0, +Δf, or −Δf with intervals of the sampling frequency fs. Since it is conceivable that the frequency fluctuation occurs with the amplitude of ±Δf, ϕs is expressed by Formula (4) below.

$$\phi s = 2\pi(\Delta f)t/2\pi(fs)t = \Delta f/fs \quad (4)$$

Using these parameters, the signal obtained by adding the phase fluctuation to the main signal can be expressed by Formula (5) below.

$$Vo(t) = Vo \cdot \sin\{2\pi(f0)t + \phi s \cdot \sin(2\pi(fs)t)\} \quad (5)$$

According to the sum-product formula of the trigonometric functions, Formula (5) described above can be modified as Formula (6) below.

$$Vo(t) = Vo\{\sin(2\pi(f0)t) \cdot \cos(\phi s \cdot \sin(2\pi(fs)t)) + \cos(2\pi(f0)t) \cdot \sin(\phi s \cdot \sin(2\pi(fs)t))\} \quad (6)$$

Further, by simplifying Formula (6) described above assuming that ϕs is sufficiently smaller than 1 in Formula (6), Formula (6) can be modified as Formula (7) below.

$$Vo(t) = Vo\{\sin(2\pi(f0)t) + \phi s \cdot \cos(2\pi(f0)t) \cdot \sin(2\pi(fs)t)\} \quad (7)$$

Further, according to the product-sum formula of the trigonometric functions, Formula (7) described above can be modified as Formula (8) below.

$$Vo(t) = Vo \cdot \sin(2\pi(f0)t) + \frac{Vo \cdot \phi s}{2}\sin(2\pi(f0+fs)t) - \frac{Vo \cdot \phi s}{2}\sin(2\pi(f0-fs)t) \quad (8)$$

As is understood from Formula (8) described above, the signal component is observed as a sum of the first term as the main signal, and the second term and the third term located vertically symmetrically about the main signal frequency in the side band of the phase fluctuation component. The power ratio P_ratio(fs) between the main signal and the side band can be obtained as Formula (9) below using the amplitude levels thereof. Further, the strength L(fs) of the spurious with respect to the main signal is expressed as Formula (10) in the unit of dBc/Hz.

$$P\_ratio(fs) = \frac{\left(\frac{Vo \cdot \phi s}{2}\right)^2}{Vo^2} = \frac{\phi s^2}{4} = \frac{1}{4}\left(\frac{\Delta f}{fs}\right)^2 \quad (9)$$

$$L(fs) = 10 \cdot \log(P\_ratio(fs)) = 10 \cdot \log\left(\frac{1}{4}\left(\frac{\Delta f}{fs}\right)^2\right) \quad (10)$$

The curve D1 in FIG. 16 is a graph showing a general C/N characteristic (characteristic of the phase noise) of the oscillator 400. The horizontal axis of FIG. 16 represents the mistuned frequency with respect to the fundamental wave (the oscillation frequency) in logarithm, and the vertical axis represents the signal strength. As is understood from the curve D1, occurrence of the phase noise is inevitable in the oscillator 400, and the oscillator 400 is designed on the premise of the occurrence of the phase noise. Specifically, even in the case in which the spurious with the strength expressed by Formula (10) described above occurs, if the strength is lower compared to the phase noise inherent in the oscillator, the influence of the spurious in the circuit device 500 is sufficiently small, and the deterioration of the accuracy of the data obtained can be inhibited. In contrast, in the case in which the strength of the spurious is excessively high compared to the phase noise inherent in the oscillator as indicated by the circles D2, D3 in FIG. 16, the C/N characteristic of the oscillator 400 deteriorates due to the spurious, and the accuracy of the data obtained degrades. For example, it results that the accuracy deterioration of the position information obtained from the GPS reception signal incurred.

In the circuit device 500 according to the present embodiment, the variation of the frequency control data DDS is limited to a value equal to or smaller than k×LSB in order to inhibit the failure due to the frequency drift as described above. Therefore, although it is expected that the value of Δf is reduced to some extent, it is not assured that the deterioration of the C/N characteristic due to the spurious can be inhibited in the requirement described above. Therefore, it is necessary to regulate the relationship between Δf and fs so that the spurious has the strength in a range of being buried in the phase noise inherent in the oscillator in addition to the limitation of the variation of the frequency control data DDS to a value equal to or smaller than k×LSB.

Figure 17:
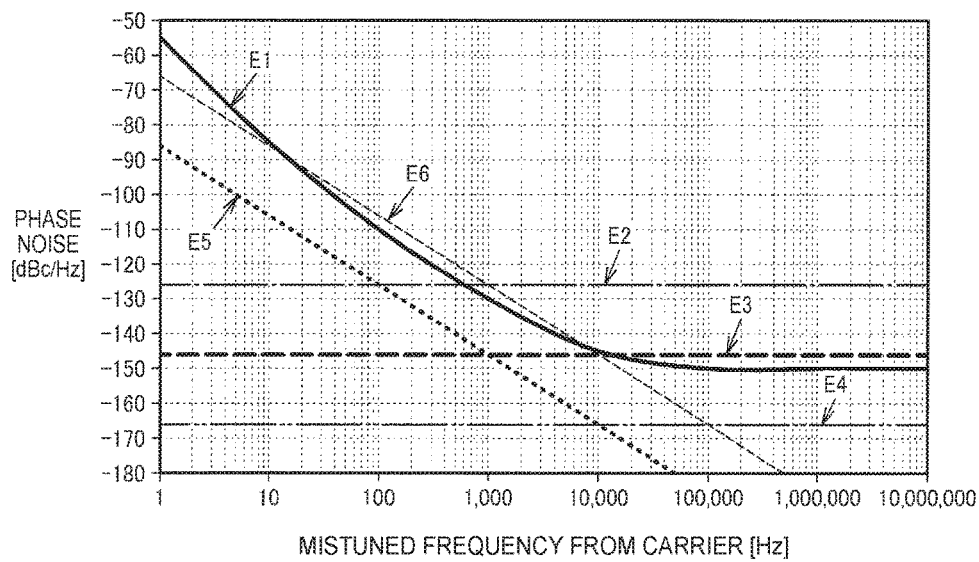
FIG. 17 is a diagram showing a characteristic example of the spurious corresponding to Δf and fs.

A specific example of the relationship will be described using FIG. 17. The curve E1 in FIG. 17 is substantially the same as the curve D1 in FIG. 16, and represents the general C/N characteristic of the quartz crystal resonator. The curve E1 represents the C/N characteristic of, for example, an AT-cut quartz crystal resonator, and corresponds to the case in which the characteristic of the Q-value (the C/N characteristic) is the worst of the request range. Therefore, since the actual circuit device 500 is designed so that no problem arises even if the phase noise with the strength represented by the curve E1 occurs as a result, if the strength of the spurious can be suppressed to the level buried in the curve E1, it becomes possible to inhibit the degradation of the data accuracy.

The line E2 in FIG. 17 represents the strength of the spurious in the case of $\Delta f/fs=1/10^6$, the line E3 represents the strength of the spurious in the case of $\Delta f/fs=1/10^7$, and the line E4 represents the strength of the spurious in the case of $\Delta f/fs=1/10^8$. Since the strength of the spurious is determined by $\Delta f/fs$ as shown in Formula (10) described above, in the case in which $\Delta f/fs$ takes a predetermined value, the strength of the spurious takes a constant value irrespective of the mistuned frequency, and is represented by a straight line parallel to the horizontal axis as in the cases of the lines E2 through E4. It should be noted that since the mistuned frequency of the spurious is fs, it is possible to regard the horizontal axis as representing the output frequency fs of the frequency control data DDS. This point applies to the lines E5, E6 described later.

Here, if $\Delta f/fs<1/10^8$ can be achieved, the strength of the spurious lowers to a level lower than the straight line indicated by E4, and can therefore be made lower than the phase noise inherent in the oscillator represented by the curve E1. In other words, in the circuit device 500 according to the present embodiment, it is sufficient to arrange that $\Delta f/fs<1/10^8$ is satisfied. However, in order to reduce $\Delta f/fs$, it is necessary to increase fs, or to decrease $\Delta f$. If fs is increased, the power consumption in the D/A conversion section 80 increases, and in order to decrease $\Delta f$, it is necessary to increase the resolution in the D/A conversion section 80 (to decrease the variation width of the frequency corresponding to the variation of 1 LSB). Therefore, under the condition that $\Delta f/fs$ is set to a value smaller than a predetermined value, there is established a trade-off relationship in which if $\Delta f$ is increased to suppress the demand for the resolution, it is necessary to increase fs to increase the conversion rate in the D/A conversion section 80, if fs is decreased to suppress the demand for the D/A conversion section 80, it is necessary to decrease $\Delta f$ to ensure a high resolution. Therefore, the requirement of fulfilling $\Delta f/fs<1/10^8$ is ideal, but can also be difficult to realize in some cases.

Therefore, in the present embodiment, it is also possible to use a laxer requirement compared to $\Delta f/fs<1/10^8$. For example, the D/A conversion section 80 according to the embodiment has the filter circuit 120 (or a filter circuit 130 described later) in the posterior stage of the D/A converter 100. By smoothing the output voltage of the D/A converter 100 using the filter circuit 120, the variation of the oscillation frequency can be reduced. In other words, actual $\Delta f$ can be reduced using the filter circuit 120.

For example, if the sampling frequency fs of the D/A converter 100 is set to a higher value, and the cutoff rate is set to about 1/100 using the filter circuit 120, it becomes possible to improve the strength of the spurious as much as about 1/100 (−40 dB or lower). In this case, even if $\Delta f/fs=1/10^6$ (E2) is true, since the strength of the spurious which has been improved by the filter circuit 120 is equal to or lower than E1, it is possible to realize the state in which the spurious is buried in the phase noise inherent in the oscillator. Therefore, even in the case of using the requirement of $\Delta f/fs<1/10^6$, it becomes possible to inhibit the degradation of the accuracy due to the deterioration of the C/N characteristic.

As described above, the circuit device 500 according to the embodiment includes the A/D conversion section 20 for performing the A/D conversion of the temperature detection voltage from the temperature sensor section 10 to output the temperature detection data DTD, the processing section 50 for performing the temperature compensation process of the oscillation frequency based on the temperature detection data DTD to output the frequency control data DDS of the oscillation frequency, and the oscillation signal generation circuit 140 for generating the oscillation signal with the oscillation frequency set by the frequency control data DDS using the frequency control data DDS from the processing section 50 and the resonator XTAL. Further, in order to inhibit the failure and so on due to the frequency hopping, the processing section 50 outputs the frequency control data DDS, which changes from the first data corresponding to the first temperature to the second data corresponding to the second temperature by k×LSB increments (k≥1), in the case in which the temperature has changed from the first temperature to the second temperature.

Further, in the present embodiment, in order to increase the accuracy of the data obtained using the oscillation signal, $\Delta f/fs<1/10^6$ is satisfied in the case in which the output frequency of the frequency control data DDS changing by k×LSB of the processing section 50 is denoted by fs, and the variation of the oscillation frequency due to the change by k×LSB of the frequency control data DDS is denoted by $\Delta f$.

If the frequency control data DDS changes by k×LSB increments, the magnitude of $\Delta f$ is also limited accordingly. For example, in the case in which the circuit device 500 includes the D/A converter 100, the variation width $\Delta$VDAC of the output voltage of the D/A converter 100 becomes the value corresponding to the variation width of the frequency control data DDS. The variable capacitance included in the oscillation circuit changes in capacitance value in accordance with the voltage, and the changing coefficient (C/V) is fixed. Further, the oscillation circuit 150 changes in oscillation frequency in accordance with the capacitance value of the variable capacitance, and the changing coefficient (f/C) is also fixed. Therefore, in this example, since the relationship of $\Delta f=\Delta VDAC\times(C/V)\times(f/C)$ is established, the variation $\Delta f$ of the oscillation frequency becomes the value corresponding to k×LSB, which is the variation width of the frequency control data DDS.

Therefore, although the $\Delta f$ is limited to a value equal to or lower than a predetermined value by satisfying a first requirement that the frequency control data DDS changes by k×LSB increments, in the present embodiment, there is further satisfied a second requirement that $\Delta f/fs<1/10^6$. By adopting this configuration, it becomes possible to inhibit the failure and so on due to the frequency hopping, and at the same time inhibit the accuracy degradation by the spurious.

It should be noted that the specific value of $\Delta f$, to which k×LSB of the frequency control data DDS corresponds, is determined in accordance with the value of k, the full-scale of the D/A converter 100, the characteristic of the variable capacitance, the characteristic of the oscillation circuit 150, and so on. Further, a specific value of $\Delta f$, which satisfies $\Delta f/fs<1/10^6$, is determined in accordance with the output frequency fs of the frequency control data DDS. Therefore, although it results that which one of the first requirement and the second requirement is severer differs depending on the situation, in any case, in the present embodiment, it is sufficient to adopt the configuration of satisfying the severer requirement.

Further, as described above, in order to inhibit the failure and so on due to the frequency hopping, the circuit device 500 according to the present embodiment satisfies DV<(FD/FR)×DFS in the case in which the frequency variable range of the oscillation frequency by the oscillation signal generation circuit 140 is denoted by FR, the allowable frequency drift in the predetermined period is denoted by FD, the full-scale value of the frequency control data DDS is denoted by DFS, and the variation of the frequency control data DDS in the output interval of the frequency control data DDS of the processing section 50 is denoted by DV.

By setting the variation DV of the frequency control data DDS so as to satisfy DV<(FD/FR)×DFS, the magnitude of $\Delta f$ is also limited. For example, in the case in which the circuit device 500 includes the D/A converter 100, the variation width $\Delta$VDAC of the output voltage of the D/A converter 100 becomes the value corresponding to the variation DV of the frequency control data DDS. The variable capacitance included in the oscillation circuit changes in capacitance value in accordance with the voltage, and the changing coefficient (C/V) is fixed. Further, the oscillation circuit 150 changes in oscillation frequency in accordance with the capacitance value of the variable capacitance, and the changing coefficient (f/C) is also fixed. Therefore, in this example, since the relationship of $\Delta f=\Delta$VDAC×(C/V)×(f/C) is established, the variation $\Delta f$ of the oscillation frequency becomes the value corresponding to the variation DV of the frequency control data DDS.

Therefore, although the $\Delta f$ is limited to a value equal to or lower than a predetermined value by satisfying a first requirement that the variation DV of the frequency control data DDS satisfies DV<(FD/FR)×DFS as a result, in the present embodiment, there is further satisfied the second requirement that $\Delta f/fs<1/10^6$ becomes true. By adopting this configuration, it becomes possible to inhibit the failure and so on due to the frequency hopping, and at the same time inhibit the accuracy degradation by the spurious.

It should be noted that the specific value of $\Delta f$, to which the variation DV of the frequency control data DDS corresponds, is determined in accordance with the full-scale of the D/A converter 100, the characteristic of the variable capacitance, the characteristic of the oscillation circuit 150, and so on. Further, a specific value of $\Delta f$, which satisfies $\Delta f/fs<1/10^6$, is determined in accordance with the output frequency fs of the frequency control data DDS. Therefore, although it results that which one of the first requirement and the second requirement is severer differs depending on the situation, in any case, in the present embodiment, it is sufficient to adopt the configuration of satisfying the severer requirement.

Further, the requirement of $\Delta f/fs<1/10^6$ is obtained from the viewpoint that the spurious is made to be buried in the phase noise inherent in the oscillator regardless of the value of the mistuned frequency (the output frequency fs of the frequency control data DDS). However, as is obvious from the curve E1 in FIG. 17, in the frequency band where the influence of the 1/f noise is significant, the lower the frequency is, the higher the phase noise inherent in the oscillator is. Therefore, in the band where the mistuned frequency is relatively low, even if the spurious higher in strength occurs, the spurious is buried in the phase noise of the oscillator 400 as a result, and has a small influence on the accuracy.

Therefore, the requirement that $\Delta f/fs<1/10^6$ is satisfied regardless of the mistuned frequency (fs) of the spurious is a sufficient condition from the viewpoint of inhibiting the accuracy deterioration of the data based on the oscillation signal, but can also be an excessively severe requirement.

Therefore, in the present embodiment, it is also possible to use a different requirement from $\Delta f/fs<1/10^6$. The lines E5, E6 in FIG. 17 each represent the characteristic of the spurious in the case of setting $\Delta f$ to a predetermined fixed value. As shown in FIG. 17, in the case in which the unit of the vertical axis is set to dBc/Hz, and the horizontal axis represents the mistuned frequency in logarithm, the spurious strength of the case in which $\Delta f$ is a fixed value is represented by a straight line decreasing monotonically. Further, an intercept of the straight line is changed by changing $\Delta f$, and the higher the value of $\Delta f$ is, the higher the spurious strength in the same mistuned frequency becomes. The line E5 in FIG. 17 represents the characteristic of the spurious in the case of $\Delta f=0.1$ mHz, and the line E6 represents the characteristic of the spurious in the case of $\Delta f=1$ mHz.

As is understood from FIG. 17, the line E5 with $\Delta f=0.1$ mHz is located below the curve E1 representing the C/N characteristic of the oscillator 400 irrespective of the position on the horizontal axis. Therefore, by satisfying $\Delta f<0.1$ mHz, the strength of the spurious can be made lower than the phase noise inherent in the oscillator. It should be noted that $\Delta f<0.1$ mHz is also an ideal requirement similarly to $\Delta f/fs<1/10^8$, and in reality, if a laxer requirement is used, the influence on the accuracy is small. Specifically, in the present embodiment, it is sufficient to use the straight line indicated by E6 as an upper limit, and to use $\Delta f<1$ mHz as the requirement.

It should be noted that the requirement of $\Delta f<1$ mHz also becomes the excessively severe requirement in the situation in which the mistuned frequency (fs) is relatively high. As is understood from Formula (10) described above, the higher the mistuned frequency fs is, the lower the strength of the spurious becomes. In other words, in the case in which fs is high, even if $\Delta f$ is high, the increase in strength of the spurious can be inhibited, and the influence on the accuracy is small. With the requirement of $\Delta f<1$ mHz, there is a possibility that the requirement becomes so severe that $\Delta f$ is made excessively low even in the case in which fs is high.

Therefore, in the present embodiment, it is also possible to switch between $\Delta f/fs<1/10^6$ and $\Delta f<1$ mHz in accordance with the situation. Specifically, it is sufficient to switch the requirements at fs=1 kHz, which corresponds to the intersection of the lines E2, E6 in FIG. 17, as a boundary. On the right side of the intersection, namely in the case of fs≥1 kHz, since the line E2 is located above the line E6, the requirement of the line E2 is laxer. In contrast, on the left side of the intersection, namely in the case of fs<1 kHz, since the line E6 is located above the line E2, the requirement of the line E6 is laxer. Therefore, in the present embodiment, it is sufficient to adopt the requirement of $\Delta f/fs<1/10^6$ in the case of fs≥1 kHz, and $\Delta f<1$ mHz in the case of fs<1 kHz. If this requirement is adopted, since the requirement to be fulfilled can be made laxer, the demand for the resolution of the D/A converter 100 can be lowered, for example, and it becomes easy to realize the circuit device 500.

Further, the method according to the present embodiment is not limited to one using $\Delta f/fs<1/10^6$ and $\Delta f<1$ mHz in combination with each other. For example, in the case in which the temperature has changed from the first temperature to the second temperature, the processing section 50 outputs the frequency control data DDS, which changes by k×LSB increments (k≥1) from the first data corresponding to the first temperature to the second data corresponding to the second temperature, and in the case in which the output frequency of the frequency control data DDS changing by k×LSB increments of the processing section 50 is denoted by fs, and the variation of the oscillation frequency due to the change by k×LSB increments of the frequency control data DDS is denoted by $\Delta f$, it is possible to satisfy $\Delta f<1$ mHz in the case of fs<1 kHz. Further, in the case in which the output frequency of the frequency control data DDS is denoted by fs, and the variation of the oscillation frequency due to the change with the variation DV of the frequency control data DDS is denoted by $\Delta f$, it is possible to satisfy $\Delta f<1$ mHz in the case of fs<1 kHz. On this occasion, it is also possible to adopt a requirement different from $\Delta f/fs<1/10^6$ in the case of fs≥1 kHz, or it is also possible to exclude the range of fs≥1 kHz from the application target of the method according to the present embodiment in the first place.

It should be noted that there can be cited a variety of design method of the circuit device in which $\Delta f$ and fs satisfy the requirements described above. For example, the conversion rate (the sampling frequency) required for the D/A conversion section 80 differs in accordance with the circuit device. It is conceivable that it is possible to set such a high sampling frequency as fs=100 kHz in a certain circuit device, but in a different circuit device, only such a low sampling frequency as fs=100 Hz is allowed from a viewpoint of power consumption or the like. In the circuit device in which fs=100 kHz is allowed, it is sufficient to use $\Delta f/fs<1/10^6$ as the requirement as described above, and $\Delta f<100$ mHz is obtained. In this case, since $\Delta f$ can be made higher compared to $\Delta f<1$ mHz, no problem arises if the resolution is relatively low. In contrast, in the circuit device in which fs=100 Hz is set, it is sufficient to use $\Delta f<1$ mHz as described above. In this case, although the demand for the resolution becomes relatively high, it becomes possible to, for example, realize the circuit device low in power consumption.

Here, the resonator XTAL according to the present embodiment is, for example, a quartz crystal resonator. It should be noted that it is known that the quartz crystal resonator differs in characteristic such as oscillation frequency by the cutting orientation with respect to the crystal axis. The quartz crystal resonator according to the present embodiment can also be an AT-cut resonator, an SC-cut (stress compensation cut) resonator, or an SAW resonator.

The AT-cut resonator is a resonator having the angle of 35.15° with respect to the crystal axis, and used in an SPXO, a TCXO, and a VCXO as an oscillation source in a range of 10 MHz through 500 MHz. Further, the SC-cut resonator is a resonator used for an OCXO as an oscillation source of 10 MHz through 100 MHz due to the feature that the temperature characteristic is minimized at high temperature. It should be noted that in the AT-cut resonator and the SC-cut resonator, the oscillation frequency is determined by the thickness-shear vibration. Further, the SAW resonator is a resonator obtained by putting the surface acoustic wave into practical use, and vibrates depending on electrode patterns on the quartz crystal surface. The SAW resonator is a resonator having an oscillation frequency as high as 100 MHz through 3.5 GHz, and a preferable C/N characteristic (high in Q-value).

Figure 18:
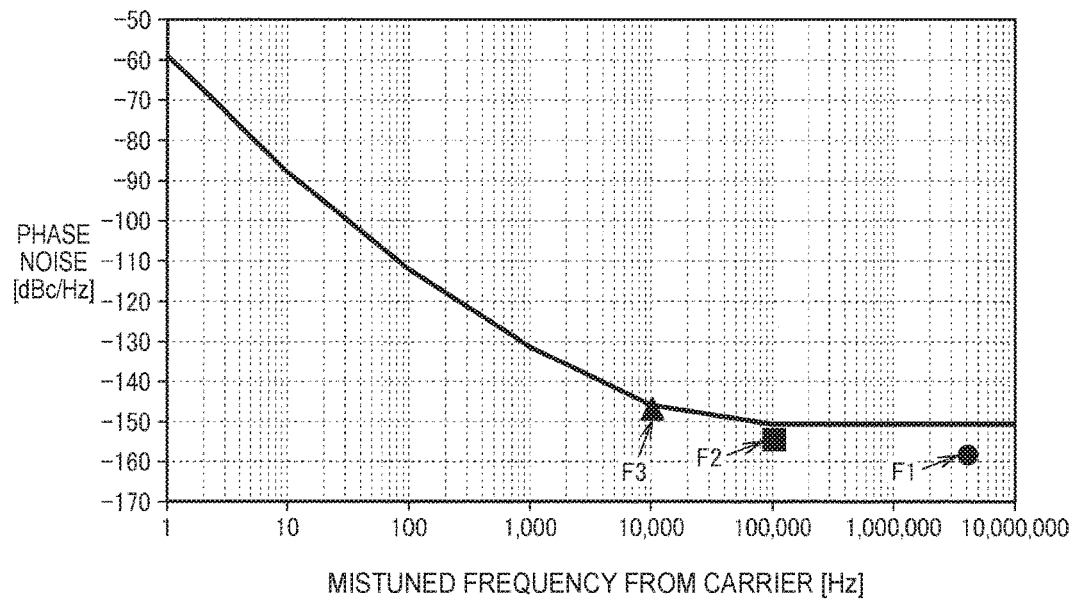
FIG. 18 is a diagram showing a setting example of Δf and fs not degrading the C/N characteristic.

It should be noted that $\Delta f/fs<1/10^6$ is a requirement related to the ratio between $\Delta f$ and fs. Therefore, there can be cited a plurality of pairs of $\Delta f$ and fs each satisfying $\Delta f/fs<1/10^6$. FIG. 18 shows some examples of the pair of values of $\Delta f$ and fs in the case in which the data high in accuracy can be obtained without deteriorating the C/N characteristic. The triangle F1 in FIG. 18 represents ($\Delta f$, fs)=(0.1 Hz, 4 MHz), the square F2 represents ($\Delta f$, fs)=(4 mHz, 100 kHz), and the circle F3 represents ($\Delta f$, fs)=(1 mHz, 10 kHz).

In the present embodiment, it is not precluded to limit the number of pairs of values of $\Delta f$ and fs to one. For example, either one of the symbols F1 through F3 is set alone as the pair of values of $\Delta f$ and fs, and in the circuit device 500, operations are performed so as to surely satisfy the values having been set. It should be noted that the method according to the present embodiment is not limited thereto, but the pair of values of $\Delta f$ and fs can also be made variable. For example, it is also possible to hold the three alternatives of the symbols F1 through F3 in advance as candidates of the pair of values of $\Delta f$ and fs, and then adopt either one of the three alternatives depending on the situation.

For example, the pair of values of $\Delta f$ and fs to be used are determined depending on whether or not a predetermined time period has elapsed from the start of the operation of the circuit device 500. Since the temperature compensation process has not ever been performed on the temperature detection data DTD at the start of the operation, a difference (hereinafter described as frequency error) between the oscillation frequency of the oscillation signal SSC to be output and the desired oscillation frequency is large in some cases. Although it is possible to obtain the frequency control data DDS for reducing (zeroing, in a narrow sense) the frequency error by the temperature compensation process in the processing section 50, in the present embodiment, there is a limitation of limiting an amount of each change of the oscillation frequency to $\Delta f$. Therefore, the frequency error may decrease by only $\Delta f$ during a single output of the frequency control data DDS, and there is a possibility that it takes long time before zeroing the frequency error.

Therefore, in the present embodiment, it is preferable that $\Delta f$ is set to a relatively large value, and at the same time, fs is also set to a relatively large value in order to satisfy $\Delta f/fs<1/10^6$ at the start of the operation. In the example of the symbols F1 through F3 described above, the pair ($\Delta f$, fs)=(0.1 Hz, 4 MHz) indicated by the symbol F1 is used. If this pair is used, since $\Delta f$ has a relatively large value, it becomes possible to approximate the oscillation frequency of the oscillation signal to the desired frequency in a short time with a frequency error of approximately zero.

It should be noted that it is necessary to set a large value to fs in order to set the large value to $\Delta f$, which leads to an increase in power consumption. Therefore, it is desirable to decrease $\Delta f$ and decrease fs when a certain amount of time has elapsed or the frequency error has decreased to some extent. In the example shown in FIG. 18, the pair of values of $\Delta f$ and fs to be used is changed from one indicated by the symbol F1 to ($\Delta f$, fs)=(4 mHz, 100 kHz) indicated by the symbol F2. Further, it is also possible to change the pair of values of $\Delta f$ and fs to be used from one indicated by the symbol F2 to ($\Delta f$, fs)=(1 mHz, 10 kHz) indicated by the symbol F3 when a time has further elapsed or the frequency error has further decreased.

Figure 19:
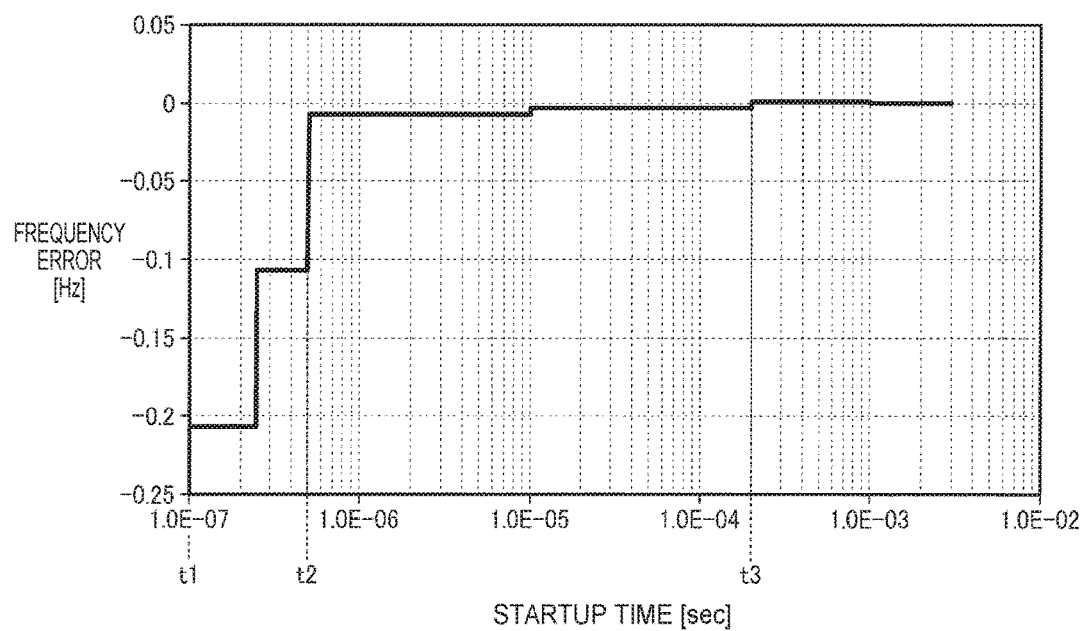
FIG. 19 is an explanatory diagram of a method of changing the setting of Δf and fs in a time-series manner.

FIG. 19 is a diagram for explaining the control described above. The vertical axis of FIG. 19 represents the frequency error (Hz), and the horizontal axis represents the elapsed time from the start of the operation (the time of startup) in logarithm. As indicated by t1 through t2 in FIG. 19, the circuit device 500 operates with the parameters represented by the symbol F1 in the predetermined time period from the time of startup. Since the sampling frequency fs is high, and the frequency variation $\Delta f$ of each change is also large, it becomes possible to approximate the frequency error, which has once been equal to or larger than 0.2 Hz at the time of startup, to 0 in a short time. Further, the circuit device 500 operates with the parameters indicated by the symbol F2 in the period of t2 through t3, and then operates with the parameters indicated by the symbol F3 in the period after t3.

By adopting the sequence described above, it becomes possible to realize the requirement of $\Delta f/fs<1/10^6$ using the parameters corresponding to the situations. Specifically, in the situation in which there is a possibility that the frequency error is large, the frequency is made to follow the target value at high speed, and at the same time, in the case in which the tracking in a certain level has been completed, the increase in power consumption is suppressed by decreasing fs.

It should be noted that although there is described here the example in which the three pairs of values of $\Delta f$ and fs exist, it is obvious that two pairs can be adopted, or four or more pairs can also be adopted. Further, it is sufficient for $\Delta f$ and fs to satisfy $\Delta f/fs<1/10^6$, and the specific numerical values are not limited to those indicated by the symbols F1 through F3 in FIG. 18. Further, although there is described the example of making $\Delta f$ and fs variable in the requirement of satisfying $\Delta f/fs<1/10^6$, it is also possible to make k variable in the requirement of changing the frequency control data DDS by k×LSB (k≥1).

Further, although there is described hereinabove the configuration in which the oscillation signal generation circuit 140 includes the D/A conversion section 80, the method according to the present embodiment is not limited to this configuration. For example, also in the case of using the oscillation signal generation circuit 140 having a configuration, which does not include the D/A conversion section 80, and will be described later using FIG. 39, it is possible to inhibit the deterioration of the C/N characteristic due to the spurious to thereby realize the accurate data acquisition and so on by satisfying such requirements as $\Delta f/fs<1/10^6$ and $\Delta f<1$ mHz. It should be noted that in the case in which the oscillation signal generation circuit 140 does not include the D/A conversion section 80, the filter circuit 120 (or a filter circuit 130, which is discussed below) is also not included, and there is a possibility that the reduction of the spurious by the filter circuit 120 is not performed. In such a case, it is also possible to make the requirements for $\Delta f$ and fs to satisfy severer compared to such requirements as $\Delta f/fs<1/10^6$ and $\Delta f<1$ mHz.

4. DETAILED CONFIGURATION EXAMPLE

4.1 Processing Section

Figure 20:
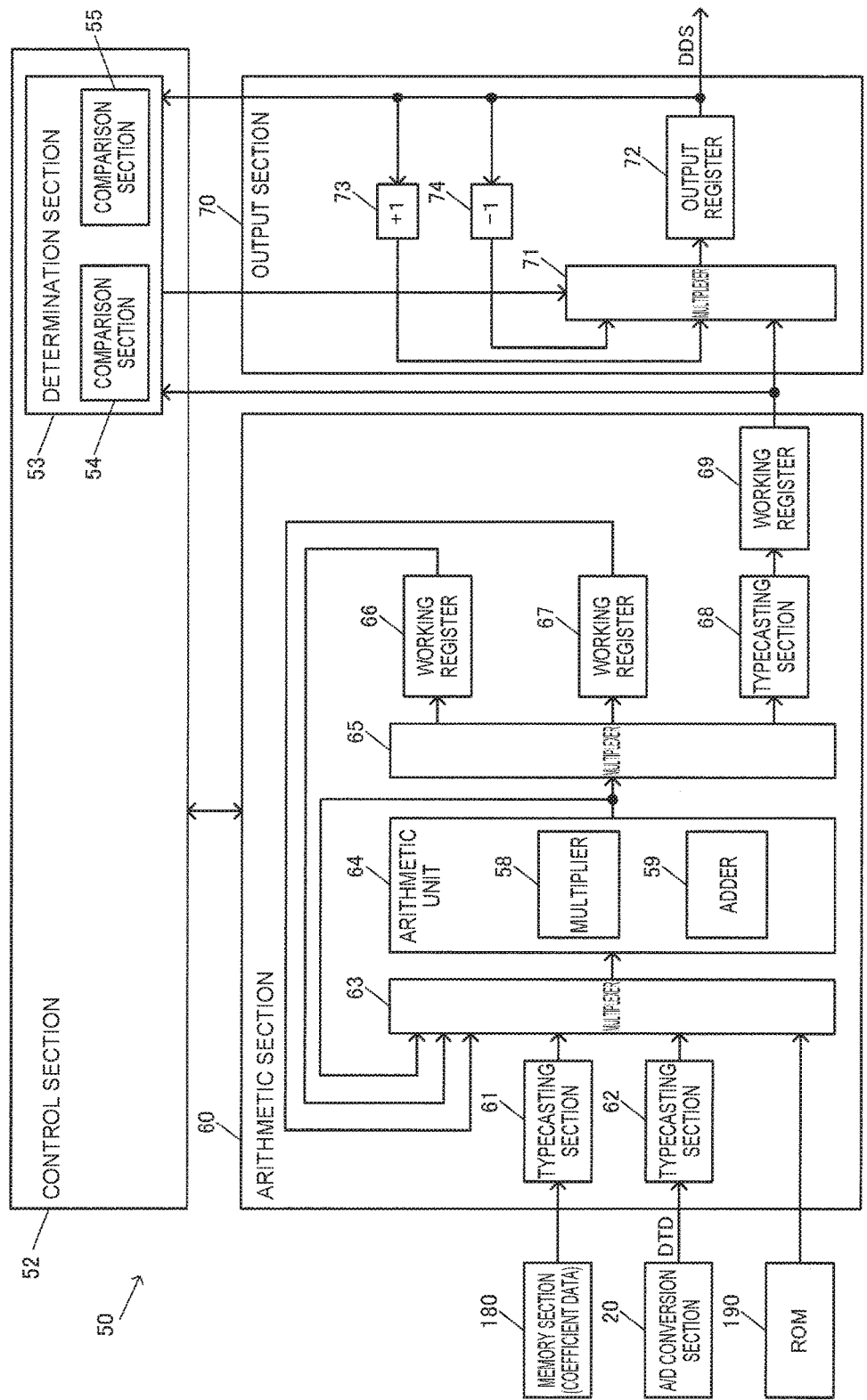
FIG. 20 is a detailed configuration example of a processing section.

Then, a detailed configuration example of the sections of the circuit device according to the present embodiment will be described. FIG. 20 is a diagram showing a detailed configuration example of the processing section 50.

As shown in FIG. 20, the processing section 50 (i.e., the DSP section) includes a control section 52, the arithmetic section 60, and the output section 70. The control section 52 performs the control of the arithmetic section 60 and the output section 70, and a variety of types of determination processing. The arithmetic section 60 performs an arithmetic operation of the temperature compensation process of the oscillation frequency based on the temperature detection data DTD from the A/D conversion section 20. The output section 70 receives operation result data from the arithmetic section 60 and outputs the frequency control data DDS.

The control section 52 includes a determination section 53. The determination section 53 has comparison sections 54, 55, and performs a variety of types of determination processing based on the comparison results in the comparison sections 54, 55.

The arithmetic section 60 includes typecasting sections 61, 62, and 68, multiplexers 63, 65, an arithmetic unit 64, and working registers 66, 67, and 69. The arithmetic unit 64 includes a multiplier 58 and an adder 59.

Coefficient data from the memory section 180 is input to the typecasting section 61, and the typecasting section 61 performs the typecast from the binary type (integer) to the floating-point type (single precision), and then outputs the coefficient data thus typecast to the multiplexer 63. In other words, the typecasting section 61 converts the integer value to a single precision floating-point. The temperature detection data DTD from the A/D conversion section 20 is input to the typecasting section 62, and the typecasting section 62 performs the typecast from the binary type to the floating-point type, and then outputs the temperature detection data DTD thus typecast to the multiplexer 63. For example, the typecasting section 62 typecasts (i.e., converts) the temperature detection data DTD as, for example, 15-bit binary data into 32-bit floating-point data (the exponent part: 8 bits, the mantissa part: 23 bits, and the sign: 1 bit). Further, constant data as a fixed value for the temperature compensation is input from a ROM 190 storing the constant data to the multiplexer 63.

The multiplexer 63 selects either one of output data of the arithmetic unit 64, output data of the working registers 66, 67, output data of the typecasting sections 61, 62, and output data of the ROM 190, and then outputs the result to the arithmetic unit 64. The arithmetic unit 64 performs arithmetic processing such as 32-bit floating-point product-sum operation with the multiplier 58 and the adder 59 to thereby perform the temperature compensation process. The multiplexer 65 selects either one of output data of the multiplier 58 of the arithmetic unit 64 and output data of the adder 59 of the arithmetic unit 64, and then outputs the result to either of the working registers 66, 67 and the typecasting section 68. The typecasting section 68 typecasts the operation result data of the arithmetic unit 64 from the floating-point type to the binary type. For example, the typecasting section 68 typecasts the 32-bit floating-point operation result data into the 20-bit binary operation result data. The operation result data thus typecast is held in the working register 69.

The arithmetic unit 64 of the arithmetic section 60 performs the temperature compensation process for approximating the temperature characteristic curve shown in FIG. 6 by, for example, a quintic approximation function (polynomial) as shown in Formula (11) below.

$$Vcp = b \cdot (T-T0)^5 + c \cdot (T-T0)^4 + d \cdot (T-T0)^3 + e \cdot (T-T0) \tag{11}$$

In Formula (11) described above, T corresponds to the temperature represented by the temperature detection data DTD, and T0 corresponds to a reference temperature (e.g., 25° C.). The characters b, c, d, and e are coefficients of the approximation function, and the data of the coefficients is stored in the memory section 180. The arithmetic unit 64 executes the arithmetic processing such as the product-sum operation of Formula (11) described above.

The output section 70 includes a multiplexer 71, an output register 72, an LSB adder 73, and an LSB subtractor 74. The multiplexer 71 selects either one of the operation result data as the output data of the arithmetic section 60, output data of the LSB adder 73, and output data of the LSB subtractor 74, and then outputs the result to the output register 72. The determination section 53 of the control section 52 monitors the output data of the working register 69 and the output data of the output register 72. Then the determination section 53 performs a variety of comparative determinations using the comparison sections 54, 55, and controls the multiplexer 71 based on the determination result.

In the present embodiment, as shown in FIG. 21 and FIG. 22, the output section 70 outputs the frequency control data DDS, which changes from the first data DAT1 corresponding to the first temperature to the second data DAT2 corresponding to the second temperature by k×LSB increments, in the case in which the temperature has changed from the first temperature to the second temperature. For example, if k=1, the output section 70 outputs the frequency control data DDS by 1 LSB increments.

For example, the output register 72 stores the first data DAT1, which is the operation result data of the arithmetic section 60 in the previous operation (n−$1^{th}$ timing). The working register 69 stores the second data DAT2, which is the operation result data of the arithmetic section 60 in the present operation ($n^{th}$ timing).

Further, as shown in FIG. 21, in the case in which the second data DAT2 as the operation result data of the present operation is larger than the first data DAT1 as the operation result of the previous operation, the output section 70 performs a process of adding 1 LSB (k×LSB in a broad sense) as the predetermined value to the first data DAT1 until the addition result data reaches the second data DAT2, and at the same time outputs the addition result data as the frequency control data DDS during the addition process.

In contrast, as shown in FIG. 22, in the case in which the second data DAT2 as the operation result data of the present operation is smaller than the first data DAT1 as the operation result of the previous operation, the output section 70 performs a process of subtracting 1 LSB (k×LSB) as the predetermined value from the first data DAT1 until the subtraction result data reaches the second data DAT2, and at the same time outputs the subtraction result data as the frequency control data DDS during the subtraction process.

Specifically, the determination section 53 of the control section 52 compares the first data DAT1 stored in the output register 72 and the second data DAT2 stored in the working register 69 with each other. The determination of the comparison is performed by the comparison section 54.

Then, in the case in which the second data DAT2 is larger than the first data DAT1 as shown in FIG. 21, the process of adding 1 LSB to the first data DAT1 of the output register 72 is performed by the LSB adder 73, and the output data of the LSB adder 73 is selected by the multiplexer 71. Thus, the addition result data, which is obtained by sequentially adding 1 LSB to the first data DAT1 as shown in FIG. 21, is held in the output register 72. Then, it becomes that the addition result data, which is updated by sequentially adding 1 LSB, is output as the frequency control data DDS. Then, the addition process described above is repeated until the addition result data reaches the second data DAT2. The comparison process for determining matching between the addition result data and the second data DAT2 is performed by the comparison section 55.

In contrast, in the case in which the second data DAT2 is smaller than the first data DAT1 as shown in FIG. 22, the process of subtracting 1 LSB from the first data DAT1 of the output register 72 is performed by the LSB subtractor 74, and the output data of the LSB subtractor 74 is selected by the multiplexer 71. Thus, the subtraction result data, which is obtained by sequentially subtracting 1 LSB from the first data DAT1 as shown in FIG. 22, is held in the output register 72. Then, it becomes that the subtraction result data, which is updated by sequentially subtracting 1 LSB, is output as the frequency control data DDS. Then, the subtraction process described above is repeated until the subtraction result data reaches the second data DAT2.

It should be noted that the maximum number of times of the addition process or the subtraction process by the LSB adder 73 or the LSB subtractor 74 is set to a predetermined number (e.g., 8 times). Further, for example, the maximum temperature change of the environmental temperature can be regulated (e.g., 2.8° C./10 sec). Therefore, there is adopted the configuration in which the temperature change (e.g., the temperature change corresponding to the voltage of 1 LSB×8 times) corresponding to, for example, 1 LSB multiplied by the predetermined number of times sufficiently exceeds the maximum temperature change described above.

Further, as is described with reference to FIG. 11, the output rate (1/TDAC) of the frequency control data DDS of the processing section 50 is higher than the output rate (1/TAD) of the temperature detection data DTD of the A/D conversion section 20. Therefore, for example, in FIG. 11, in the period TAD from when the temperature detection data DTD2 is input from the A/D conversion section 20 to the processing section 50, to when the next temperature detection data DTD3 is input, the process of adding or subtracting 1 LSB a predetermined times as shown in FIG. 21 and FIG. 22 can be performed. For example, the addition process and the subtraction process can be executed a predetermined times (e.g., 8 times), which is the maximum number of times described above.

As described above, according to the processing section 50 having the configuration shown in FIG. 20, it becomes possible to output the frequency control data DDS, which changes, for example, from the first data DAT1 corresponding to the first temperature (the first temperature detection data DTD1) to the second data DAT2 corresponding to the second temperature (the second temperature detection data DTD2) by k×LSB increments as shown in FIG. 21 and FIG. 22. Thus, it becomes possible to realize the method according to the present embodiment described with reference to FIG. 11 through FIG. 13 with the output control of the frequency control data DDS of the processing section 50.

Further, in the present embodiment, for example, the process of the arithmetic section 60 is realized with the highly accurate arithmetic processing such as 32 bits. Therefore, for example, when typecasting the 32-bit floating-point operation result data in the typecasting section 68, the 20-bit binary frequency control data DDS (the operation result data) can be obtained based on the 23-bit mantissa part, the accuracy of which is maintained. Thus, as described with reference to FIG. 5, it becomes possible to input the i=20-bit frequency control data DDS from the processing section 50 to the D/A conversion section 80. Further, the modulation circuit 90 modulates the n=16-bit data of the frequency control data DDS based on the m=4-bit data out of the i=20-bit data, and then the D/A conversion section 100 performs the D/A conversion on the n=16-bit data thus modulated, and thus, it becomes possible to realize the D/A conversion with the i=20-bit resolution.

4.2 D/A Conversion Section

Figure 23:
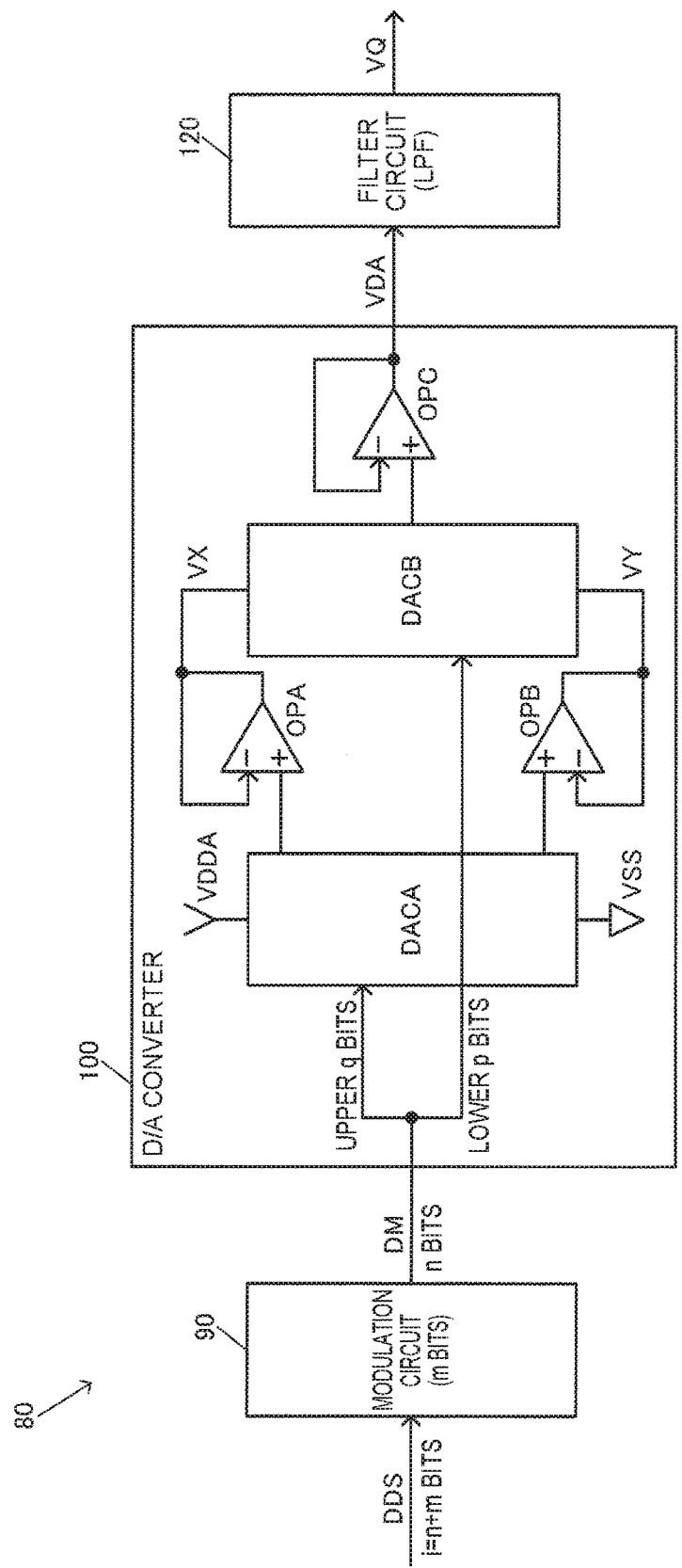
FIG. 23 is a diagram showing a detailed example configuration of a D/A conversion section.
Figure 24:
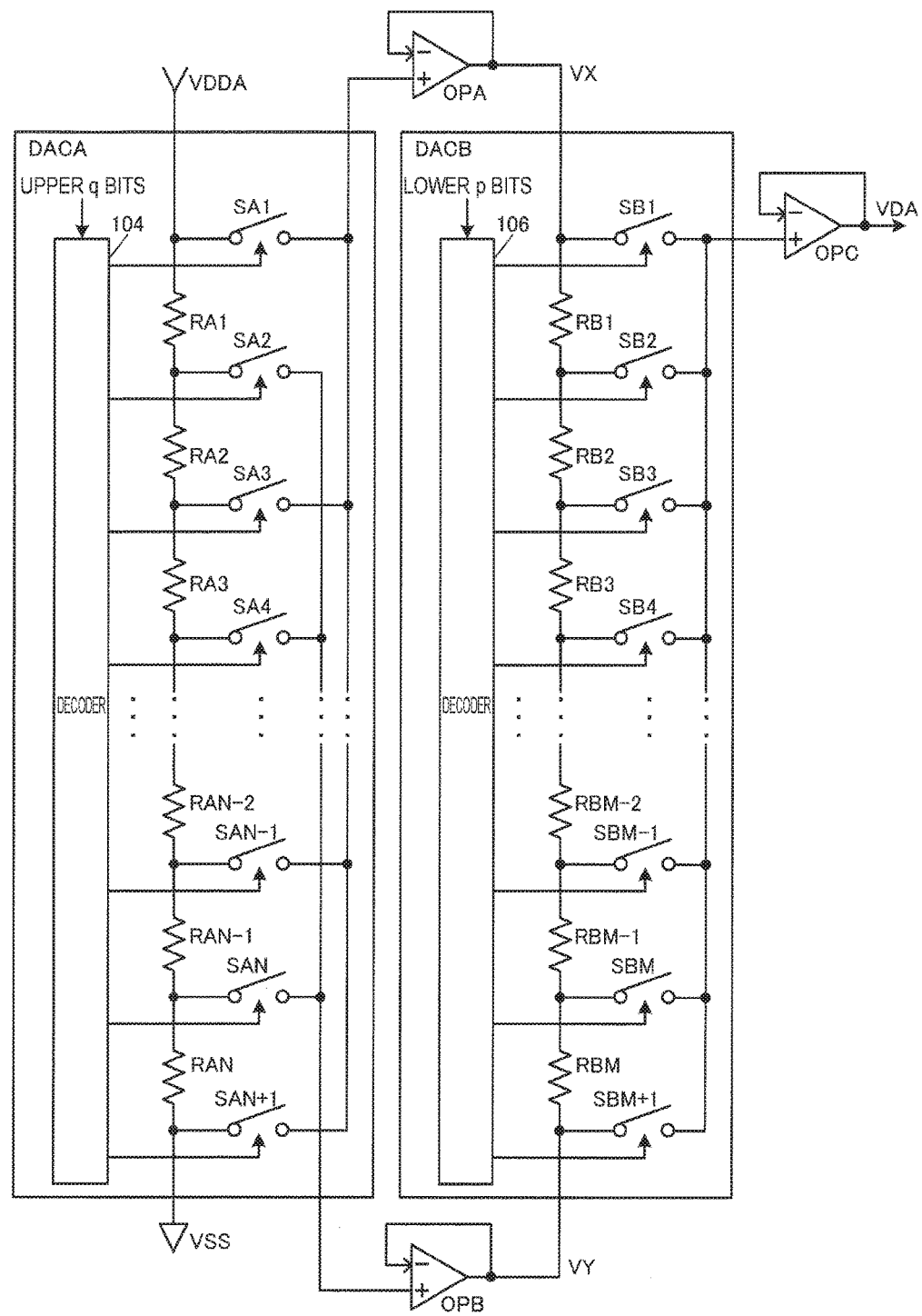
FIG. 24 is a diagram showing a further detailed example configuration of the D/A conversion section.

FIG. 23 and FIG. 24 are diagrams showing a detailed example configuration of the D/A conversion section 80. The D/A conversion section 80 includes the modulation circuit 90, the D/A converter 100, and the filter circuit 120.

As shown in FIG. 23, the D/A converter 100 includes an upper-side D/A converter DACA, a lower-side D/A converter DACB, and operational amplifiers OPA, OPB, and OPC. Each of the operational amplifiers is connected as a voltage follower.

Upper q-bit data out of the n-bit data DM (n=q+p) from the modulation circuit 90 is input to the upper-side D/A converter DACA, and lower p-bit data is input to the lower-side D/A converter DACB. For example, p=q=8. The upper-side D/A converter DACA and the lower-side D/A converter DACB are each a resistor-string type D/A converter, which selects a voltage corresponding to the input data out of a plurality of divided voltages, which are voltage-divided by, for example, a plurality of resistors connected in series to each other.

As shown in FIG. 24, the upper-side D/A converter DACA includes a plurality of resistors RA1 through RAN connected in series to each other between a node of a higher-potential side power supply voltage VDDA and a node of a lower-potential side power supply voltage VSS. Further, the upper-side D/A converter DACA includes a plurality of switch elements SA1 through SAN+1 respectively connected in one end to voltage division nodes of these resistors RA1 through RAN, and a decoder 104 (a switch control circuit) for generating switch control signals for setting the switch elements SA1 through SAN+1 to an ON state or an OFF state based on the upper q-bit data of the data DM.

Further, the upper-side D/A converter DACA outputs one of the divided voltages at the both ends of the resistor specified by the upper q-bit data out of the plurality of resistors RA1 through RAN to a non-inverting input terminal of the operational amplifier OPA, and outputs the other of the divided voltages to a non-inverting input terminal of the operational amplifier OPB. Thus, one of the voltages is converted in impedance by the operational amplifier OPA connected as a voltage follower, and is supplied to the lower-side D/A converter DACB as a voltage VX. Further, the other of the voltages is converted in impedance by the operational amplifier OPB connected as a voltage follower, and is supplied to the lower-side D/A converter DACB as a voltage VY.

For example, in the case in which the resistor RA1 is specified by the upper q-bit data, the higher-potential side divided voltage out of the divided voltages at the both ends of the resistor RA1 is supplied as the voltage VX via the switch element SA1 set to the ON state and the operational amplifier OPA. Further, the lower-potential side divided voltage is supplied as the voltage VY via the switch element SA2 set to the ON state and the operational amplifier OPB. Further, in the case in which the resistor RA2 is specified by the upper q-bit data, the lower-potential side divided voltage out of the divided voltages at the both ends of the resistor RA2 is supplied as the voltage VX via the switch element SA3 set to the ON state and the operational amplifier OPA. Further, the higher-potential side divided voltage is supplied as the voltage VY via the switch element SA2 set to the ON state and the operational amplifier OPB.

The lower-side D/A converter DACB includes a plurality of resistors RB1 through RBM connected in series to each other between a node of the voltage VX and a node of the voltage VY. Further, the lower-side D/A converter DACB includes a plurality of switch elements SB1 through SBM+1 respectively connected in one end to voltage division nodes of these resistors RB1 through RBM, and a decoder 106 (a switch control circuit) for generating switch control signals for setting the switch elements SB1 through SBM+1 to the ON state or the OFF state based on the lower p-bit data of the data DM.

Further, the lower-side D/A converter DACB outputs one divided voltage selected by the lower p-bit data out of the plurality of divided voltages by the resistors RB1 through RBM as a selected voltage to a non-inverting input terminal of the operational amplifier OPC connected as a voltage follower via the switch element set to the ON state. Thus, the selected voltage may be output as the output voltage VDA of the D/A converter 100.

Figure 25:
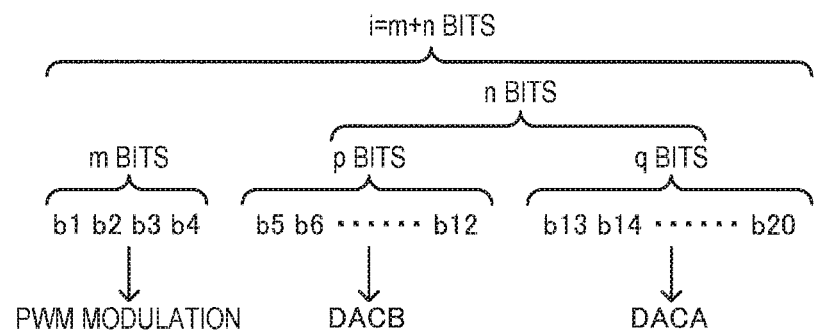
FIG. 25 is an explanatory diagram of PWM.
Figure 26:
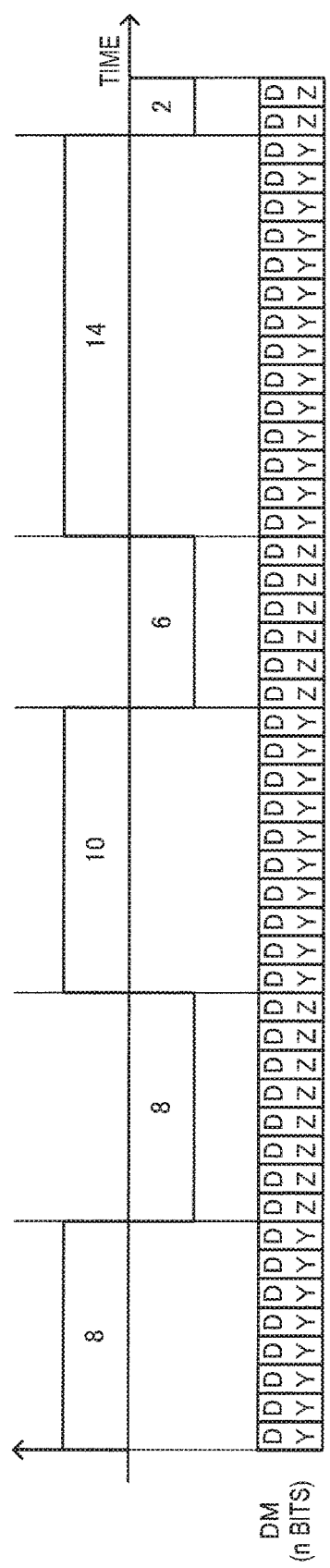
FIG. 26 is an explanatory diagram of the PWM.
Figures 27, 28:
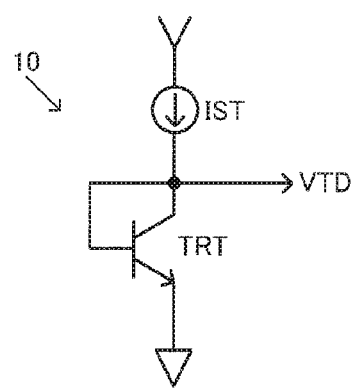
FIG. 27 is an explanatory diagram of the PWM.
FIG. 28 is a detailed configuration example of a temperature sensor section.

FIG. 25, FIG. 26, and FIG. 27 are explanatory diagrams of the modulation circuit 90. As shown in FIG. 25, the modulation circuit 90 receives the i=(n+m)-bit frequency control data DDS from the processing section 50. Then, the modulation circuit 90 performs PWM of the upper n-bit (bits b5 through b20) data of the frequency control data DDS based on the lower m-bit data (bits b1 through b4) of the frequency control data DDS. Then, as explained with reference to FIG. 23 and FIG. 24, the upper q-bit data (bits b13 through b20) out of the n-bit data is input to the upper-side D/A converter DACA, and the lower p-bit data (bits b5 through b12) is input to the lower-side D/A converter DACB.

FIG. 26 is an explanatory diagram of a first method of PWM. DY, DZ are the upper n-bit data of the data DM, and the data in which DY=DZ+1 is true in the n-bit expression.

In the case in which the duty ratio represented by the lower m=4-bit data used for the PWM is, for example, 8 to 8, as shown in FIG. 26, the eight 16-bit data DY and the eight 16-bit data DZ are output from the modulation circuit 90 to the D/A converter 100 in a time-division manner.

Further, in the case in which the duty ratio represented by the lower m-bit data is 10 to 6, the ten data DY and the six data DZ are output from the modulation circuit to the D/A converter 100 in a time-division manner. Similarly, in the case in which the duty ratio represented by the lower m=4-bit data is 14 to 2, the fourteen data DY and the two data DZ are output in a time-division manner.

FIG. 27 is an explanatory diagram of a second method of the PWM. In the case in which each of the m=4 bits b4, b3, b2, and b1 used for the PWM is in the logical level "1," the output pattern associated with each of the bits, which is shown on the right side of each of the bits, is selected.

For example, in the case of b4=1 and b3=b2=b1=0, only the output pattern associated with the bit b4 is output in the periods P1 through P16. Specifically, n=16-bit data are output from the modulation circuit 90 to the D/A converter 100 in the order of DZ, DY, DZ, DY, . . . in a time-division manner. Thus, the number of times the data DY is output and the number of times the data DZ is output are both 8 times and, thus, substantially the same PWM is realized as in the case in which the duty ratio is 8 to 8 in FIG. 26.

Further, in the case of b4=b2=1 and b3=b1=0, the output patterns respectively associated with the bits b4, b2 are output in the periods P1 through P16. Thus, the number of times the data DY is output is 10 times and the number of times the data DZ is output is 6 times, and, thus, substantially the same PWM is realized as in the case in which the duty ratio is 10 to 6. Similarly, in the case of b4=b3=b2=1 and b1=0, the number of times the data DY is output is 14 times and the number of times the data DZ is output is 2 times, and, thus, substantially the same PWM is realized as in the case in which the duty ratio is 14 to 2.

As described above, according to the modulation circuit 90 shown in FIG. 5 and FIG. 23, the PWM can be realized simply by controlling the number of times the data DY is output, the number of times the data DZ is output, and so on, and it becomes possible to realize the resolution of the D/A conversion equal to or higher than, for example, 20 bits while using the D/A converter 100 with the resolution of, for example, equal to or higher than 20 bits.

For example, in the resistor string type D/A conversion and the resistor ladder type D/A conversion low in noise, the resolution of about 16 bits is the practical limit. In this regard, according to the configuration shown in FIG. 5 and FIG. 23, only by providing the modulation circuit 90 small in circuit scale and the filter circuit 120, the resolution of the D/A conversion can be improved to a level equal to or higher than 20 bits. Therefore, it becomes possible to increase the resolution of the D/A conversion section 80 while keeping an increase in the circuit scale to the minimum. Further, by increasing the resolution of the D/A conversion section 80, an increase in accuracy of the oscillation frequency can be realized, and it becomes possible to realize the provision of the oscillator suitable for inhibition of the frequency hopping and the time synchronization.

4.3 Temperature Sensor Section, Oscillation Circuit

Figure 30:
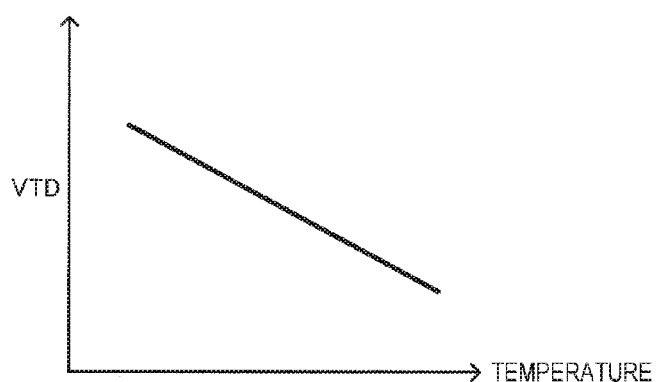
FIG. 30 is an explanatory diagram of the temperature sensor section.

FIG. 28 shows a first example configuration of the temperature sensor section 10. The temperature sensor section 10 shown in FIG. 28 has a current source IST, and a bipolar transistor TRT having a collector supplied with a current from the current source IST. The bipolar transistor TRT has a diode connection in which the collector and the base are connected to each other, and the temperature detection voltage VTD having a temperature characteristic is output to a node of the collector of the bipolar transistor TRT. The temperature characteristic of the temperature detection voltage VTD is caused by the temperature dependency of the base-emitter voltage of the bipolar transistor TRT. As shown in FIG. 30, the temperature detection voltage VTD has a negative temperature characteristic (a first-order temperature characteristic having a negative gradient).

Figure 29:
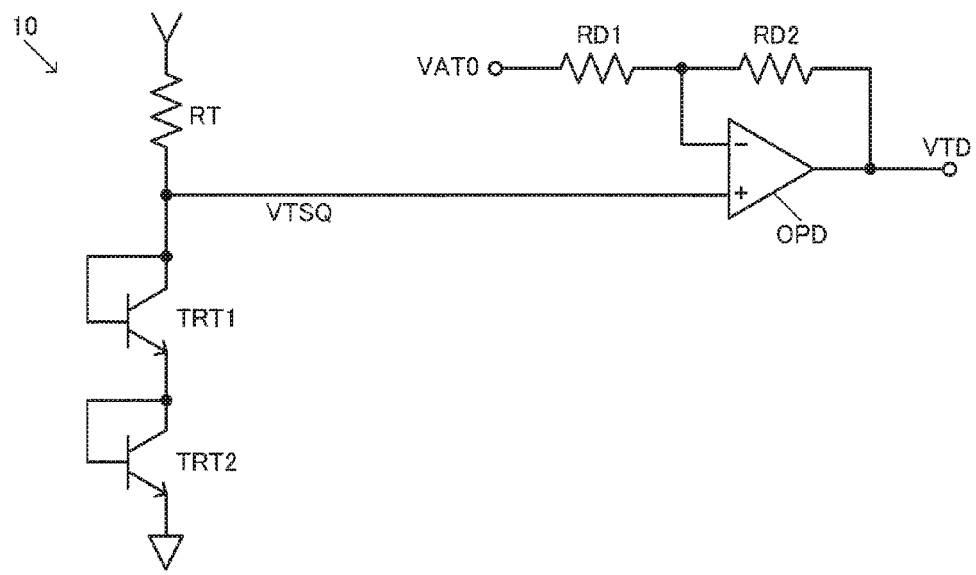
FIG. 29 is a detailed configuration example of the temperature sensor section.

FIG. 29 shows a second example configuration of the temperature sensor section 10. In FIG. 29, the current source IST shown in FIG. 28 is realized using a resistor RT. Further, one end of the resistor RT is connected to a node of the power supply voltage, and the other end is connected to the collector of a bipolar transistor TRT1. Further, the emitter of the bipolar transistor TRT1 is connected to the collector of the bipolar transistor TRT2. Further, the bipolar transistors TRT1, TRT2 are both connected as diodes. The voltage VTSQ output to the node of the collector of the bipolar transistor TRT1 has a negative temperature characteristic (a first-order temperature characteristic having a negative gradient) as shown in FIG. 30.

Further, in the temperature sensor section 10 shown in FIG. 29, there are further provided an operational amplifier OPD and resistors RD1, RD2. To the non-inverting input terminal of the operational amplifier OPD, there is input the voltage VTSQ, and to the inverting input terminal, there are connected one end of the resistor RD1 and one end of the resistor RD2. Further, the other end of the resistor RD1 is supplied with a reference temperature voltage VTA0, and the other end of the resistor RD2 is connected to the output terminal of the operational amplifier OPD.

The operational amplifier OPD and the resistors RD1, RD2 constitute an amplifier for normally amplifying the voltage VTSQ with reference to the reference temperature voltage VAT0. Thus, the temperature detection voltage VTD=VAT0+(1+RD2/RD1)×(VTSQ−VAT0) becomes to be output from the temperature sensor section 10. Further, by adjusting the reference temperature voltage VAT0, the adjustment of the reference temperature T0 becomes possible.

Figure 31:
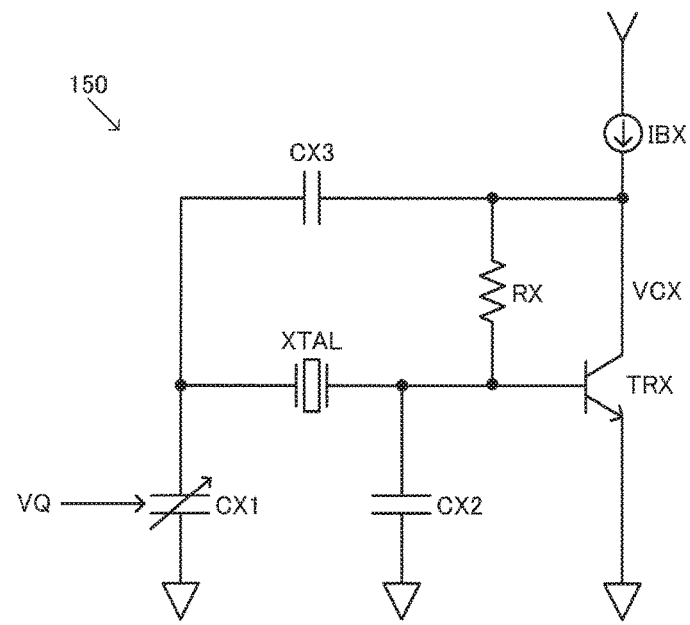
FIG. 31 is a diagram showing an example configuration example of an oscillation circuit.

FIG. 31 shows a configuration example of the oscillation circuit 150. The oscillation circuit 150 has a current source IBX, a bipolar transistor TRX, a resistor RX, a variable-capacitance capacitor CX1, capacitors CX2, CX3.

The current source IBX supplies the collector of the bipolar transistor TRX with a bias current. The resistor RX is disposed between the collector and the base of the bipolar transistor TRX.

One end of the variable-capacitance capacitor CX1, the capacitance of which is variable, is connected to one end of the resonator XTAL. Specifically, the one end of the variable-capacitance capacitor CX1 is connected to the one end of the resonator XTAL via the first resonator terminal (the resonator pad) of the circuit device. One end of the capacitor CX2 is connected to the other end of the resonator XTAL. Specifically, the one end of the capacitor CX2 is connected to the other end of the resonator XTAL via the second resonator terminal (the resonator pad) of the circuit device. One end of the capacitor CX3 is connected to the one end of the resonator XTAL, and the other end of the capacitor CX3 is connected to the collector of the bipolar transistor TRX.

The base-emitter current caused by the oscillation of the resonator XTAL flows through the bipolar transistor TRX. Further, when the base-emitter current increases, the collector-emitter current of the bipolar transistor TRX increases, and the bias current branched from the current source IBX to the resistor RX decreases. Therefore, the collector voltage VCX is lowered. In contrast, when the base-emitter current of the bipolar transistor TRX decreases, the collector-emitter current decreases, and the bias current branched from the current source IBX to the resistor RX increases, and therefore, the collector voltage VCX is raised. The collector voltage VCX is fed back to the resonator XTAL via the capacitor CX3.

The oscillation frequency of the resonator XTAL has a temperature characteristic (e.g., the temperature characteristic shown in FIG. 6), and the temperature characteristic is compensated by the output voltage VQ (the frequency control voltage) of the D/A conversion section 80. Specifically, the output voltage VQ is input to the variable-capacitance capacitor CX1, and thus, the capacitance value of the variable-capacitance capacitor CX1 is controlled by the output voltage VQ. When the capacitance value of the variable-capacitance capacitor CX1 changes, the resonance frequency of the oscillation loop changes, and therefore, the variation of the oscillation frequency due to the temperature characteristic of the resonator XTAL is compensated. The variable-capacitance capacitor CX1 is realized by, for example, a variable-capacitance diode (varactor) or the like.

It should be noted that the oscillation circuit 150 according to the present embodiment is not limited to the configuration shown in FIG. 31, but a variety of practical modifications can be adopted. For example, in FIG. 31, the case of using the variable-capacitance capacitor as the capacitor CX1 is explained as an example. However, it is also possible to use the variable-capacitance capacitor controlled by the output voltage VQ as the capacitor CX2 or the capacitor CX3. Further, it is also possible to use the variable-capacitance capacitors controlled by the voltage VQ as two or more of the capacitors CX1 through CX3.

5. MODIFIED EXAMPLES

Then, a variety of modified examples of the present embodiment will be described. For example, there is hereinabove described the case in which the processing section 50 outputs the frequency control data DDS changing by k×LSB increments as shown in FIG. 21 and FIG. 22 to thereby realize the method according to the present embodiment shown in FIG. 11 through FIG. 13. However, the present embodiment is not limited thereto.

Figure 32:
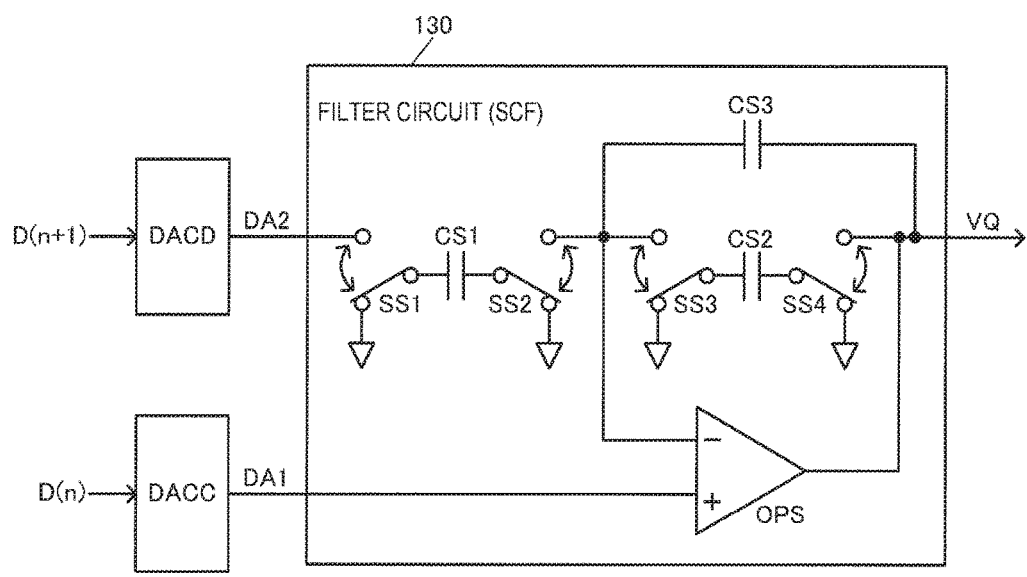
FIG. 32 is an explanatory diagram of a modified example of the embodiment.

In the modified example shown in FIG. 32, in the posterior stage of the D/A converters DACC, DACD, there is disposed a filter circuit 130 formed of a switched capacitor filter (SCF). For example, the 8-bit D/A converter DACC outputs the voltage DA1 based on the data D(n) with the timing n. Further, the 8-bit D/A converter DACD outputs the voltage DA2 based on the data D(n+1) with the timing n+1.

In the case of representing the clock frequency of the SCF of the filter circuit 130 by fck, a resistor of RG=1/(CS1×fck) is realized by the circuit constituted by a capacitor CS1 and switch elements SS1, SS2. A resistor of RF=1/(CS2×fck) is realized by the circuit constituted by a capacitor CS2 and switch elements SS3, SS4.

Further, the time constant τ of the filter circuit 130 is expressed as Formula (12) below.

$$\tau = RF \times CS3 = (CS3/CS2) \times (1/fck) \tag{12}$$

Figure 34:
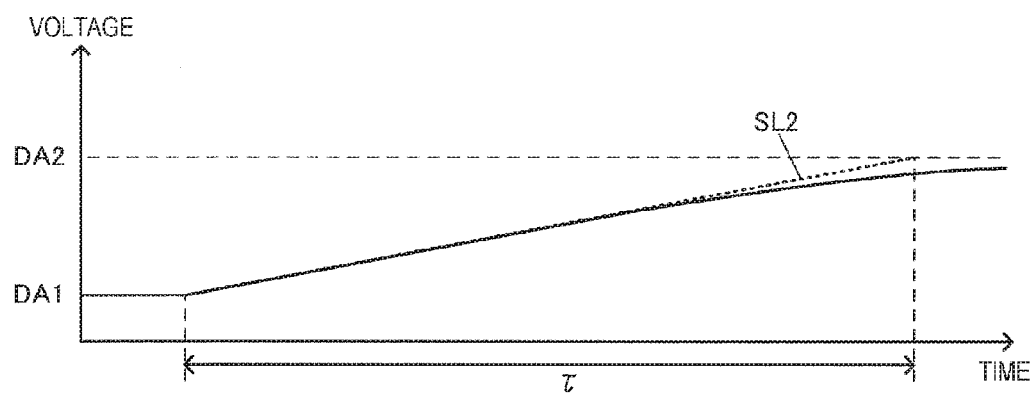
FIG. 34 is an explanatory diagram of the modified example of the embodiment.

For example, by setting CS3=5 pF, CS2=0.1 pF, and fck=5 kHz, τ=10 msec can be realized. By sufficiently elongating the time constant τ as described above, the output voltage VQ slowly changing with the time constant τ from the voltage DA1 to the voltage DA2 can be realized as shown in FIG. 34.

Figure 33:
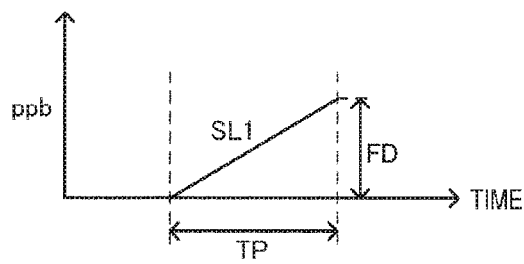
FIG. 33 is an explanatory diagram of the modified example of the embodiment.

For example, as shown in FIG. 33, the tilt in the case in which the period TP (e.g., 20 msec) explained with reference to FIG. 8 is represented by the horizontal axis, and the allowable frequency drift FD (e.g., in a range of several ppb) is represented by the vertical axis is denoted by SL1=FD/TP. In this case, by making the tilt SL2 realized by the time constant τ shown in FIG. 34 smaller compared to the tilt SL1, the method according to the present embodiment shown in FIG. 11 through FIG. 13 can be realized. Specifically, the filter circuit 130 having such a strong low-pass filter characteristic in which the tilt SL1 defined by the period TP and the allowable frequency drift FD cannot be formed is disposed in the posterior stage of the D/A converters DACC, DACD. Thus, as indicated by C2 in FIG. 11, a voltage waveform equivalent to the voltage waveform of the output voltage VQ of the D/A conversion section 80 that changes with the step width of the voltage corresponding to 1 LSB may be realized, and it becomes possible to solve the problem of the frequency hopping.

It should be noted that if the time constant τ of the filter circuit 130 becomes longer than the period TP, it becomes unachievable to completely correct the variation of the temperature characteristic of the resonator XTAL with the output voltage VQ of the filter circuit 130, and there arises the problem that the frequency deviates.

Figure 35:
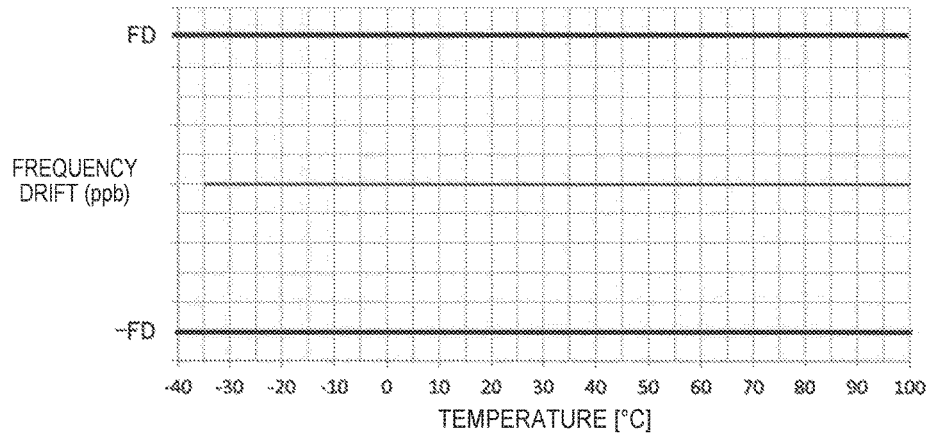
FIG. 35 is a diagram showing the frequency drift in the modified example.
Figure 36:
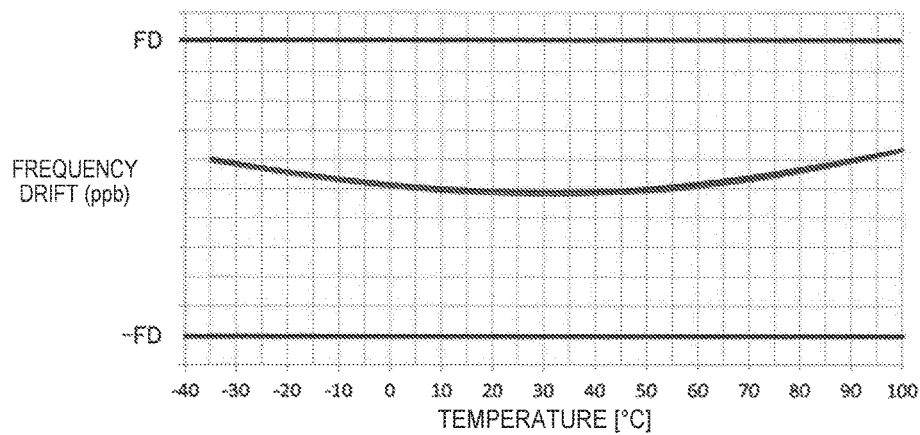
FIG. 36 is a diagram showing the frequency drift in the modified example.
Figure 37:
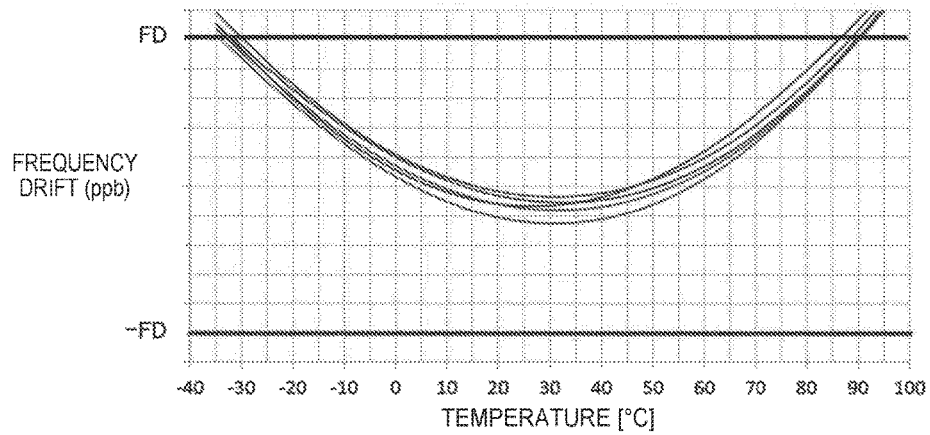
FIG. 37 is a diagram showing the frequency drift in the modified example.

For example, FIG. 35 is a diagram showing the frequency drift with respect to the temperature change in the case in which the time constant τ=TP=20 msec. As shown in FIG. 35, by setting τ=TP, the problem of the frequency hopping can be solved. In contrast, FIG. 36 and FIG. 37 are diagrams showing the frequency drift with respect to the temperature change in the case in which the time constant τ=22 msec and τ=40 msec, respectively. As described above, in the modified example shown in FIG. 32, there is a disadvantage that if the time constant τ becomes long, there arises the problem that the characteristic of the frequency drift deteriorates, and it is difficult to obtain the optimum solution.

Figure 38:
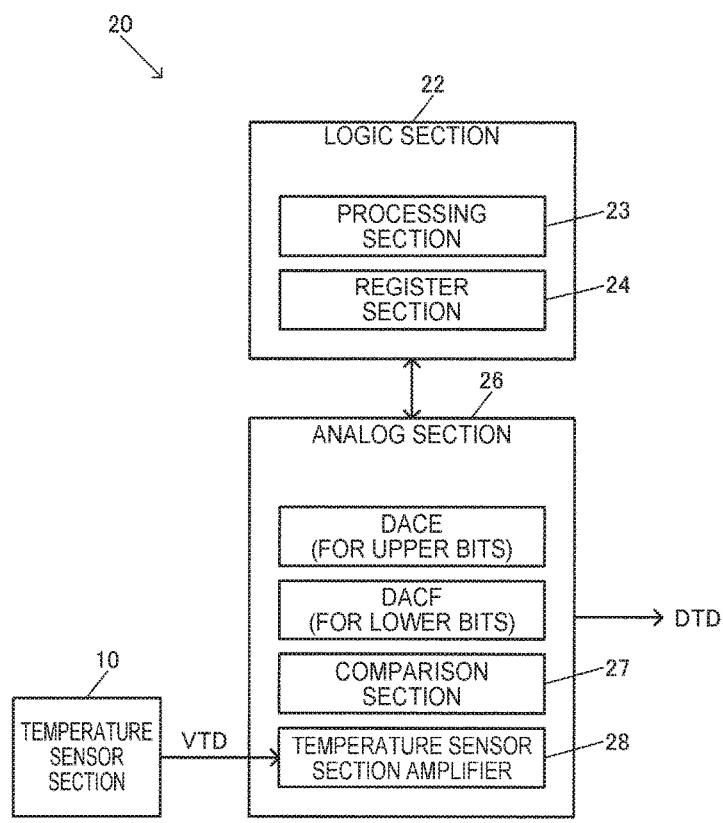
FIG. 38 is a diagram showing a detailed configuration example of an A/D conversion section.

FIG. 38 shows a configuration example of the A/D conversion section 20. As shown in FIG. 38, the A/D conversion section 20 includes a processing section 23, a register section 24, D/A converters DACE, DACF, and a comparison section 27. Further, the A/D conversion section 20 can also include a temperature sensor section amplifier 28. The processing section 23 and the register section 24 are disposed as a logic section 22, and the D/A converters DACE, DACF, the comparison section 27, and the temperature sensor section amplifier 28 are disposed as an analog section 26.

The register section 24 stores a result data such as an interim result or a final result of the A/D conversion. The register section 24 corresponds to, for example, a successive approximation result register in the successive approximation. The D/A converters DACE, DACF perform the D/A conversion on the result data in the register section 24. As these D/A converters DACE, DACF, there can be adopted D/A converters having substantially the same configuration as shown in FIG. 23 and FIG. 24. The comparison section 27 performs the comparison between the output voltages of the D/A converters DACE, DACF and the temperature detection voltage VTD (the voltage amplified by the temperature sensor section amplifier 28). The comparison section 27 can be realized using, for example, a chopper comparator. The processing section 23 performs a determination process based on the comparison result of the comparison section 27, and then performs an update process of the result data in the register section 24. Then, the final temperature detection data DTD obtained by the update process is output from the A/D conversion section 20 as an A/D conversion result of the temperature detection voltage VTD. According to such a configuration, it is possible to realize the A/D conversion using, for example, the successive approximation, an A/D conversion using a method similar to the successive approximation, and so on. Further, the method according to the present embodiment explained with reference to FIG. 11 through FIG. 13 can also be realized by devising an output configuration of the temperature detection data DTD of the A/D conversion section 20 shown in FIG. 38.

Figure 39:
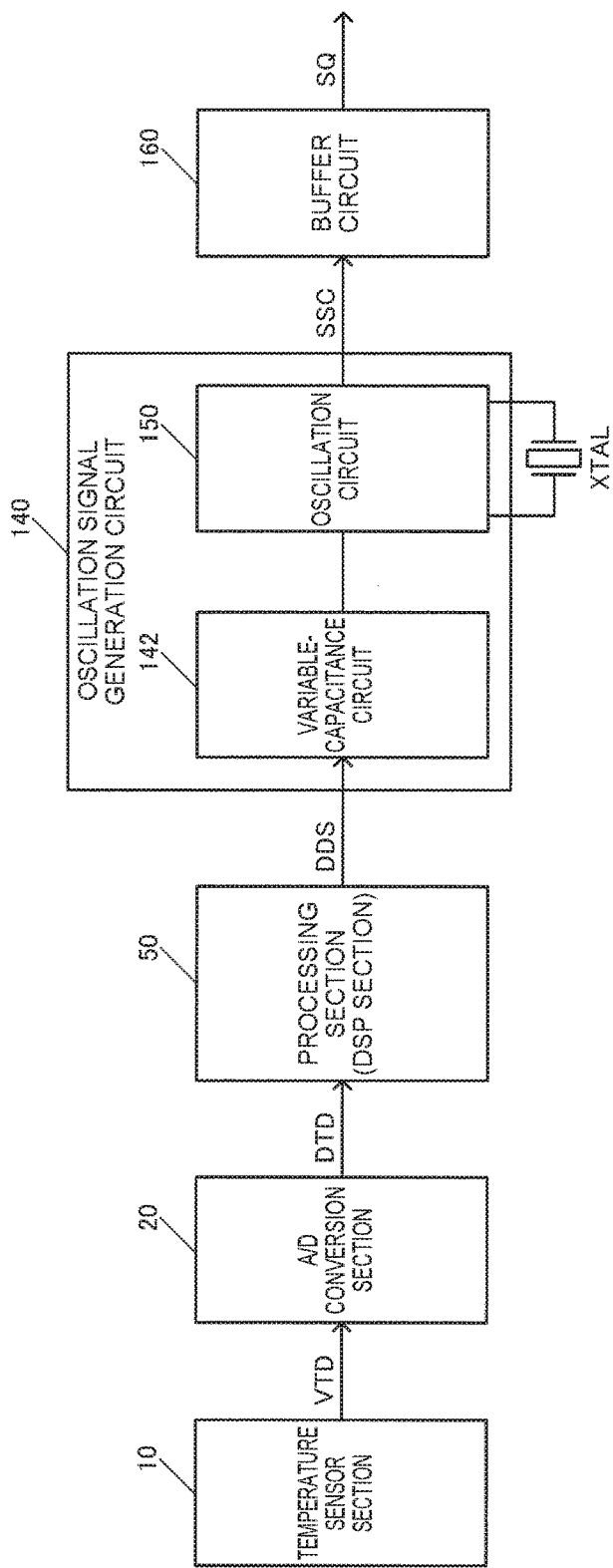
FIG. 39 is a diagram showing a configuration example of a circuit device according to a modified example of the embodiment.

FIG. 39 shows a configuration example of a circuit device according to the modified example of the present embodiment.

The circuit device shown in FIG. 39 includes the A/D conversion section 20 for performing the A/D conversion of the temperature detection voltage VTD from the temperature sensor section 10 to output the temperature detection data DTD, the processing section 50 for performing the temperature compensation process of the oscillation frequency based on the temperature detection data DTD to output the frequency control data DDS of the oscillation frequency, and the oscillation signal generation circuit 140.

Further, the processing section 50 outputs the frequency control data DDS, which changes from the first data corresponding to the first temperature to the second data corresponding to the second temperature by k×LSB increments, in the case in which the temperature has changed from the first temperature to the second temperature. Then, the oscillation signal generation circuit 140 generates the oscillation signal SSC with the oscillation frequency set by the frequency control data DDS using the frequency control data DDS from the processing section 50 and the resonator XTAL.

In other words, in FIG. 39, unlike FIG. 4 and FIG. 5, the oscillation signal generation circuit 140 is not provided with the D/A conversion section 80. Further, the oscillation frequency of the oscillation signal SSC generated by the oscillation signal generation circuit 140 is directly controlled based on the frequency control data DDs from the processing section 50. In other words, the oscillation frequency of the oscillation signal is controlled without intervention of the D/A conversion section.

For example, in FIG. 39, the oscillation signal generation circuit 140 has a variable-capacitance circuit 142 and the oscillation circuit 150. The oscillation signal generation circuit 140 is not provided with the D/A conversion section 80 shown in FIG. 4 and FIG. 5. Further, the variable-capacitance circuit 142 is provided instead of the variable-capacitance capacitor CX1 shown in FIG. 31, and one end of the variable-capacitance circuit 142 is connected to the one end of the resonator XTAL.

The capacitance value of the variable-capacitance circuit 142 is controlled based on the frequency control data DDS from the processing section 50. For example, the variable-capacitance circuit 142 has a plurality of capacitors (capacitor array), and a plurality of switch elements (switch array) each controlled to be set to the ON state or the OFF state based on the frequency control data DDS. The switch elements of the plurality of switch elements are electrically connected to the respective capacitors of the plurality of capacitors. Further, by setting the switch elements to the ON state or the OFF state, the number of capacitors, which are connected to the one end of the resonator XTAL out of the plurality of capacitors, varies. Thus, the capacitance value of the variable-capacitance circuit 142 is controlled, and thus, the capacitance value of the one end of the resonator XTAL changes. Therefore, the capacitance value of the variable-capacitance circuit 142 is directly controlled by the frequency control data DDS, and it becomes possible to control the oscillation frequency of the oscillation signal SSC.

As described above, the method according to the present embodiment for changing the frequency control data DDS in k×LSB increments as shown in FIG. 21, FIG. 22 can also be realized in the configuration not providing the D/A conversion section 80 to the oscillation signal generation circuit 140 as shown in FIG. 39. Further, by changing the frequency control data DDS in k×LSB increments, it becomes possible to realize substantially the same advantage as the method of the present embodiment explained with reference to FIG. 11 through FIG. 13, and it becomes possible to suppress the generation of the frequency hopping shown in FIG. 3 to thereby prevent communication error caused by the frequency hopping from occurring. It should be noted that also in the configuration shown in FIG. 39, it is possible to generate the oscillation signal SSC using a direct digital synthesizer system.

Further, in the configuration of the circuit device and so on shown in FIG. 39, in the method according to the present embodiment, Formula (13) below can be adopted as the formula corresponding to Formula (1) explained with reference to FIG. 12 and FIG. 13.

$$DV<(FD/FR)\times DFS \tag{13}$$

In other words, as described above, the frequency variable range of the oscillation frequency by the oscillation signal generation circuit 140 is denoted by FR, and the allowable frequency drift of the oscillation frequency in the predetermined period (TP) is denoted by FD. Further, the full-scale value of the frequency control data DDS is denoted by DFS. For example, in the case in which the number of bits of the frequency control data DDS is denoted by i, the full-scale value DFS can be expressed as, for example, $2^i$ (0 through $2^i$). It should be noted that the full-scale value DFS is not limited thereto. Further, the variation of the frequency control data DDS in the output interval of the frequency control data DDS of the processing section 50 is denoted by DV. The output interval corresponds to TDAC shown in FIG. 11. For example, in FIG. 21 and FIG. 22, the frequency control data DDS changes by k×LSB increments at the output interval. Further, in this case, in the present embodiment, DV<(FD/FR)×DFS is true as shown in Formula (13) described above.

For example, the processing section 50 changes the frequency control data DDS in the range of the full-scale value DFS to adjust the oscillation frequency of the oscillation signal generation circuit 140 in the frequency variable range FR shown in FIG. 13 to thereby realize the temperature compensation process of the oscillation frequency explained with reference to FIG. 6 and FIG. 7.

However, if the variation DV in the output interval (TDAC) of the frequency control data DDS increases to a level satisfying, for example, DV≥(FD/FR)×DFS, the frequency drift of the oscillation frequency exceeds the allowable frequency drift FD to cause the frequency hopping shown in FIG. 14.

In contrast, in the present embodiment, since the frequency control data DDS is changed by such a small variation DV that the relationship of DV<(FD/FR)×DFS is true, it becomes possible to suppress the occurrence of the frequency hopping shown in FIG. 14. For example, by changing the frequency control data DDS in k×LSB increments as shown in FIG. 21 and FIG. 22, it becomes possible to suppress the occurrence of the frequency hopping.

Further, also in Formula (13) described above, it is desirable that Formula (14) below is true similarly to Formula (2) described above.

$$1/2^i<(FD/FR) \tag{14}$$

In this case, the character i in Formula (14) described above is the number of bits of the frequency control data DDS. By the processing section 50 outputting the frequency control data DDS such a high number (=i) of bits that $1/2^i<(FD/FR)$ is true, it becomes possible to suppress the occurrence of the frequency hopping.

For example, by multiplying the both sides of Formula (14) by the full-scale value DFS of the frequency control data DDS, Formula (15) below is obtained.

$$DFS\times 1/2^i<(FD/FR)\times DFS \tag{15}$$

"DFS×1/2$^i$," the left-hand side of Formula (15), corresponds to 1 LSB of the frequency control data DDS. Formulas (14), (15) described above mean that "DFS×1/2$^i$" corresponding to 1 LSB is made smaller than "(FD/FR)× DFS." As described above, if DFS×1/2$^i$<(FD/FR)×DFS is satisfied, in the case of changing the frequency control data DDS by 1 LSB as shown in FIG. 21 and FIG. 22, the frequency drift of the oscillation frequency is prevented from exceeding the allowable frequency drift FD, and it becomes possible to suppress the occurrence of the frequency hopping.

6. OSCILLATOR, ELECTRONIC APPARATUS, AND MOVING OBJECT

Figure 40:
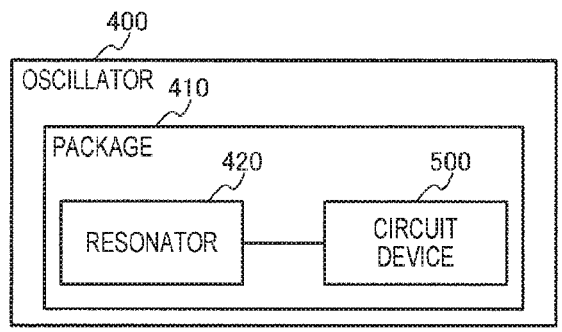
FIG. 40 is a diagram showing an example configuration of an oscillator.

FIG. 40 shows an example configuration of an oscillator 400 including the circuit device 500 according to the present embodiment. As shown in FIG. 40, the oscillator 400 includes a resonator 420 and the circuit device 500. The resonator 420 and the circuit device 500 are mounted in a package 410 of the oscillator 400. Further, terminals of the resonator 420 and terminals (pads) of the circuit device 500 (IC) are electrically connected respectively to each other with interconnections of the package 410.

Figure 41:
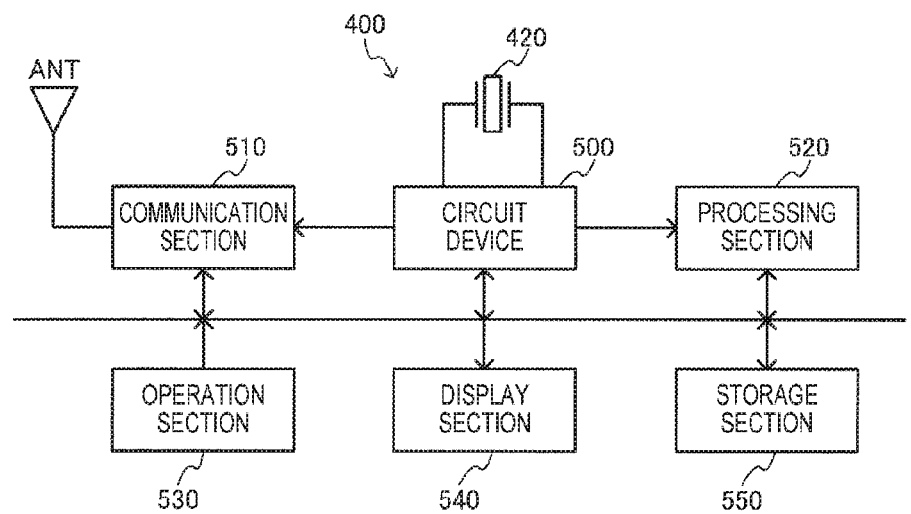
FIG. 41 is a diagram showing an example configuration of an electronic apparatus.

FIG. 41 shows a configuration example of an electronic apparatus including the circuit device 500 according to the present embodiment. The electronic apparatus includes the circuit device 500 according to the present embodiment, the resonator 420 such as a quartz crystal resonator, an antenna ATN, a communication section 510, and a processing section 520. Further, the electronic apparatus can include an operation section 530, a display section 540, and a storage section 550. The resonator 420 and the circuit device 500 constitute the oscillator 400. It should be noted that the electronic apparatus is not limited to the configuration of shown in FIG. 41, but a variety of practical modifications such as elimination of some of the constituents or addition of other constituents can be adopted.

As the electronic apparatus shown in FIG. 41, there can be assumed a variety of apparatuses such as a wearable apparatus such as a timepiece incorporating GPS, a biological information measurement apparatus (e.g., a sphygmograph or a pedometer), or a head-mounted display device, a portable information terminal (a mobile terminal) such as a smartphone, a cellular phone, a portable video game player, a laptop PC, or a tablet PC, a content supply terminal for delivering contents, a video apparatus such as a digital camera or a video camera, or a network-related apparatus such as abase station, or a router.

The communication section 510 (a wireless circuit) performs a process of receiving data externally via the antenna ATN and transmitting data to the outside. The processing section 520 performs a control process of the electronic apparatus, a variety of types of digital processing of the data transmitted or received via the communication section 510. The function of the processing section 520 can be realized by a processor such as a microcomputer.

The operation section 530 is for allowing the user to perform input operation, and can be realized by operation buttons, a touch panel display, and so on. The display section 540 is for displaying a variety of types of information, and can be realized by a display using a liquid crystal, an organic EL, and so on. It should be noted that if the touch panel display is used as the operation section 530, it results that the touch panel display also functions as the operation section 530 and the display section 540. The storage section 550 is for storing the data, and the function thereof can be realized by a semiconductor memory such as a RAM or a ROM, a hard disk drive (HDD), or the like.

Figure 42:
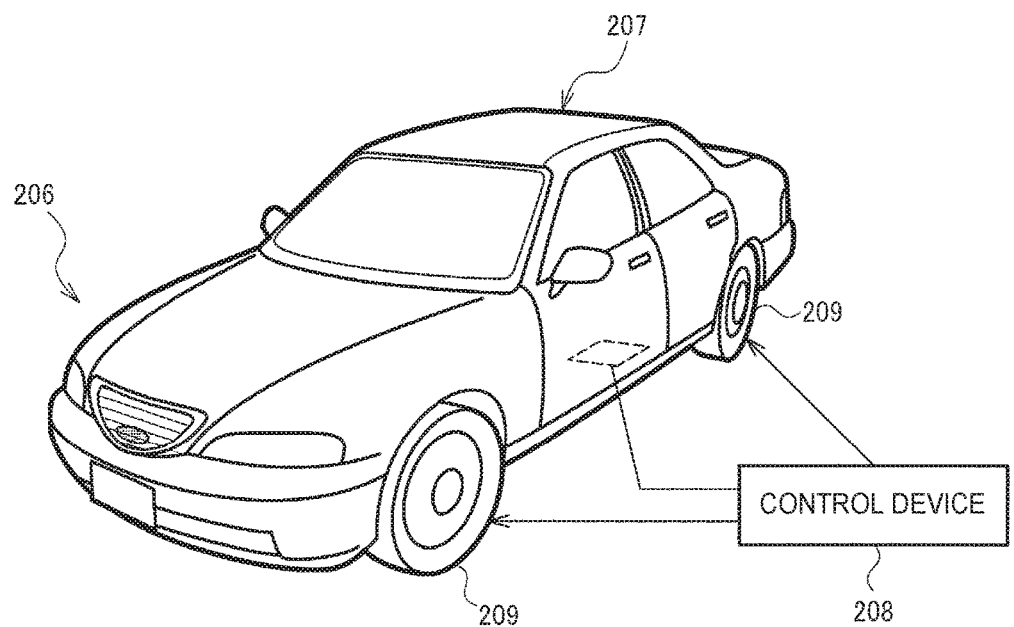
FIG. 42 is a diagram showing an example configuration of a moving object.

FIG. 42 shows an example of a moving object including the circuit device according to the present embodiment. The circuit device (an oscillator) according to the present embodiment can be incorporated in a variety of moving objects such as a vehicle, an airplane, a motorbike, a bicycle, a ship, or a boat. The moving object is equipment or a device, which is provided with a drive mechanism such as an engine or an electric motor, a steering mechanism such as a steering wheel or a helm, and a variety of electronic apparatuses (in-car apparatuses), and moves on the ground, in the air, or on the sea. FIG. 42 schematically shows a vehicle 206 as a specific example of the moving object. The vehicle 206 incorporates an oscillator (not shown) having the circuit device according to the present embodiment and a resonator. A control device 208 operates with the clock signal generated by the oscillator. The control device 208, for example, controls the stiffness of the suspension, and controls the brake of each of the wheels 209 in accordance with the attitude of a vehicle body 207. For example, it is also possible to realize automated driving of the vehicle 206 using the control device 208. It should be noted that the apparatus incorporating the circuit device or the oscillator according to the present embodiment is not limited to such a control device 208, but the circuit device or the oscillator according to the present embodiment can be incorporated in a variety of apparatuses provided to a moving object such as the vehicle 206.

It should be noted that although the present embodiment is hereinabove explained in detail, it should easily be understood by those skilled in the art that it is possible to make a variety of modifications not substantially departing from the novel matters and the advantage of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device, the oscillator, the electronic apparatus and the moving object, the D/A conversion method, the processing method of the frequency control date, the output method of the frequency control data of the processing section, the output method of the voltage of the D/A conversion section, the frequency control method of the resonator, and so on are also not limited to those described in the present embodiment, but a variety of practical modifications can be adopted.

This application claims priority to Japanese Patent Application No. 2015-211250 filed on Oct. 27, 2015, Japanese Patent Application No. 2016-099722 filed on May 18, 2016, Japanese Patent Application No. 2015-211251 filed on Oct. 27, 2015, and Japanese Patent Application No. 2016-099723 filed on May 18, 2016. The entire disclosures of Japanese Patent Application No. 2015-211250, Japanese Patent Application No. 2016-099722, Japanese Patent Application No. 2015-211251, and Japanese Patent Application No. 2016-099723 are hereby incorporated herein by reference.

What is claimed is:

1. A circuit device comprising:
   an A/D converter configured to convert a temperature detection voltage from a temperature sensor to temperature detection data;
   a processing circuit configured to execute a temperature compensation process on an oscillation frequency based on the temperature detection data and to output frequency control data of the oscillation frequency; and
   an oscillation signal generation circuit configured to generate an oscillation signal with the oscillation frequency set by the frequency control data from the processing circuit and a resonator,
   wherein in a case in which a temperature detected by the temperature sensor changes from a first temperature to a second temperature, the processing circuit changes the frequency control data from first data corresponding to the first temperature to second data corresponding to the second temperature in increments of k×LSB, where k is an integer greater than or equal to 1 and LSB is a least significant bit, and
   the oscillation frequency is controlled such that $\Delta f/fs < 1/10^6$, where fs is an output frequency of the frequency control data that changes in k×LSB increments, and $\Delta f$ is a variation of the oscillation frequency due to the change of the frequency control data in k×LSB increments.

2. The circuit device according to claim 1, wherein:
   in a case of fs≥1 kHz, $\Delta f/fs < 1/10^6$, and
   in a case of fs<1 kHz, $\Delta f < 1$ mHz.

3. A circuit device comprising:
an A/D converter configured to convert a temperature detection voltage from a temperature sensor to temperature detection data;
a processing circuit configured to execute a temperature compensation process on an oscillation frequency based on the temperature detection data and to output frequency control data of the oscillation frequency; and
an oscillation signal generation circuit configured to generate an oscillation signal with the oscillation frequency set by the frequency control data from the processing circuit and a resonator,
wherein in a case in which a temperature changes from a first temperature to a second temperature, the processing circuit changes the frequency control data from a first data corresponding to the first temperature to a second data corresponding to the second temperature in increments of k×LSB, where k is an integer greater than or equal to 1 and LSB is a least significant bit, and
the oscillation frequency is controlled such that $\Delta f<1$ mHz when fs<1 kHz, where fs is an output frequency of the frequency control data that changes in k×LSB increments, and $\Delta f$ is a variation of the oscillation frequency due to the change of the frequency control data in k×LSB increments.

4. A circuit device comprising:
an A/D converter configured to convert a temperature detection voltage from a temperature sensor to temperature detection data;
a processing circuit configured to execute a temperature compensation process on an oscillation frequency based on the temperature detection data and to output frequency control data of the oscillation frequency; and
an oscillation signal generation circuit configured to generate an oscillation signal with the oscillation frequency set by the frequency control data using the frequency control data from the processing circuit and a resonator, wherein the oscillation frequency is controlled such that DV<(FD/FR)×DFS, where FR is a frequency variable range of the oscillation frequency by the oscillation signal generation circuit, FD is an allowable frequency drift of the oscillation frequency in a predetermined period, DFS is a full-scale value of the frequency control data, and DV is a variation of the frequency control data.

5. The circuit device according to claim 4, wherein $\Delta f/fs<1/10^6$, where fs is an output frequency of the frequency control data of the processing circuit, and $\Delta f$ is a variation of the oscillation frequency due to the change with a variation DV of the frequency control data.

6. The circuit device according to claim 5, wherein:
in a case of fs≥1 kHz, $\Delta f/fs<1/10^6$, and
in a case of fs<1 kHz, $\Delta f<1$ mHz.

7. The circuit device according to claim 4, wherein $\Delta f<1$ mHz when fs<1 kHz, where fs is an output frequency of the frequency control data of the processing circuit, and $\Delta f$ is a variation of the oscillation frequency due to the change with a variation DV of the frequency control data.

8. The circuit device according to claim 1, wherein the resonator is a quartz crystal resonator.

9. The circuit device according to claim 8, wherein the quartz crystal resonator is one of an AT-cut resonator, an SC-cut resonator, or a surface acoustic wave resonator.

10. The circuit device according to claim 1, wherein:
the oscillation signal generation circuit includes:
a D/A converter configured to convert the frequency control data from the processing circuit, and
an oscillation circuit configured to generate the oscillation signal using an output voltage of the D/A converter and the resonator,
the output frequency fs of the frequency control data is a sampling frequency of the D/A converter, and
the variation $\Delta f$ of the oscillation frequency is a variation of the oscillation frequency in a single D/A conversion.

11. The circuit device according to claim 10, further comprising
a filter circuit that smoothes an output voltage of the D/A converter.

12. The circuit device according to claim 10, wherein:
a frequency control voltage as an output voltage of the D/A converter corresponding to the first temperature is defined as a first control voltage, and the frequency control voltage corresponding to the second temperature is defined as a second control voltage, and
the output voltage changing with a voltage width smaller than an absolute value of a difference voltage between the first control voltage and the second control voltage is output from the D/A converter to the oscillation circuit in a case in which the temperature changes from the first temperature to the second temperature.

13. The circuit device according to claim 12, wherein when a minimum resolution value in the digital to analog conversion is set as the LSB, the D/A converter outputs the output voltage changing with a step width of a voltage corresponding to k×LSB, where k≥1.

14. The circuit device according to claim 13, wherein k is equal to 1.

15. The circuit device according to claim 12, wherein
the A/D converter outputs first temperature detection data when the temperature is a first temperature and outputs second temperature detection data when the temperature is the second temperature,
the first control voltage is the frequency control voltage corresponding to the first temperature detection data in a temperature compensation characteristic of the temperature compensation process, and
the second control voltage is the frequency control voltage corresponding to the second temperature detection data in the temperature compensation characteristic of the temperature compensation process.

16. The circuit device according to claim 1, wherein the processing circuit:
compares the first data as operation result data of the temperature compensation process performed at a previous time and the second data as the operation result data of the temperature compensation process performed at a current time with each other,
outputs addition result data obtained by a process of adding a predetermined value to the first data as the frequency control data while performing the process of adding until the addition result data reaches the second data in a case in which the second data is higher than the first data, and
outputs subtraction result data obtained by a process of subtracting a predetermined value from the first data as the frequency control data while performing the process of subtracting until the subtraction result data reaches the second data in a case in which the second data is lower than the first data.

17. The circuit device according to claim 16, wherein the processing circuit includes:
an arithmetic section configured to execute an arithmetic operation of the temperature compensation process of the oscillation frequency based on the temperature detection data and to output the operation result data of the temperature compensation process, and an output section configured to receive the operation result data from the arithmetic section to output the frequency control data, and the output section outputs the frequency control data that changes from the first data to the second data in increments of k×LSB in a case in which the operation result data has changed from the first data corresponding the first temperature to the second data corresponding to the second temperature.

18. An oscillator comprising:
the circuit device according to claim 1; and
the resonator.
19. An electronic apparatus comprising:
the circuit device according to claim 1.
20. A moving object comprising:
the circuit device according to claim 1.

\* \* \* \* \*